(12) United States Patent
Shiroguchi et al.

(10) Patent No.: US 7,812,355 B2
(45) Date of Patent: Oct. 12, 2010

(54) SEMICONDUCTOR DEVICE AND METHOD FOR MANUFACTURING THE SAME, LIQUID CRYSTAL TELEVISION, AND EL TELEVISION

(75) Inventors: Hiroko Shiroguchi, Kanagawa (JP); Yoshiaki Yamamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 107 days.

(21) Appl. No.: 12/330,055

(22) Filed: Dec. 8, 2008

(65) Prior Publication Data

US 2009/0114922 A1 May 7, 2009

Related U.S. Application Data

(63) Continuation of application No. 11/060,702, filed on Feb. 18, 2005, now Pat. No. 7,462,514.

(30) Foreign Application Priority Data

Mar. 3, 2004 (JP) ............................. 2004-059819

(51) Int. Cl.
*H01L 21/20* (2006.01)
(52) U.S. Cl. ........................ 257/79; 257/81; 257/429; 257/433; 257/458; 257/465; 257/E27.125; 257/E31.011; 257/E31.038; 257/E31.055; 257/E31.086
(58) Field of Classification Search ............. 257/79–82, 257/429–433, 458–463, E27.125, 31.011, 257/38, 55, 86
See application file for complete search history.

(56) References Cited

U.S. PATENT DOCUMENTS

| 4,076,575 A | | 2/1978 | Chang |
|---|---|---|---|
| 4,400,409 A | * | 8/1983 | Izu et al. .................... 438/62 |
| 5,142,079 A | | 8/1992 | Chiba et al. |

(Continued)

FOREIGN PATENT DOCUMENTS

CN      1088315      6/1994

(Continued)

OTHER PUBLICATIONS

Kuwahara, et al., "Thermal Lithography for 0.1 μm Pattern Fabrication", Micro Electronic Engineering, 2002, vol. 61-62, pp. 415-421.

(Continued)

*Primary Examiner*—Michael S Lebentritt
(74) *Attorney, Agent, or Firm*—Nixon Peabody LLP; Jeffrey L. Costellia

(57) ABSTRACT

An object of the present invention is to provide a method for manufacturing a semiconductor device having a semiconductor element capable of reducing a cost and improving a throughput with a minute structure, and further, a method for manufacturing a liquid crystal television and an EL television. According to one feature of the invention, a method for manufacturing a semiconductor device comprises the steps of: forming a light absorption layer over a substrate, forming a first region over the light absorption layer by using a solution, generating heat by irradiating the light absorption layer with laser light, and forming a first film pattern by heating the first region with the heat.

38 Claims, 44 Drawing Sheets

U.S. PATENT DOCUMENTS

| | | | |
|---|---|---|---|
| 5,303,072 A | 4/1994 | Takeda et al. | |
| 5,467,882 A | 11/1995 | Ahn | |
| 5,477,360 A | 12/1995 | Sunohara et al. | |
| 5,512,514 A | 4/1996 | Lee | |
| 5,696,011 A | 12/1997 | Yamazaki et al. | |
| 5,852,488 A | 12/1998 | Takemura | |
| 5,892,562 A | 4/1999 | Yamazaki et al. | |
| 5,962,192 A | 10/1999 | Holman, III et al. | |
| 6,080,606 A | 6/2000 | Gleskova et al. | |
| 6,132,800 A | 10/2000 | Shimada et al. | |
| 6,177,710 B1 * | 1/2001 | Nishikata et al. | 257/429 |
| 6,224,667 B1 * | 5/2001 | Kato | 117/84 |
| 6,225,750 B1 | 5/2001 | Kimura | |
| 6,294,313 B1 | 9/2001 | Kobayashi et al. | |
| 6,313,435 B1 | 11/2001 | Shoemaker et al. | |
| 6,337,731 B1 | 1/2002 | Takemura | |
| 6,350,405 B2 | 2/2002 | Horine | |
| 6,399,257 B1 | 6/2002 | Shirota et al. | |
| 6,416,583 B1 | 7/2002 | Kitano et al. | |
| 6,503,831 B2 | 1/2003 | Speakman | |
| 6,552,405 B2 * | 4/2003 | Sugawara et al. | 257/465 |
| 6,627,263 B2 | 9/2003 | Kitano et al. | |
| 6,630,274 B1 | 10/2003 | Kiguchi et al. | |
| 6,673,680 B2 | 1/2004 | Calafut | |
| 6,715,871 B2 | 4/2004 | Hashimoto et al. | |
| 6,734,029 B2 | 5/2004 | Furusawa | |
| 6,807,213 B1 * | 10/2004 | Shimoyama et al. | 372/49.01 |
| 6,810,814 B2 | 11/2004 | Hasei | |
| 6,875,996 B2 | 4/2005 | Nakamura | |
| 6,936,532 B2 | 8/2005 | Sakaida | |
| 6,957,608 B1 | 10/2005 | Hubert et al. | |
| 7,018,779 B2 | 3/2006 | Li et al. | |
| 7,045,438 B2 | 5/2006 | Yamazaki et al. | |
| 7,122,954 B2 | 10/2006 | Nozawa | |
| 7,131,194 B2 | 11/2006 | Hashimoto | |
| 7,164,455 B2 | 1/2007 | Takagi et al. | |
| 7,176,040 B2 | 2/2007 | Sirringhaus et al. | |
| 7,176,069 B2 | 2/2007 | Yamakazi et al. | |
| 7,189,654 B2 | 3/2007 | Yamazaki et al. | |
| 7,208,401 B2 | 4/2007 | Nelson et al. | |
| 7,252,923 B2 | 8/2007 | Kobayashi | |
| 7,273,773 B2 | 9/2007 | Yamazaki et al. | |
| 7,300,686 B2 | 11/2007 | Morii et al. | |
| 7,364,769 B2 | 4/2008 | Yoshida et al. | |
| 7,365,805 B2 | 4/2008 | Maekawa et al. | |
| 7,435,515 B2 | 10/2008 | Kobayashi et al. | |
| 7,449,372 B2 | 11/2008 | Fujii et al. | |
| 7,462,514 B2 | 12/2008 | Shiroguchi et al. | |
| 7,470,604 B2 | 12/2008 | Fujii | |
| 7,476,572 B2 | 1/2009 | Morisue et al. | |
| 7,510,893 B2 | 3/2009 | Yamazaki et al. | |
| 7,569,334 B2 | 8/2009 | Kobayashi et al. | |
| 7,575,845 B2 | 8/2009 | Kobayashi et al. | |
| 7,585,783 B2 | 9/2009 | Nakamura et al. | |
| 7,615,488 B2 | 11/2009 | Maekawa et al. | |
| 7,625,493 B2 | 12/2009 | Yamazaki | |
| 7,642,038 B2 | 1/2010 | Fujii | |
| 2001/0035926 A1 | 11/2001 | Yamaguchi et al. | |
| 2001/0045974 A1 | 11/2001 | Shoemaker et al. | |
| 2002/0079832 A1 | 6/2002 | Van Tongeren et al. | |
| 2002/0094604 A1 | 7/2002 | Hayama et al. | |
| 2002/0136829 A1 | 9/2002 | Kitano et al. | |
| 2002/0146893 A1 | 10/2002 | Shimoda et al. | |
| 2002/0158259 A1 * | 10/2002 | Ono et al. | 257/79 |
| 2003/0017303 A1 | 1/2003 | Shindo et al. | |
| 2003/0030689 A1 | 2/2003 | Hashimoto et al. | |
| 2003/0083203 A1 | 5/2003 | Hashimoto et al. | |
| 2003/0129321 A1 | 7/2003 | Aoki | |
| 2003/0215634 A1 | 11/2003 | Hattori et al. | |
| 2004/0241897 A1 * | 12/2004 | Rhee et al. | 438/69 |
| 2004/0253896 A1 | 12/2004 | Yamazaki | |
| 2004/0266073 A1 | 12/2004 | Yamazaki | |
| 2005/0003645 A1 | 1/2005 | Hirai | |
| 2005/0013927 A1 | 1/2005 | Yamazaki | |
| 2005/0043186 A1 | 2/2005 | Maekawa et al. | |
| 2005/0112810 A1 | 5/2005 | Kobayashi | |
| 2005/0147766 A1 | 7/2005 | Aoki | |
| 2005/0158665 A1 * | 7/2005 | Maekawa et al. | 430/313 |
| 2005/0196710 A1 | 9/2005 | Shiroguchi | |
| 2005/0196711 A1 * | 9/2005 | Shiroguchi et al. | 430/330 |
| 2005/0287721 A1 | 12/2005 | Yamamoto et al. | |
| 2006/0040435 A1 * | 2/2006 | Morisue et al. | 438/151 |
| 2006/0043518 A1 * | 3/2006 | Nakaji et al. | 257/458 |
| 2006/0141619 A1 | 6/2006 | Hattori et al. | |
| 2007/0093002 A1 | 4/2007 | Maekawa et al. | |
| 2007/0207274 A1 | 9/2007 | Fujii | |
| 2007/0267953 A1 * | 11/2007 | Seki | 313/292 |
| 2007/0295396 A1 * | 12/2007 | Takahashi et al. | 136/256 |
| 2008/0001538 A1 * | 1/2008 | Cok | 313/506 |
| 2008/0315428 A1 | 12/2008 | Fujii | |

FOREIGN PATENT DOCUMENTS

| | | |
|---|---|---|
| EP | 1 087 428 | 3/2001 |
| JP | 54-045102 | 4/1979 |
| JP | 08-062445 | 3/1996 |
| JP | 09-260808 | 10/1997 |
| JP | 11-207959 | 8/1999 |
| JP | 11-251259 | 9/1999 |
| JP | 2000-188251 | 7/2000 |
| JP | 2001-179167 | 7/2001 |
| JP | 2001-272526 | 10/2001 |
| JP | 2003-0059940 | 2/2003 |
| WO | WO 00/28604 | 5/2000 |
| WO | WO 00/59014 A1 | 10/2000 |

OTHER PUBLICATIONS

Office Action (Application No. 200510069742.0; CN7749) Dated Apr. 25, 2008.

Chinese Office Action (Application No. 200510069742.0; CN7749) Dated May 8, 2009).

* cited by examiner

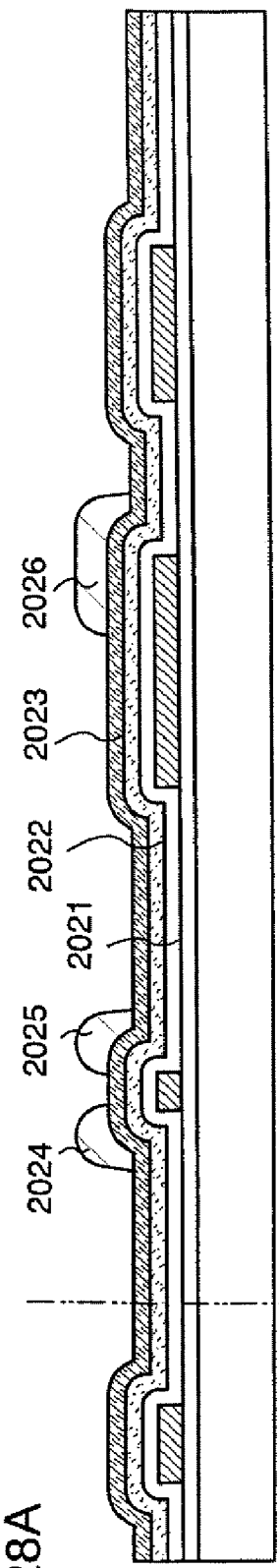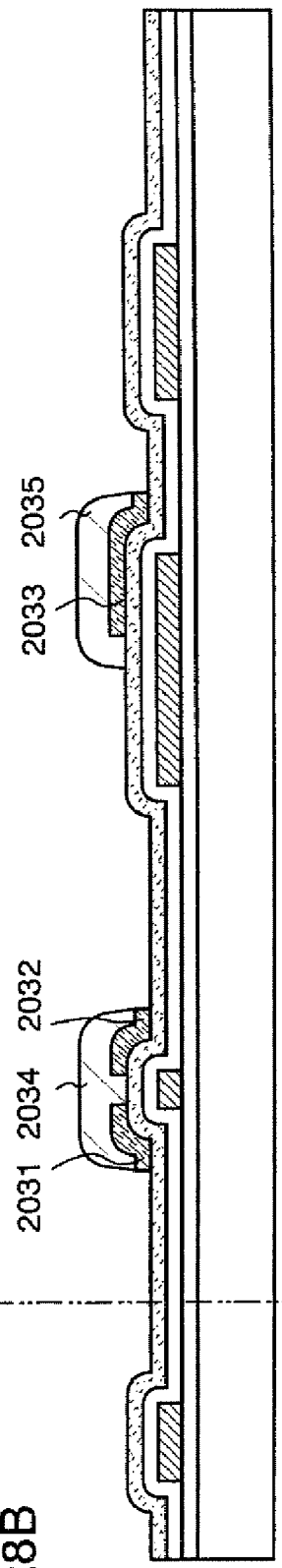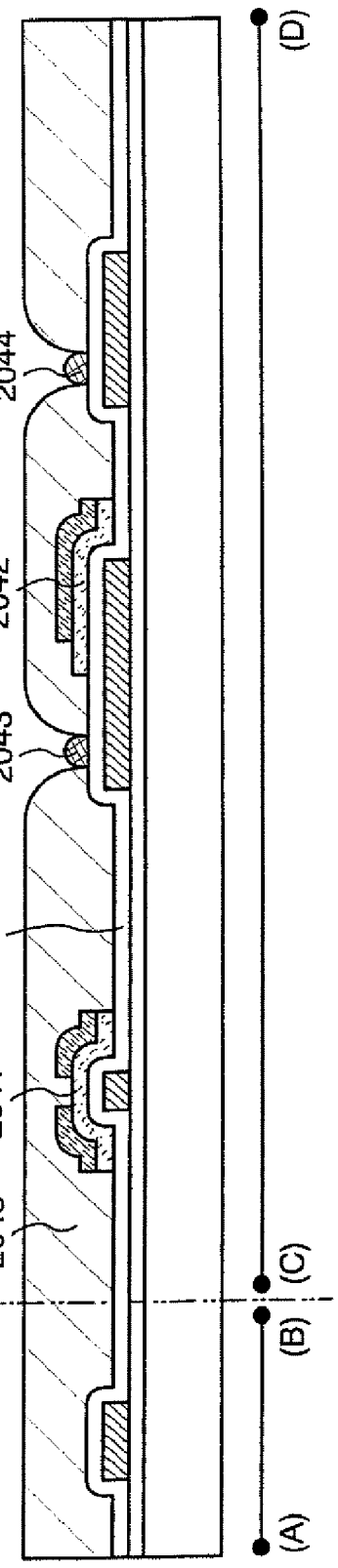

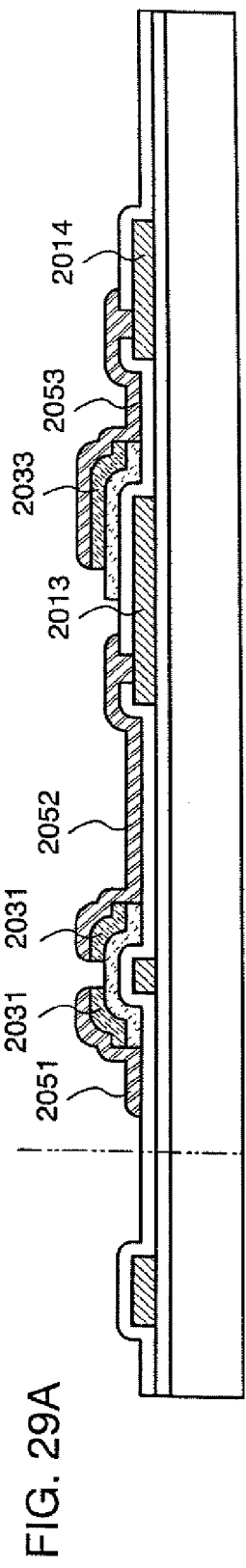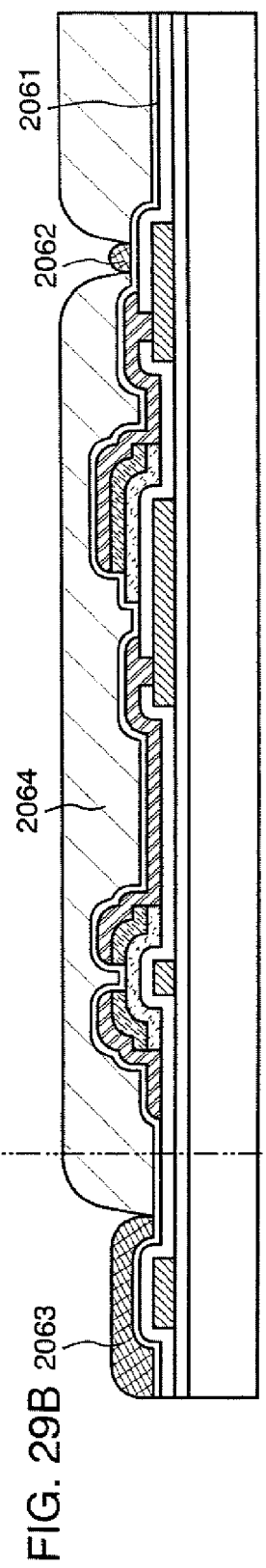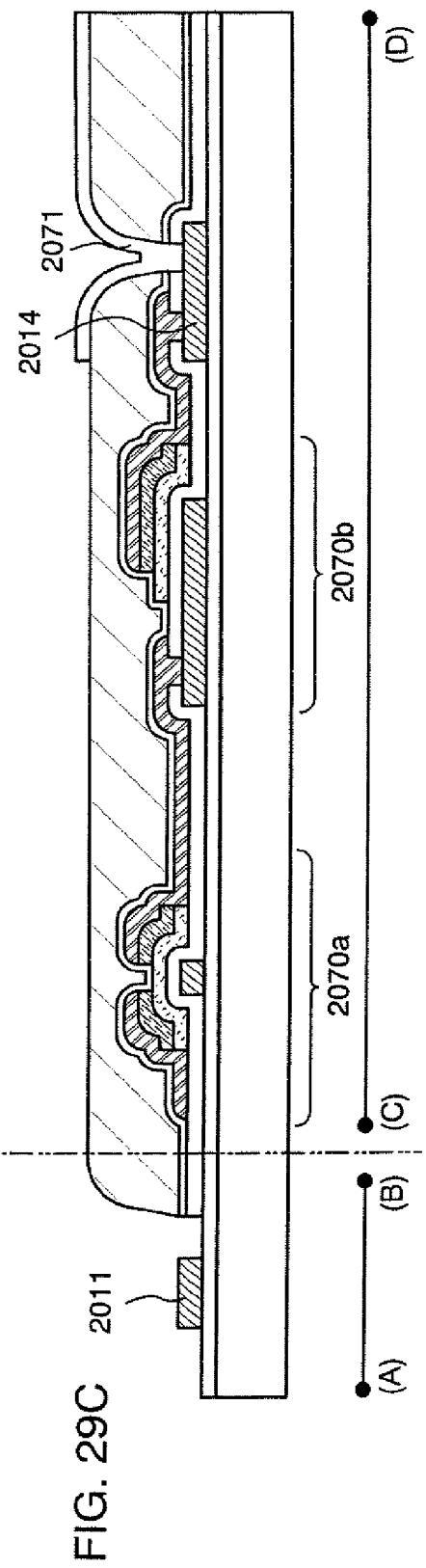
FIG. 29A
FIG. 29B
FIG. 29C

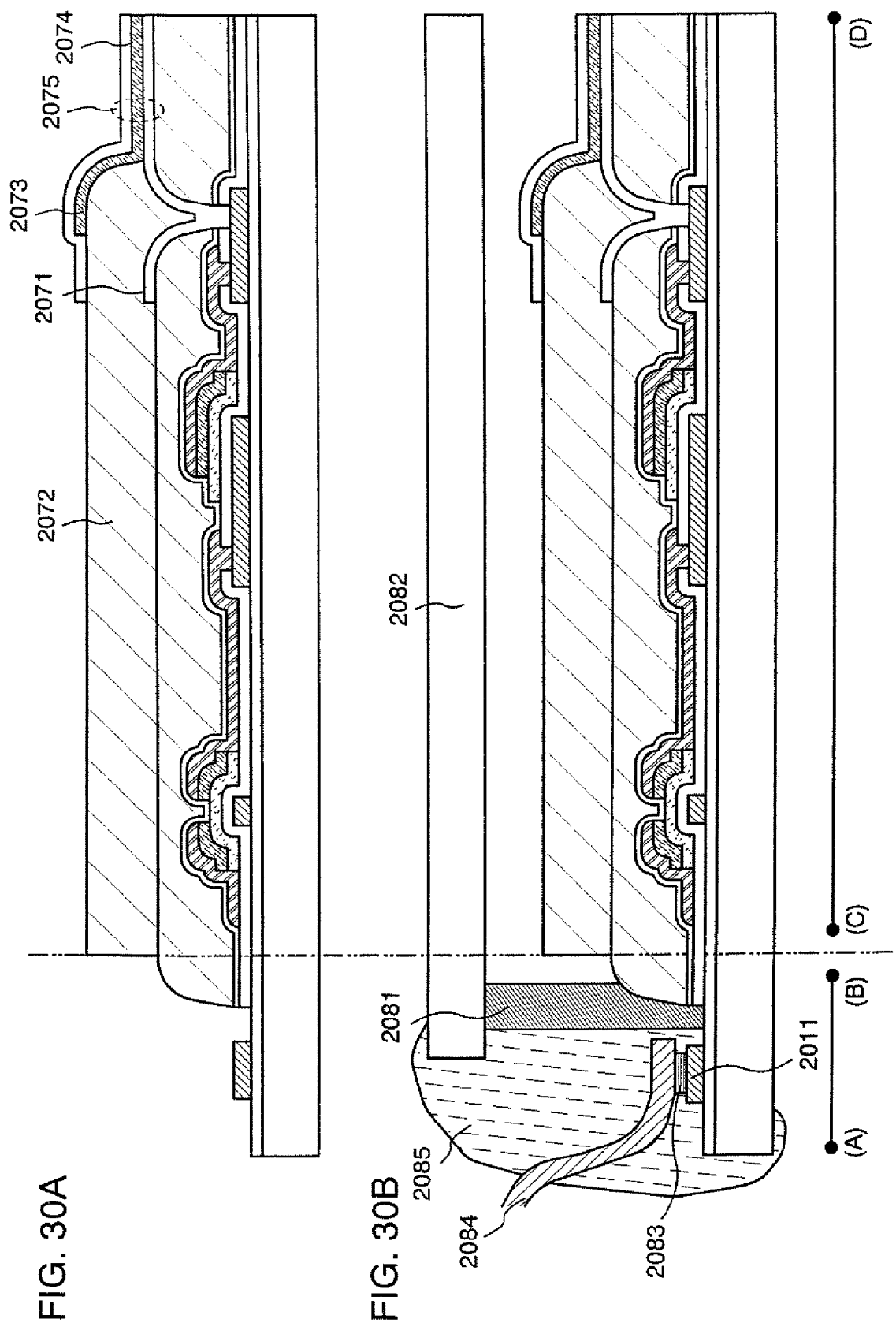

SEMICONDUCTOR DEVICE AND METHOD FOR MANUFACTURING THE SAME, LIQUID CRYSTAL TELEVISION, AND EL TELEVISION

BACKGROUND OF THE INVENTION

1. Field of the Invention

The present invention relates to a semiconductor device formed by using a droplet discharge method, typified by an ink-jet method and a manufacturing method thereof.

2. Description of the Related Art

Conventionally, a so-called active matrix driving type display panel or a semiconductor integrated circuit including a semiconductor element typified by a thin film transistor (hereinafter also referred to as a "TFT") over a glass substrate is manufactured by patterning various thin films through a light-exposure step (hereinafter referred to as a photolithography step) using a photo mask.

In a photolithography step, after a resist is applied to an entire surface of a substrate to perform prebaking, ultraviolet ray or the like is irradiated through a photo mask, and thus, development is performed to form a resist pattern. Thereafter, a thin film (a film formed from a semiconductor material, an insulating material or a conductive material) existing in a portion to be a film pattern using the resist pattern as a mask pattern is etched and removed to pattern the thin film; thus, the film pattern is formed.

In addition, a technique for forming a film over a semiconductor wafer by using a device which can discharge a resist continuously from a nozzle in a linear shape with a fine diameter to reduce loss of a raw material required for forming the film is mentioned in Reference 1 (Reference 1: Japanese Patent Application Laid-Open No. 2000-188251).

However, in a step of forming a film pattern using a conventional photolithography step, there is a problem that throughput is reduced due to a number of steps of forming a mask pattern, as well as wasting most parts of the material of a film pattern and a resist.

In addition, a photolithography device used for a photolithography step has difficulty in performing light-exposure treatment to a large-sized substrate at once. Therefore, in a method for manufacturing a semiconductor device using a large-sized substrate, there is a problem that a yield is reduced since a plurality of light exposing times are required and unconformity with an adjacent pattern is generated.

Moreover, a solution having small diameter of a droplet is required to be discharged to form a minute semiconductor element having a small occupied area by using a droplet discharge method with the technique disclosed in Reference 1. For this purpose, the diameter of a discharge opening may be made small. However, in this case, the composition of the discharging solution is attached, dried and solidified at the end of the discharge opening and clogging or the like is generated. Thus, it is difficult to continuously and stably discharge a certain amount of discharge solution. Consequently, there is a problem that throughput or a yield of a semiconductor device formed from the semiconductor element is deteriorated.

SUMMARY OF THE INVENTION

The present invention is made in view of the foregoing problems, and it is an object of the invention to provide a new method for forming a film pattern in which usability of a material is enhanced with the small number of steps.

In addition, it is an object of the invention to provide a method for manufacturing a semiconductor device having a semiconductor element with a minute structure which can reduce a cost and improve throughput with the small number of steps and a reduction of a raw material, and a method for manufacturing a liquid crystal television and an EL television.

The invention is summarized as follows: after a light absorption layer is formed over a substrate and a first region is formed over the light absorption layer by using a solution, the light absorption layer is irradiated with laser light (also referred to as a laser beam) to generate heat, then a first film pattern is formed by heating the first region with the heat.

In addition, according to the invention, a light absorption layer is formed over a substrate, a solution is applied or discharged over the light absorption layer, then the light absorption layer is irradiated with laser light by focusing thereon through the substrate or the solution to generate heat, and the solution is heated by the heat generated in the light absorption layer to form a first film pattern. Furthermore, according to the invention, a second film pattern is formed by etching the light absorption layer by using the first film pattern as a mask pattern.

According to the invention, a substrate or a solution has light-transmitting properties and a light absorption layer has light-shielding properties.

In addition, according to the invention, a light absorption layer is formed over a substrate, a solution is applied or discharged over the light absorption layer, then the light absorption layer is irradiated with laser light by focusing thereon, the light energy of the laser light is converted to heat energy in the light absorption layer; and thus, a film pattern is formed by modifying the solution by using the heat energy. Furthermore, according to the invention, a second film pattern is formed by etching the light absorption layer by using the first film pattern as a mask pattern.

Laser light has an intensity of light which has a convex curved shape, typically a shape like a Gaussian distribution or a trapezoidal shape in an irradiated surface. In a Gaussian type curve, the foot splays out and there is a vertex with a narrow width. In addition, a light absorption layer absorbs light having a fixed wavelength to convert light energy to heat energy. Therefore, light energy of the laser light can be converted to heat in a region having an arbitral shape by appropriately controlling the size of the beam spot, the intensity of the laser light, and the film thickness, the absorption coefficient and the thermal conductivity of the light absorption layer. Typically, when the thermal conductivity of the light absorption layer is low, light energy of the laser light can be converted to heat in a smaller region than the beam of the laser light in an irradiated surface. Alternatively, when the thermal conductivity of the light absorption layer is high, the light energy of the laser light can be converted to heat in a larger region than the beam of the laser light. Thus, a solution applied or discharged so as to be in contact with the light absorption layer can be modified by using the heat. In other words, the solvent of the solution is evaporated, and a dissolved substance can be promoted to be bonded or aggregated, and further baked. Accordingly, a film pattern having an arbitral shape, typically a minute film pattern which exceeds the diffraction limit of light, can be formed.

In addition, according to the invention, a width of a gate electrode is from 0.1 μm to 10 μm in a semiconductor device, in which at least one or more patterns required to manufacture a semiconductor device, for example, a conductive layer which forms a wiring layer or an electrode, a semiconductor region and a mask layer in order to form a predetermined pattern, is formed by a method which can form a pattern selectively.

As a method which can form a pattern selectively, the solution of the composition mixed for a specific purpose is selectively discharged over a light absorption layer to form a predetermined pattern by a droplet discharge method (also referred to as an ink-jet method depending on the method), then heat is generated by irradiating the surface of the light absorption layer with laser light with focusing thereon, and the solution of the composition is heated by using the heat; thus, a film pattern is formed.

In the invention, an insulating material, a conductive material or a semiconductor material having light-shielding properties and heat resistance is used as the light absorption layer. A material having light-shielding properties refers to a material capable of absorbing light having a wavelength of an ultraviolet ray, visible light or an infrared ray, preferably light having the wavelength of from 400 nm to 700 nm. Typically, an element of titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr) and barium (Ba); an alloy material containing the element as a main component; a single layer of a nitrogen compound, an oxygen compound, a carbon compound or a halogen compound; or a lamination thereof can be used. In addition, an insulating film in which a particle, pigment or the like which can absorb light is dispersed can be used.

In addition, a laser oscillator which can be used in the invention is a laser which can oscillate light having the wavelength of an ultraviolet ray, visible light or an infrared ray. Typically, an excimer laser oscillator such as KrF, ArF, XeCl or Xe; a gas laser oscillator such as He, He—Cd, Ar, He—Ne or HF; a solid laser oscillator using a crystal such as YAG, $GdVO_4$, $YVO_4$, YLF or $YalO_3$ doped with Cr, Nd, Er, Ho, Ce, Co, Ti or Tm or a semiconductor laser oscillator such as GaN, GaAs, GaAlAs or InGaAsP can be used.

A conductor dispersed or dissolved solution, a solution having a thermoplastic material or a thermosetting material is used as a solution used for a first region, in other words, a solution applied or discharged over a light absorption layer. Fine particles of a metal such as Ag, Au, Cu, Ni, Pt, Pd, Ir, Rh, W, Al, Ta, Mo, Cd, Zn, Fe, Ti, Si, Ge, Zr, Ba, metal halide or the like or a dispersion nanoparticles can be used as the conductor of a solution in which a conductor is dissolved or dispersed in a solvent. Alternatively, indium tin oxide (ITO) which is used as a transparent conductive film, zinc oxide (ZnO), indium zinc oxide (IZO), zinc oxide (GZO) added with gallium, indium tin oxide including silicon oxide, organic indium, organotin or the like can be used. In addition, a first conductive layer can be formed by laminating a conductive layer formed from the material thereof.

The following can be used as a solution having a thermoplastic material or a thermosetting material: a solution containing polyimide, acryl, novolac resin, melamine resin, phenol resin, epoxy resin, silicone resin, furan resin, diallyl phthalate resin, polyvinyl chloride resin, vinyl acetate resin, polyvinyl alcohol, polystyrene, methacrylic resin, polyethylene resin, polypropylene, polyamide, polycarbonate, polyester, polyamide (nylon) or the like. In addition, PSG (phosphorus glass), BPSG (phosphorus boron glass), silicate system SOG (Spin on Glass), polysilazane-based SOG and $SiO_2$ having a Si—$CH_3$ bond typified by alkoxy silicate-based SOG and polymethyl siloxane can also be used.

In the invention, an integrated circuit, a display device, a wireless tag, an IC tag or the like composed of a semiconductor element can be given as an example of a semiconductor device. A liquid crystal display device, a light-emitting display device, a DMD (Digital Micromirror Device), a PDP (Plasma Display Panel), an FED (Field Emission Display), an electrophoretic display device (electronic paper) or the like can be typically given as an example of a display device. Note that the TFT is a forward stagger TFT or a reverse stagger TFT (a channel etched TFT or a channel protection TFT).

Note that, in the invention, a display device refers to a device using a display element, in other words, an image display device. In addition, a module in which a connector such as a flexible printed circuit (FPC), a TAB (Tape Automated Bonding) tape or a TCP (Tape Carrier Package) is attached to a display panel, a module in which a flexible printed circuit board is provided at the end of a TAB tape or a TCP and a module in which an IC (Integrated Circuit) or a CPU is directly mounted on a display element by a COG (Chip On Glass) method are all included in the display device.

In addition, the invention includes the following structure.

According to one feature of the invention, a method for manufacturing a semiconductor device comprises the steps of: forming a light absorption layer over a substrate, forming a first region over the light absorption layer by using a solution, generating heat by irradiating the light absorption layer with laser light, and forming a first film pattern by heating the first region with the heat.

According to another feature of the invention, a method for manufacturing a semiconductor device comprises the steps of: forming a light absorption layer over a substrate, applying or discharging a solution over the light absorption layer, generating heat by irradiating the light absorption layer with laser light by focusing thereon, and forming a first film pattern by heating the solution with the heat.

According to another feature of the invention, a method for manufacturing a semiconductor device comprises the steps of: forming a light absorption layer over a substrate, applying or discharging a solution over the light absorption layer, irradiating the light absorption layer with laser light by focusing thereon, converting the light energy of the laser light to heat energy, and forming a first film pattern by modifying the solution by using the heat energy.

Note that the cross-sectional shape of the first film pattern in a surface parallel to the surface of the substrate is analogous to the beam shape of the laser light and is smaller than the beam shape of the laser light.

In addition, the light absorption layer has heat resistance and light-shielding properties. Preferably, the light absorption layer absorbs light having a wavelength of ultraviolet light, visible light or infrared light. More preferably, the light absorption layer absorbs light having a wavelength of from 400 nm to 700 nm.

Furthermore, the width of the first film pattern or a second film pattern is from 0.1 μm to 10 μm.

When the substrate has light-transmitting properties, the laser light is irradiated through the substrate, that is, from beneath the substrate. In addition, when the solution has light-transmitting properties, the laser light may be irradiated through the solution, that is, from above the solution.

When the solution contains a conductor, the first film pattern is a conductive film formed by aggregating the conductors. In addition, the light absorption layer is a layer having insulating properties or a layer having conductivity. In this case, a second film pattern can be formed by etching the light absorption layer by using the first film pattern as a mask.

In addition, when the solution has a thermosetting material or a thermoplastic material, the first film pattern is formed from organic resin. In this case, a second film pattern can be formed by etching the light absorption layer by using the first film pattern as a mask. In this case, the light absorption layer is a layer having conductivity or a layer having insulating properties.

According to another feature of the invention, a semiconductor device comprises: a light absorption layer formed over a substrate, a conductive film formed over the light absorption layer, and a cross-sectional shape of the conductive film in a surface perpendicular to the surface of the substrate has a Gaussian curved shape.

According to another feature of the invention, a semiconductor device comprises: a light absorption layer formed over a substrate, a conductive film formed over the light absorption layer, and a cross-sectional shape of the conductive film in a surface perpendicular to the surface of the substrate has a trapezoidal shape.

The width of the conductive film is from 0.1 μm to 10 μm and is formed by aggregated conductors, and the light absorption layer has insulating properties.

In addition, the light absorption layer has heat resistance and light-shielding properties. Preferably, the absorption layer absorbs light having a wavelength of ultraviolet light, visible light or infrared light. More preferably, the light absorption layer absorbs light having a wavelength of from 400 nm to 700 nm.

According to another feature of the invention, a semiconductor device comprises: a conductive film formed of a plurality of layers, and the upper layer of the conductive film is formed by an aggregated conductor and a cross-sectional shape perpendicular to a surface of a substrate has a Gaussian curved shape, and the lower layer of the conductive film has light-shielding properties.

According to another feature of the invention, a semiconductor device comprises: a conductive film formed of a plurality of layers, and the upper layer of the conductive film is formed by an aggregated conductor and a cross-sectional shape perpendicular to a surface of a substrate has a trapezoidal shape, and the lower layer of the conductive film has light-shielding properties.

According to another feature of the invention, a liquid crystal television or an EL television comprises a display device including a semiconductor element having the conductive film as a gate electrode and a pixel electrode connected to the semiconductor element.

Note that the lower layer of the conductive film has heat resistance. In addition, the lower layer of the conductive film absorbs light having a wavelength of ultraviolet light, visible light or infrared light, more preferably light having a wavelength of from 400 nm to 700 nm.

According to the invention, in the case of forming a film pattern of a semiconductor element, for example, a conductive layer which forms a wiring layer or an electrode, a semiconductor region, a mask layer to form a predetermined pattern and the like, a relative position between a nozzle which is a discharge opening of a droplet containing a material of the film thereof and a substrate is varied by using a droplet discharge method, and thus, a droplet can be discharged to an arbitrary place. In addition, the thickness or the width of a pattern to be formed can be adjusted depending on a relative relation among the diameter of the nozzle, the discharge amount of droplets, and movement speed of the nozzle and the substrate in which a discharge substance is to be formed. Accordingly, a film pattern can be discharged to a desired place with high accuracy even over a large-sized substrate having a side exceeding 1 m or 2 m.

In addition, a film pattern having a desired shape can be formed in a region irradiated with the laser light without a photo mask by converting light energy of laser light to heat energy with a light absorption layer and by using the heat energy.

Furthermore, since the light energy of the laser light is converted to heat energy by the light absorption layer and the heat energy is used, a film pattern having a very minute shape which exceeds the diffraction limit can be formed depending on thermal conductivity of the light absorption layer. Therefore, the minute film pattern formed by using a droplet discharging method can be processed, and thus, a semiconductor element having a minute structure can be formed. In addition, since a semiconductor element in which W/L is increased with minute structure can be formed, a semiconductor device having high driving capacity can be manufactured at low cost and a high throughput or yield. Furthermore, a semiconductor device such as a high integrated circuit or a display device having a high aperture ratio, and a liquid crystal television and an EL television having the semiconductor device can be manufactured at low cost and a high throughput or yield by using the minute semiconductor element.

These and other objects, features and advantages of the present invention will become more apparent upon reading of the following detailed description along with the accompanied drawings.

BRIEF DESCRIPTION OF THE DRAWINGS

FIGS. 28A to 28C are explanatory cross-sectional views of a manufacturing step of a semiconductor device according to certain aspects of the present invention;

FIGS. 29A to 29C are explanatory cross-sectional views of a manufacturing step of a semiconductor device according to certain aspects of the present invention;

FIGS. 30A and 30B are explanatory cross-sectional views of a manufacturing step of a semiconductor device according to certain aspects of the present invention;

DETAILED DESCRIPTION OF THE INVENTION

Figure 1A:
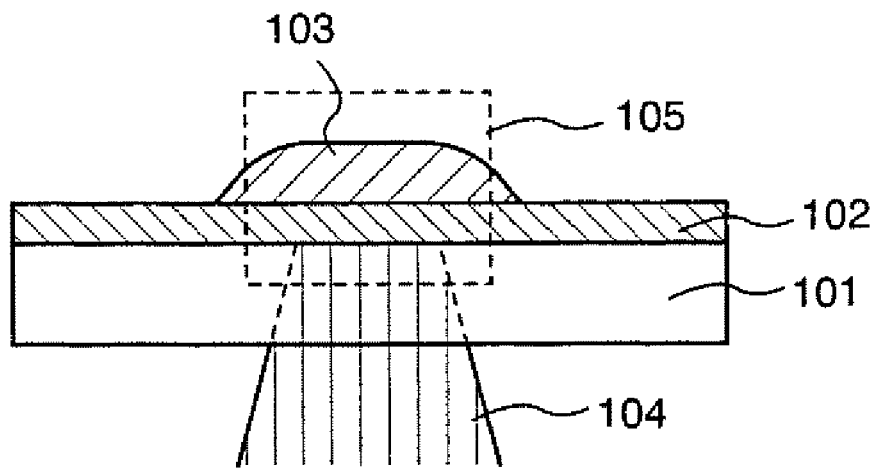
FIGS. 1A to 1D are explanatory cross-sectional views of a manufacturing step of a semiconductor device according to certain aspects of the present invention.

Hereinafter, embodiment modes according to the present invention are described in detail with reference to the drawings. It is easily understood by those who are skilled in the art that the invention can be made in various modes and that embodiments and details herein disclosed can be modified in various ways without departing from the purpose and the scope of the invention. Therefore, the invention is not interpreted with limiting to the description in this embodiment mode. Furthermore, in all figures, the same reference numerals denote the same parts, and the explanation in detail will not be repeated.

Embodiment Mode 1

In this embodiment mode, a step of forming a film pattern using heat energy generated by absorbing light energy of laser light in a light absorption layer is described with reference to FIGS. 1A to 1D and FIGS. 8A to 8D.

As shown in FIG. 1A, a light absorption layer 102 is formed over a substrate 101, then, a solution 103 is applied or discharged over the light absorption layer 102.

A light-transmitting substrate is used as the substrate 101. Typically, a glass substrate, a quartz substrate, a plastic substrate having heat resistance which can withstand a processing temperature of a post-step and having light-transmitting properties or the like can be used. In addition, when the substrate 101 is a glass substrate, a large-area substrate of 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm or the like can be used. A quartz substrate is used here as the substrate 101.

Note that, in the case of using a plastic substrate for the substrate 101, a substrate having a comparatively high glass transition point such as PC (polycarbonate), PES (polyethylene sulfone), PET (polyethylene terephthalate) or PEN (polyethylene naphthalate) is used. In addition, it is preferable to prevent deformation due to heat by thickening the thickness of the light absorption layer and avoiding heat generated by laser light irradiation conducting to the substrate side.

A droplet discharge method, a printing method, an electric field plating method, a PVD (Physical Vapor Deposition) method or a CVD (Chemical Vapor Deposition) method is used as a method for forming the light absorption layer 102. Note that, in the case of using a droplet discharge method, the light absorption layer is preferably formed under a reduced pressure or by being irradiated with laser light to evaporate a solvent.

A material having light-shielding properties, in other words, an insulating material, a conductive material or a semiconductor material which can absorb light having the wavelength of ultraviolet light, visible light or infrared light, preferably light having the wavelength of from 400 nm to 700 nm (visible light), and which can withstand heat generated by laser light irradiation can be used as a material of the light absorption layer 102. Typically, an element of titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr) and barium (Ba); an alloy material containing the element as a main component; a single layer of a nitrogen compound, an oxygen compound, a carbon compound or a halogen compound; or a lamination thereof can be used. In addition, an insulating film dispersing a particle, pigment or the like capable of absorbing light can be used. Furthermore, amorphous silicon, polysilicon, silicon containing gallium or the like can be given as a typical example of the semiconductor material; however, irradiation energy of the laser light is preferably controlled so that the light absorption layer is prevented from being peeled when the laser light is emitted.

A silicon oxide film in which microcrystalline silicon is dispersed is used here as the light absorption layer 102. The light absorption layer is formed by depositing SiOx (X=1.2 to 1.8) over the quartz substrate by a sputtering method, a laser ablation deposition method or a CVD method. Then, the light absorption layer is heated for 10 minutes at 1300° C. in a nitrogen atmosphere with a rapid heating apparatus to precipitate microcrystalline silicon in SiOx. Since the microcrystalline silicon is dispersed into the silicon oxide film, the film has insulating properties. Furthermore, the microcrystalline silicon can absorb light having the wavelength of from 400 nm to 700 nm efficiently since a band gap of energy enlarges by quantum size effect.

In the case of forming the solution 103 by a droplet discharge method, a solution in which a conductor is dissolved or dispersed into a solvent, a thermoplastic material or a thermosetting material is used for a solution discharged from a discharge opening.

Metal particles such as Ag, Au, Cu, Ni, Pt, Pd, Ir, Rh, W, Al, Ta, Mo, Cd, Zn, Fe, Ti, Si, Ge, Zr or Ba, fine particles of metal halide or the like or a dispersant nanoparticles can be used as a conductor of a solution in which a conductor is dissolved or dispersed in a solvent. Alternatively, indium tin oxide (ITO) which is used as a transparent conductive film, zinc oxide (ZnO), indium zinc oxide (IZO), zinc oxide (GZO) added with gallium, indium tin oxide including silicon oxide, organic indium, organotin or the like can be used. In addition, a first conductive layer can be formed by laminating a conductive layer formed from the material thereof.

Ester such as butyl acetate or ethyl acetate, alcohols such as isopropyl alcohol or ethyl alcohol, an organic solvent such as methyl ethyl ketone or acetone, or the like may be used as the solvent.

A solution in which any one material of gold, silver or copper is dissolved or dispersed in a solvent is preferably used by considering a specific resistance value, and more preferably, silver or copper having low resistance and low price is used as the solution discharged from the discharge opening. However, in the case of using copper, it is preferable to additionally provide a barrier film as a measure against an impurity.

Here, a substance having insulating properties or conductivity containing nitrogen such as silicon nitride, silicon oxynitride, aluminum nitride, titanium nitride or tantalum nitride (TaN: Tantalum Nitride) may be used as the barrier film in the case of using copper as a wiring, and the barrier film may be formed by a droplet discharge method.

A solution containing polyimide, acryl, novolac resin, melamine resin, phenol resin, epoxy resin, silicone resin, furan resin, diallyl phthalate resin, polyvinyl chloride resin, vinyl acetate resin, polyvinyl alcohol, polystyrene, methacrylic resin, polyethylene resin, polypropylene, polyamide, polycarbonate, polyester, polyamide (nylon) or the like as well as resist is used as the thermoplastic material or the thermosetting material. PSG (phosphorus glass), BPSG (phosphorus boron glass), silicate system SOG (Spin on Glass), polysilazane-based SOG and $SiO_2$ having a Si—$CH_3$ bond typified by alkoxy silicate-based SOG and polymethyl siloxane can also be used.

Note that the viscosity of the solution using a droplet discharge method is preferably from 5 mPa·s to 20 mPa·s so that the solution is prevented from drying and can be discharged from the discharge opening smoothly. In addition, the surface tension is preferably 40 m/N or less. Note that the viscosity or the like of the solution is preferable to be arbitrarily adjusted in accordance with the solvent or the usage.

The diameter of particles of the conductor is preferably made as small as possible to prevent a nozzle from clogging and to manufacture a high-definition pattern though it depends on the diameter of each nozzle, the desired shape of a pattern or the like. The diameter of the particles is preferably 0.1 μm or less. The solution is formed by a known method such as an electrolyzing method, an atomizing method or a wet reducing method, and the particle size is approximately from 0.5 μm to 10 μm in general. However, in the case of forming the solution by a gas evaporation method, nanoparticles protected with a dispersant are as minute as approximately 7 nm. When each surface of the nanoparticles is covered with a coating, the nanoparticles are uniformly dispersed at a room temperature without cohering in the solvent, and show almost the same properties as liquid. Therefore, a coating is preferably used.

The step of discharging the solution may be performed under a reduced pressure. This is because the solvent of the solution is volatilized during a period from discharging the solution until the solution lands on an object to be treated, and thus, later steps of drying and baking the solution can be omitted or shortened. The discharging is performed in an oxygen atmosphere, a nitrogen atmosphere or an atmospheric air. However, the discharging is preferably performed in an oxygen atmosphere where a metal element decomposed or dispersed solvent is easily removed.

Here, the solution (hereinafter, referred to as "Ag paste") 103 in which a silver particle of several nm is dispersed is selectively discharged and dried.

Next, the light absorption layer 102 is irradiated with laser light 104 by focusing thereon with a direct drawing apparatus by laser. Here, the light absorption layer 102 is irradiated with the laser light from beneath the substrate 101.

Figure 39:
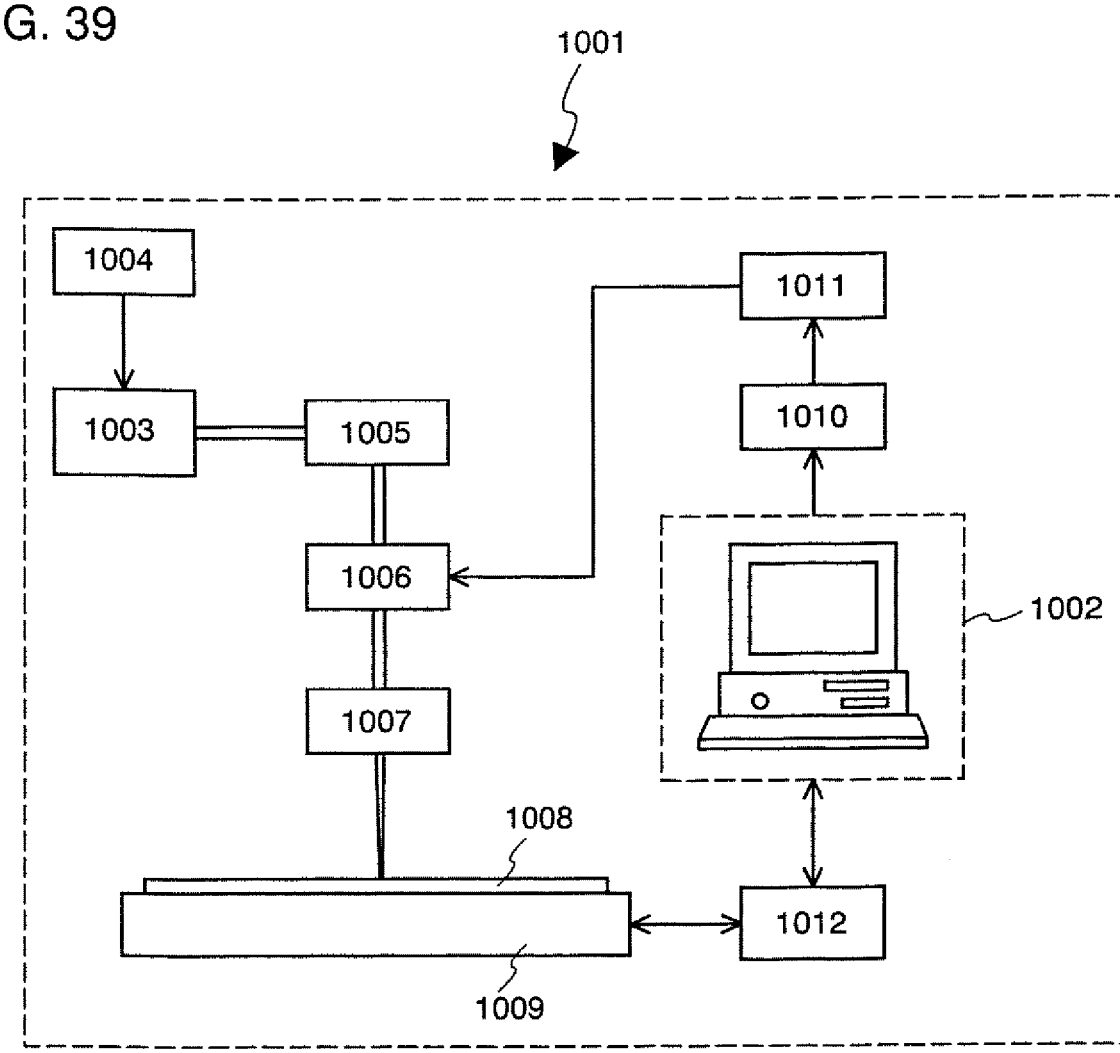
FIG. 39 is an explanatory schematic view of a direct drawing apparatus by laser according to a certain aspect of the present invention.

Here, a direct drawing apparatus by laser is described with reference to FIG. 39. As shown in FIG. 39, a direct drawing apparatus by laser 1001 is provided with a personal computer (hereinafter, referred to as a PC) 1002 which performs various control when laser light is emitted, a laser oscillator 1003 in which laser light is outputted, a power supply 1004 of the laser oscillator 1003, an optical system (an ND filter) 1005 for attenuating the laser light, an Acousto-Optic Modulator (AOM) 1006 for modulating the intensity of the laser light, an optical system 1007 including a lens for shrinking the cross section of the laser light, a mirror for changing the light path and the like, a substrate movement mechanism 1009 having an X stage and a Y stage, a D/A converter 1010 for converting control data outputted from the PC from a digital one to an analog one, a driver 1011 which controls the Acousto-Optic Modulator 1006 depending on the analog voltage outputted from the D/A converter and a driver 1012 which outputs a driving signal for driving the substrate movement mechanism 1009.

A laser oscillator which can oscillate ultraviolet light, visible light or infrared light can be used as the laser oscillator 1003. An excimer laser oscillator such as KrF, ArF, XeCl or Xe; a gas laser oscillator such as He, He—Cd, Ar, He—Ne or HF; a solid laser oscillator using a crystal such as YAG, $GdVO_4$, $YVO_4$, YLF or $YAlO_3$ doped with Cr, Nd, Er, Ho, Ce, Co, Ti or Tm or a semiconductor laser oscillator such as GaN, GaAs, GaAlAs or InGaAsP can be used as the laser oscillator. Note that from a first harmonic of a fundamental wave to a fifth harmonic are preferably applied to the solid laser oscillator.

Next, an irradiation method using a direct drawing apparatus by laser is described. When the substrate movement mechanism 1009 is equipped with a substrate 1008, the PC 1002 detects a position of a marker given on the substrate by a camera which is not shown in the drawing. Then, the PC 1002 generates movement data for moving the substrate movement mechanism 1009 based on the position data of the detected marker and drawing pattern data which is previously inputted. Thereafter, the PC 1002 is used to control the amount of light which is to be outputted from the Acousto-Optic Modulator 1006 through the driver 1011, thereby attenuating laser light outputted from the laser oscillator 1003 by the optical system 1005. Consequently, the amount of light is controlled so as to obtain a predetermined amount of light by using the Acousto-Optic Modulator 1006. On the other hand, the light path and the shape of beam spot of the laser light outputted from the Acousto-Optic Modulator 1006 are changed with the optical system 1007 and the laser light converges on the lens. Then, the light absorption layer formed over the substrate is irradiated with the laser light. At this time, the substrate movement mechanism 1009 is controlled to move toward an X direction and a Y direction according to the movement data generated by the PC 1002. As a result, a predetermined position is irradiated with the laser light, and the light energy of the laser light is converted to the heat energy by the light absorption layer.

Figure 1B:
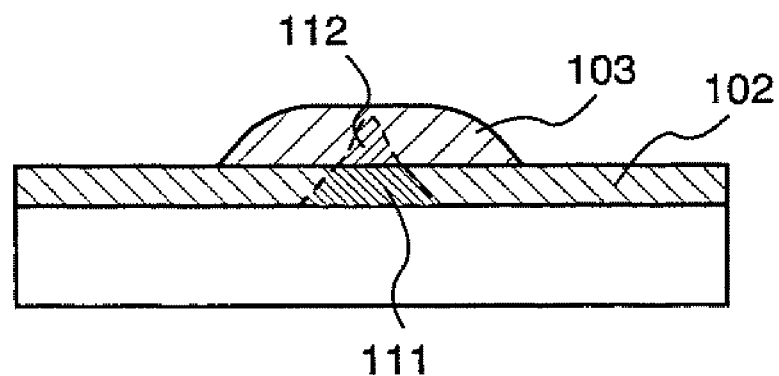
Figure 1C:
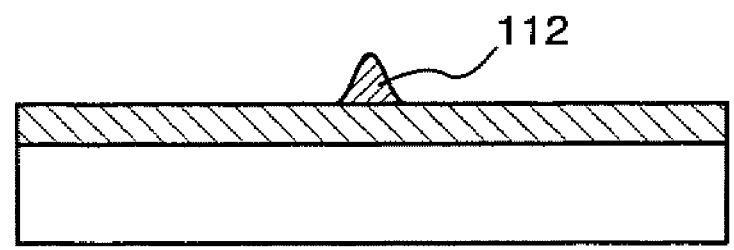
Figure 1D:
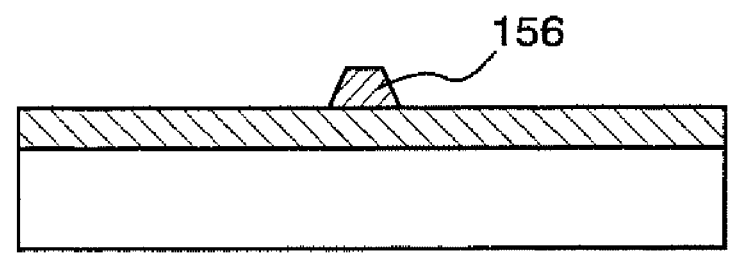

As shown in FIG. 1B, part of the solution 103 is modified by the heat energy converted in the light absorption layer. Since a laser beam having a much shorter wavelength can shortly converge with a short beam diameter, a laser beam having a shorter wavelength is preferably emitted to form a film pattern having a minute width.

In addition, the shape of a beam spot of the laser light on the surface of the light absorption layer is processed with the optical system so as to be a spotted, circular, elliptical, rectangular or linear (precisely, an oblong rectangular shape) shape.

Furthermore, the device in FIG. 39 shows an example in which the surface of the substrate (a surface on which the light absorption layer 102 and the solution 103 is formed) is mounted so as to face the substrate movement mechanism and the reverse side of the substrate is placed to be a top surface, and then the laser light is irradiated through the surface of the substrate movement mechanism. However, a direct drawing apparatus by laser in which the laser light is irradiated through the reverse side of the substrate movement mechanism may be used for the device by appropriately changing the optical system or the substrate movement mechanism and mounting the reverse side of the substrate to face the substrate movement mechanism.

Note that, here, the substrate is selectively irradiated with the laser beam by moving the substrate; however, not limiting thereto, the substrate can be irradiated with the laser beam by scanning toward an X-Y axis direction. In this case, a polygon mirror, a galvanometer mirror, an Acousto-Optic Deflector (AOD) or the like having preferable linearity of the beam spot in an irradiated surface with high repetitive position accuracy is preferably used as the optical system 1007. Furthermore, the higher precise laser light can be emitted by using the substrate movement mechanism 1009 which can be moved toward an X axis direction and the optical system 1007 which can be scanned toward a Y axis direction.

Note that the laser light is absorbed in the light absorption layer, the solution is modified by the generated heat energy, and then the film pattern is formed. Accordingly, the energy of the laser light can be converted to heat in a smaller region than the beam spot of the laser light in an irradiation surface by appropriately controlling the size of the beam spot, the intensity of the laser light and the film thickness, the absorption coefficient and the thermal conductivity of the light absorption layer without convergence of the laser beam by using a complicated optical system to obtain a minute film pattern; thus, a minute film pattern can be formed. Furthermore, the optical system can be designed easily, and since the number of the optical systems is not required, the cost can be reduced.

Here, the intensity and the heat distribution of laser light when a light absorption layer is irradiated with the laser light are described with reference to FIGS. 8A to 8D.

Figure 8A:
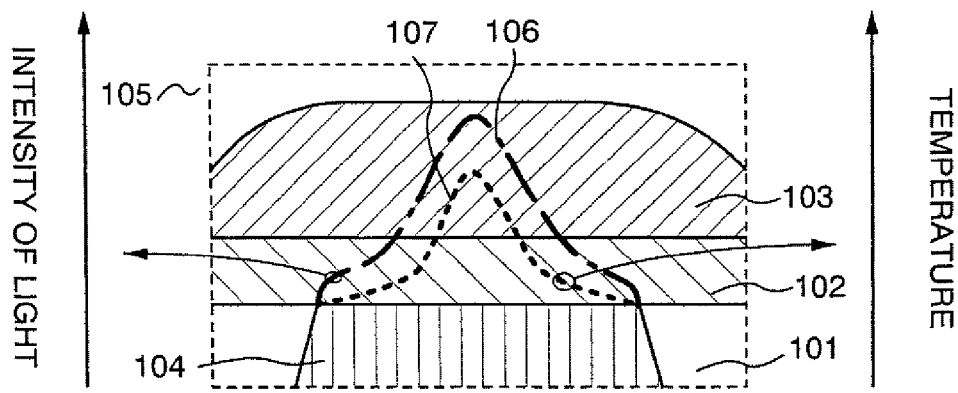
FIGS. 8A to 8D are explanatory cross-sectional views of the intensity and the heat distribution of laser light when a light absorption layer is irradiated with the laser light.

FIG. 8A is an enlarged view of a region 105 that includes the light absorption layer 102 irradiated with the laser light and the solution 103 provided thereover in FIG. 1A.

Intensity 106 of laser light 104 with which the light absorption layer 102 is irradiated is the highest at the center of the beam spot, of which graph is so-called a Gaussian distribution. The intensity of the laser light absorbed in the light absorption layer is converted to heat. The temperature of the depth direction in the light absorption layer at this time depends on the intensity of the laser light. Therefore, the graph of temperatures 107 shows a Gaussian type curve in the same manner as the intensity of the laser light. In a Gaussian type curve, the foot splays out and there is a vertex with a narrow width. Accordingly, a region with a constant temperature or more can be made smaller than the diameter of the laser beam.

Figure 8B:
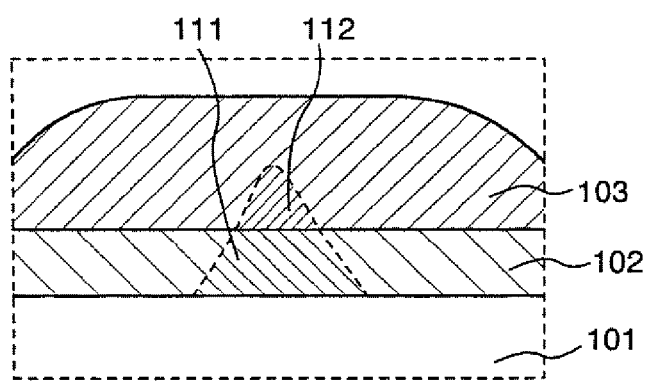

As a result, as shown in FIG. 1B and FIG. 8B, a heated region 111 is formed in part of the light absorption layer 102. The heat of the heated region is conducted to a solution 103 to modify the solution. Typically, conductors (fine particles) in the solution are aggregated, welded and baked, or the solution is plasticized or hardened. Consequently, a first film pattern 112 can be formed. In the light absorption layer, the region with a constant temperature or more is smaller than the diameter of the laser beam; therefore, the width of the first film pattern is from 0.1 µm to 10 µm.

In this embodiment mode, a conductive layer containing silver as a main component is formed as the first film pattern 112. Note that the conductive layer is formed so that fine particles, which are conductors, are irregularly overlapped with each other in three dimensions. In other words, the conductive layer is constituted of three-dimensional aggregated particles. Therefore, the surface of the conductive layer has minute depressions/projections. In addition, the fine particles are melted to be an assembly thereof according to the temperature and the heat radiation period of the light absorption layer. The aggregate at this time increases in size according to the temperature and the heat radiation period of the light absorption layer; therefore, a layer with a surface having difference of elevation is formed. Note that a region where the fine particles are melted may have a polycrystalline structure.

In addition, a binder formed from an organic material remains in the conductive layer depending on the heating temperature, atmosphere or period.

In the case of irradiating the conductor with the laser light, an organic material such as a binder (thermosetting resin) contained in a conductors dispersed or dissolved solution is decomposed when the laser irradiation is performed in an $O_2$ atmosphere. Thus, the conductive layer containing few organic materials can be obtained.

Then, the first film pattern 112 can be formed by removing the solution 103 which is not modified by heat.

Figure 43:
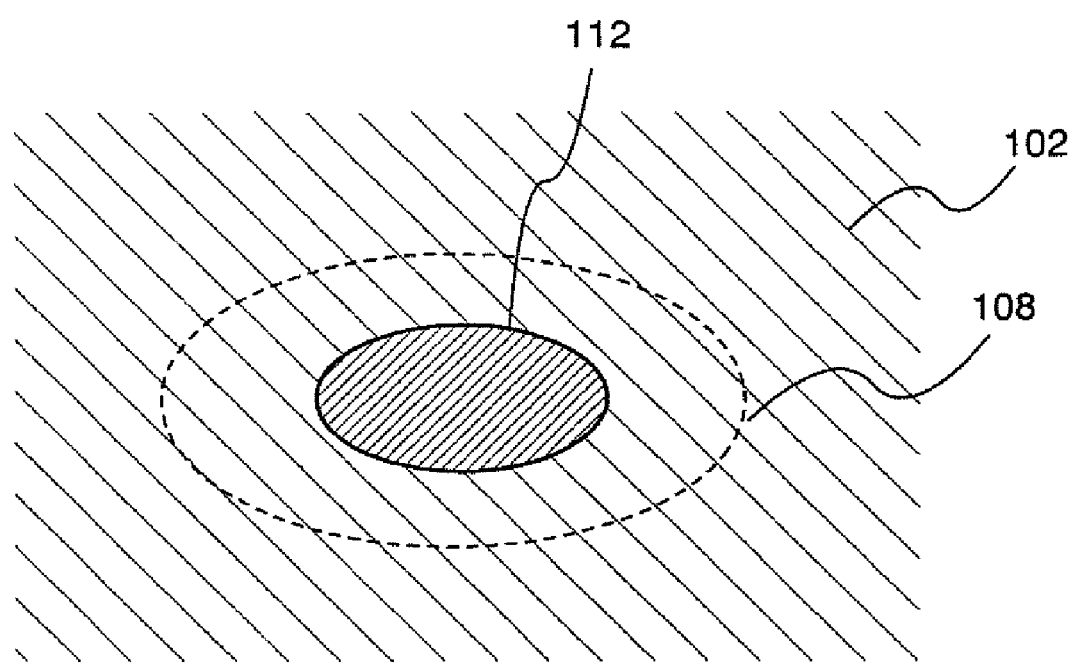
FIG. 43 is an explanatory top view of a cross-sectional shape of a film pattern according to a certain aspect of the present invention.

FIG. 43 shows a top view of a substrate at this time. As shown in FIG. 43, the cross-sectional shape of a first film pattern 112 parallel to the surface of the substrate is almost analogous to a beam spot 108 of laser light with which the light absorption layer is irradiated, and the area and the diameter of the beam spot are small. In addition, in the case of performing the laser irradiation by moving the laser light relatively to the substrate, the cross-sectional shape of the first film pattern 112 parallel to the surface of the substrate is almost analogous to an irradiated region of the laser light, and the area and the diameter of the beam spot are small.

Figure 5A:
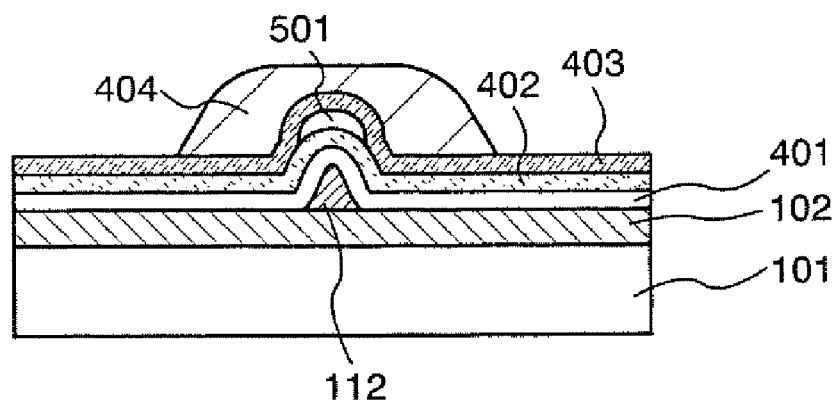
FIGS. 5A to 5D are explanatory cross-sectional views of a manufacturing step of a semiconductor device according to certain aspects of the present invention.
Figure 5B:
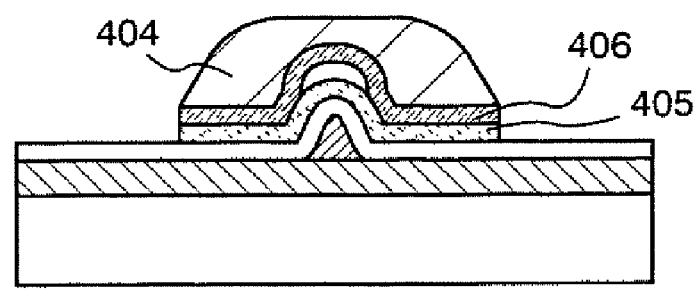
Figure 5C:
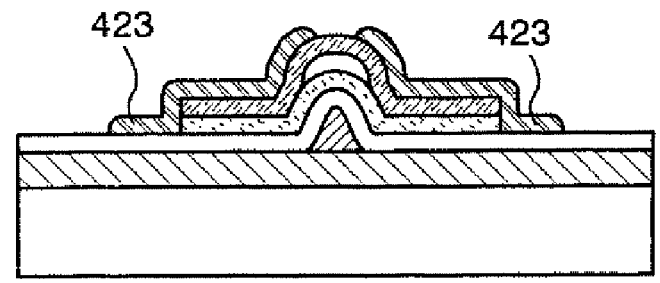

As shown in FIG. 5C, when the graph of intensity 153 of the laser light has a trapezoidal shape (a top flat type), the graph of a temperature distribution 154 also has a trapezoidal shape. The laser light having such intensity can be formed by using a wave surface conversion optical element. A diffractive optical element, a refractive optical element, a reflective optical element, an optical waveguide or the like can be given as a typical example of the wave surface conversion optical element. A holographic optical element, a binary optical element or the like can be given as a typical example of the diffractive optical element. The optical waveguide is an object in which emitted light is shut in a fixed region, and then the flow of the energy is led so as to be in parallel to the axis of a path to be transmitted. A light pipe or an optical fiber can be used as the optical waveguide. The light pipe is an object in which light is transmitted from one edge to the other edge, and typically, has a shape such as a conical shape, a pyramid shape, a cylindrical shape or a prismatic shape. Note that reflection by a mirror, an object using a reflection on two reflection surfaces facing each other or the like can be used as the method for transmitting light. The laser beam led into the optical waveguide is reflected in the optical waveguide repeatedly to reach an outlet. A surface in which the intensity of the light is uniform is formed in the beam spot in the outlet of the optical waveguide.

Figure 8C:
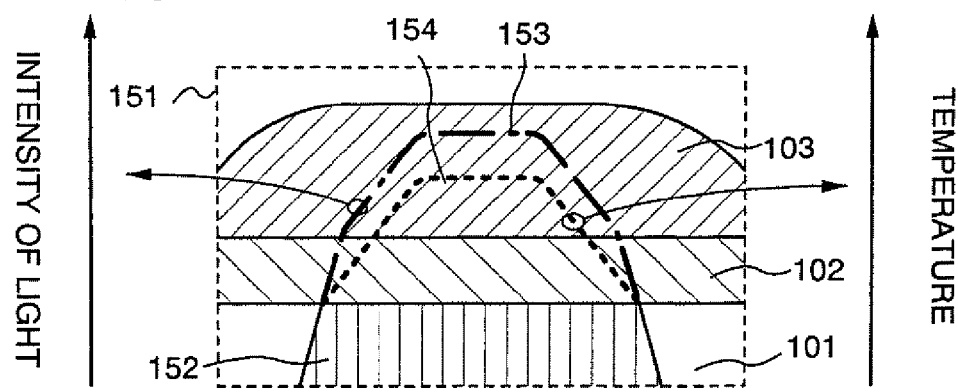
Figure 8D:
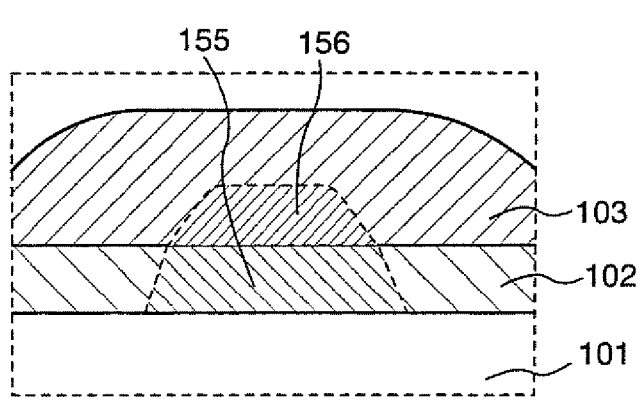

Consequently, as shown in FIG. 8D, a heated region 155 is formed in part of a light absorption layer 102. The heat of the heated region is conducted to a solution 103 to modify the solution. Typically, particles in the solution are aggregated, welded and baked, or the solution is plasticized or hardened. Consequently, a first film pattern 156 having a trapezoidal shape can be formed.

Note that a cross-sectional shape of the first film pattern formed by scanning continuous-wave laser light in the direction of an arrow shown in the figure is described with reference to FIG. 44.

Figure 44A:
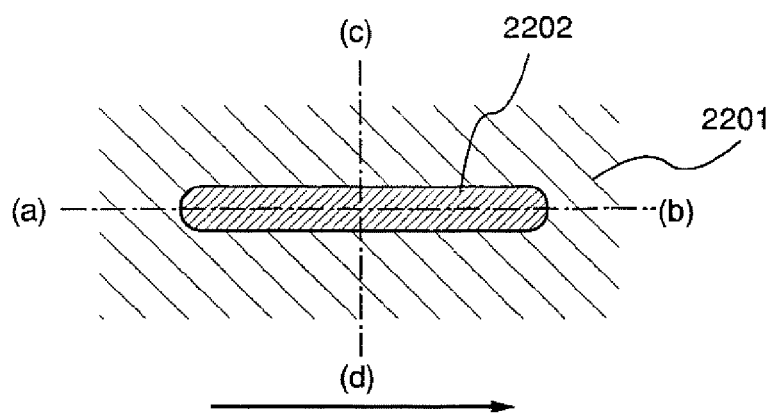
FIGS. 44A to 44F are explanatory top views and cross-sectional views of a cross-sectional shape of a film pattern according to certain aspects of the present invention.
Figure 44B:
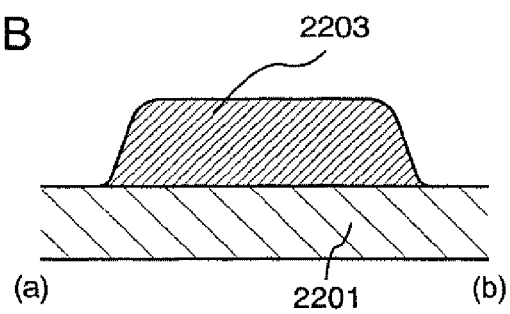
Figure 44C:
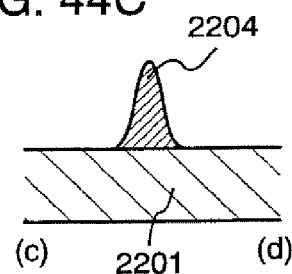

FIG. 44A is a top view of a first film pattern 2202 formed by irradiating a light absorption layer 2201 with laser light of which graph of the intensity has a shape like a Gaussian distribution. FIGS. 44B and 44C each show cross-sections taken along lines a-b and c-d in FIG. 44A.

As shown in FIG. 44B, a cross-sectional shape 2203 of the first film pattern taken along the axis parallel to the scanning direction of laser light has a trapezoidal shape.

In addition, as shown in FIG. 44C, a cross-sectional shape 2204 of the first film pattern taken along the axis perpendicular to the scanning direction of laser light has a Gaussian curved shape.

Figure 44D:
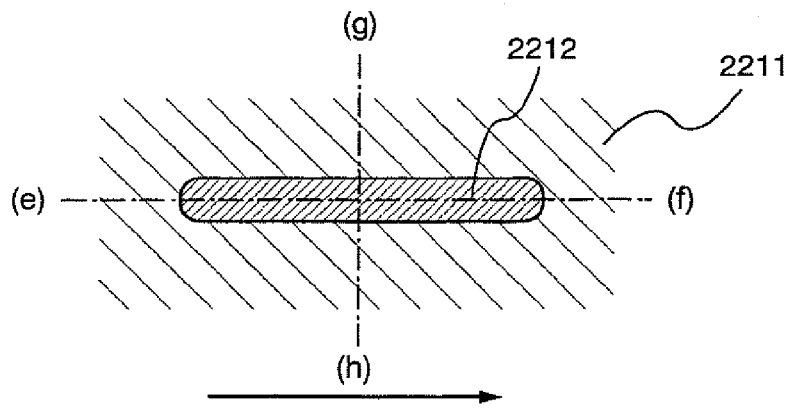
Figure 44E:
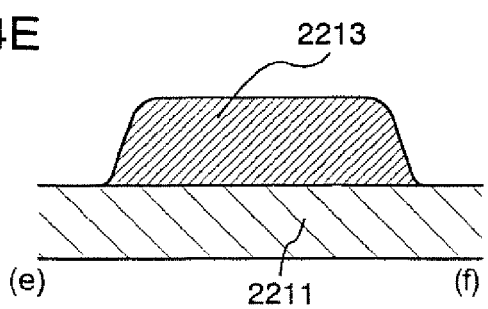
Figure 44F:
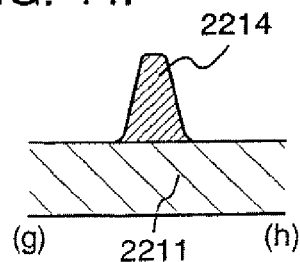

Similarly, FIG. 44D shows a top view of a first film pattern 2212 formed by irradiating a light absorption layer 2211 with laser light of which graph of the intensity has a trapezoidal shape. FIGS. 44E and 44F each show cross-sections taken along lines e-f and g-h in FIG. 44D.

As shown in FIG. 44E, a cross-sectional shape 2213 of the first film pattern taken along the axis parallel to the scanning direction of laser light has a trapezoidal shape.

In addition, as shown in FIG. 44F, a cross-sectional shape 2214 of the first film pattern taken along the axis perpendicular to the scanning direction of laser light has a trapezoidal shape.

Note that in the case of using a light-transmitting material for the solution 103, a film pattern can be formed by irradiating the light absorption layer through the surface of the solution with laser light. This is because the solution does not absorb the laser light; therefore, the laser light transmitting through the solution can be absorbed in the light absorption layer, heat can be generated by the absorption, and part of the solution can be modified by the heat.

Through the steps mentioned above, a film pattern having a desired shape can be formed without using a photo mask. In addition, a film pattern with a narrower width than a beam spot of laser light can be formed. Furthermore, a film pattern with a narrow width can be formed without conversion of the laser light using a complicated optical system.

Embodiment Mode 2

In this embodiment mode, a method for forming a film pattern when a light absorption layer 102 is formed from a conductive material and a solution in which conductors are dissolved or dispersed in a solvent is used for a solution 103 in Embodiment Mode 1 is described with reference to FIGS. 2A to 2D.

Figure 2A:
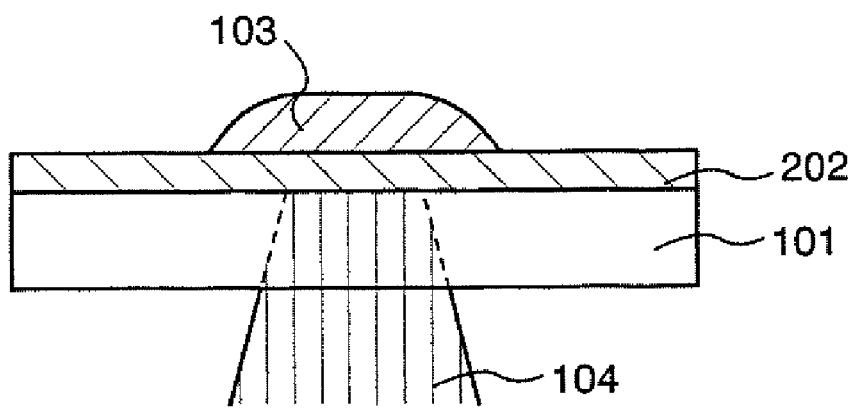
FIGS. 2A to 2D are explanatory cross-sectional views of a manufacturing step of a semiconductor device according to certain aspects of the present invention.
Figure 2B:
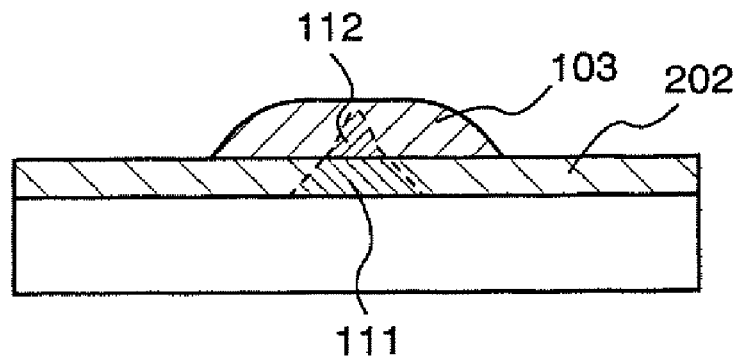

As shown in FIGS. 2A and 2B, as well as in Embodiment Mode 1, a solution 103 is applied or discharged over a light absorption layer 202 to form a first film pattern 112 in which part of the solution is baked by heat of laser light. Here, a tungsten film is formed as the light absorption layer 202 by using a tungsten target and an argon gas with a sputtering method. A silver (Ag) paste is used as the solution 103. A conductive layer containing silver as a main component is formed as the first film pattern 112. Thereafter, the unmodified solution 103 is removed.

Figure 2C:
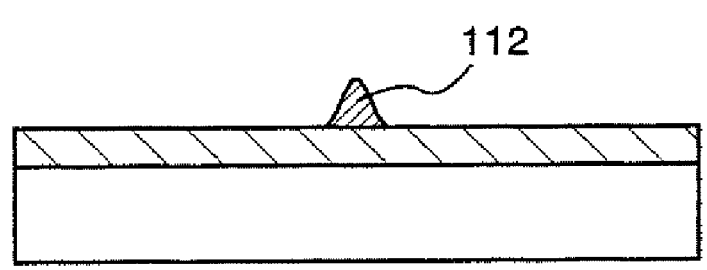
Figure 2D:
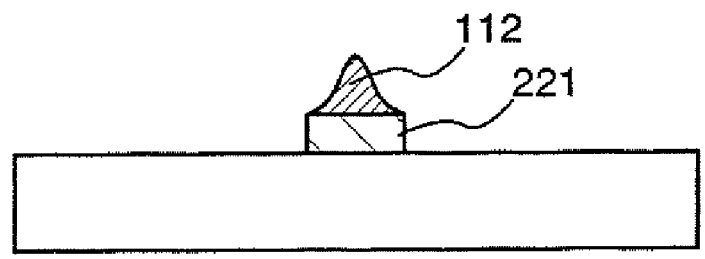

Next, as shown in FIG. 2C, the light absorption layer 202 is etched by using a first film pattern 112. As a result, a second film pattern 221 is formed as shown in FIG. 2D. In other words, a conductive film pattern having a laminated structure with conductivity can be formed. The first film pattern 112 in an upper layer corresponds to a curve of the intensity of laser light at this time. In this embodiment mode, the first film pattern has a Gaussian curved shape. In addition, the second film pattern 221 in a lower layer has light-shielding properties. Furthermore, each width of the first film pattern and the second film pattern has from 0.1 μm to 10 μm.

As well as in Embodiment Mode 1, in the case of using a light-transmitting material for the solution 103, a first film pattern can be formed by irradiating the light absorption layer with laser light through the surface of the solution.

Through the steps mentioned above, a film pattern having a desired shape and a laminated structure can be formed without using a photo mask. In addition, a film pattern which is further minute than the diameter of a laser beam can be formed.

Embodiment Mode 3

In this embodiment mode, a step for forming a mask pattern with laser light and forming a film pattern with the mask pattern is described with reference to FIGS. 3A to 3D.

Figure 3A:
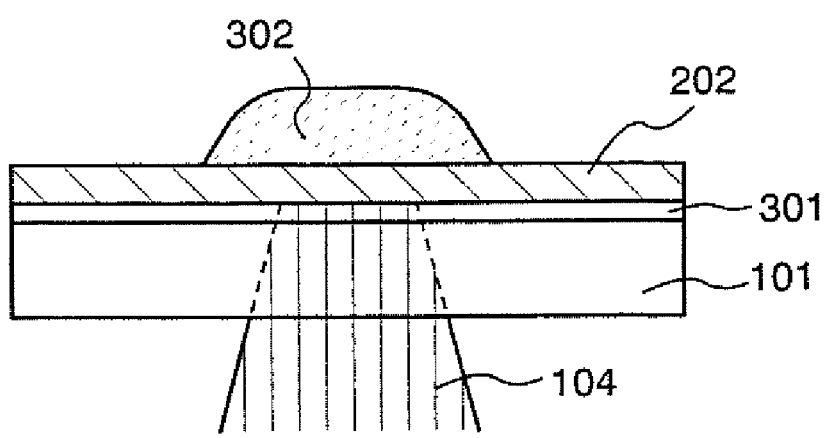
FIGS. 3A to 3D are explanatory cross-sectional views of a manufacturing step of a semiconductor device according to certain aspects of the present invention.

As shown in FIG. 3A, an insulating film 301 is formed over a substrate 101 to form a light absorption layer 202 over the insulating film. The insulating film 301 is used as an etching stopper; thus, silicon oxide, silicon nitride or the like is used. A conductive film having light-shielding properties with conductivity is used as the light absorption layer 202.

Figure 3B:
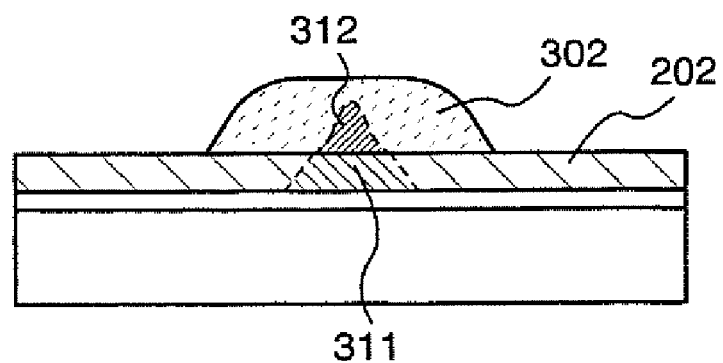

Next, a solution 302 is discharged over the light absorption layer. A thermosetting material or a thermoplastic material is used as a material of the solution. Polyimide which is a thermosetting material is used here as the solution 302. Then, the light absorption layer 202 is irradiated with laser light 104 from beneath the substrate 101. As a result, as shown in FIG. 3B, a heated region 311 is formed in part of the light absorption layer 202. The heat of the heated region is conducted to the solution 302, and then the solution is modified and is plasticized or hardened. Since a thermosetting material is used as the solution, a first film pattern 312 formed from an organic resin having a surface of a Gaussian curved shape can be formed here. Then, the unmodified solution 302 is removed.

Figure 3C:
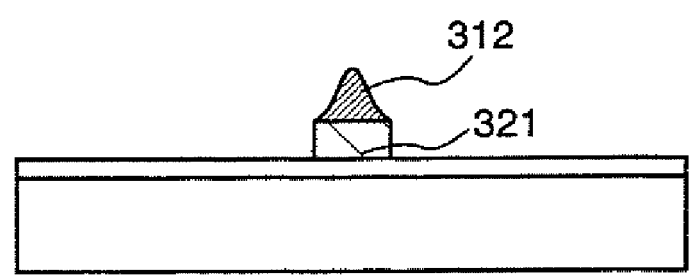

Next, as shown in FIG. 3C, the light absorption layer 202 is etched by using a first film pattern 312 to form a second film pattern 321. Here, the second film pattern 321 is a conductive layer having a desired shape. In addition, the width of the second film pattern is from 0.1 μm to 10 μm.

Figure 3D:
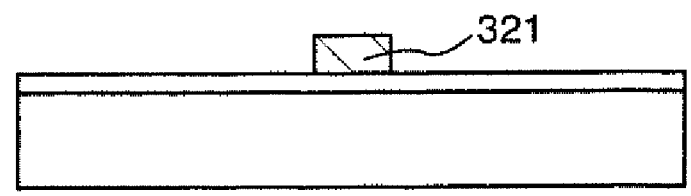

Next, as shown in FIG. 3D, the first film pattern 312 is removed.

As well as in Embodiment Mode 1, in the case of using a light-transmitting material for the solution 302, a first film pattern can be formed by irradiating the light absorption layer with laser light through the surface of the solution.

Through the steps mentioned above, a film pattern having a desired shape can be formed without using a photo mask. In addition, a film pattern which is minuter than the beam spot of the laser light can be formed.

Embodiment Mode 4

In this embodiment mode, a step of manufacturing a TFT having a gate electrode layer with a narrow width is described with reference to FIGS. 4A to 4E. Note that a channel etch type TFT is used to describe the TFT in this embodiment mode. A gate electrode layer is formed by applying Embodiment Mode 1; however, not limiting thereto, Embodiment Mode 2 and Embodiment Mode 3 can be applied appropriately.

Figure 4A:
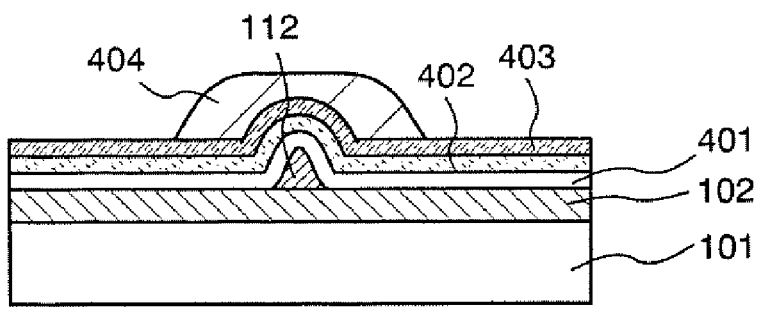
FIGS. 4A to 4E are explanatory cross-sectional views of a manufacturing step of a semiconductor device according to certain aspects of the present invention.

As shown in FIG. 4A, a light absorption layer 102 is formed over a substrate 101 by applying Embodiment Mode 1 to form a first film pattern 112, which functions as a gate electrode layer having a Gaussian curved shape, thereover. The width of the gate electrode layer is from 0.1 μm to 10 μm.

Next, a first insulating film 401, a first semiconductor film 402 and a second semiconductor film 403 having conductivity are sequentially laminated over the substrate and the gate electrode layer. The first insulating film, the first semiconductor film and the second semiconductor film each function as a gate insulating film, a channel formation region and source and drain regions of a TFT which is subsequently to be formed.

The first insulating film 401 is formed so as to have a single layer or a laminated structure of silicon nitride, silicon oxide or other silicon containing an insulating film by using a method for forming a thin film such as a plasma CVD method or a sputtering method. In addition, the first insulating film is preferably formed to have a laminated structure in which a silicon nitride film (a silicon nitride oxide film), a silicon oxide film and a silicon nitride film (a silicon nitride oxide film) are sequentially laminated from the side in contact with the gate electrode layer. Since the gate electrode layer is in contact with the silicon nitride film in this structure, deterioration due to oxidation can be prevented.

The first semiconductor film 402 is formed from a film having any of the condition selected from an amorphous semiconductor, a semi-amorphous semiconductor (also referred to as a SAS) in which an amorphous state and a crystalline state are mixed, a microcrystal semiconductor in which a crystal grain of from 0.5 nm to 20 nm can be observed in an amorphous semiconductor and a crystalline semiconductor. Particularly, a microcrystal state in which a crystal grain of from 0.5 nm to 20 nm can be observed is referred to as a microcrystal (μc). Any semiconductor contains silicon, silicon germanium (SiGe) or the like as a main component, and a semiconductor film having a film thickness of from 10 nm to 60 nm can be used.

A SAS is a semiconductor with an intermediate structure between an amorphous structure and a crystalline structure (including a single crystalline and polycrystalline structure) and has a third state which is stable in terms of free energy. The SAS includes a crystalline region having a short-range order and lattice distortion. In addition, a crystalline region of from 0.5 nm to 20 nm can be observed at least in part of the region in the film. When silicon is contained as the main component, the Raman spectrum is shifted to a lower frequency side less than 520 $cm^{-1}$. Diffraction peak of (111) or (220) to be caused from a crystalline lattice of silicon is observed in X-ray diffraction. In addition, at least 1 atomic % or more of hydrogen or halogen is contained to terminate a dangling bond.

A SAS can be obtained by glow discharge decomposition of a silicide gas. $SiH_4$ can be used as a typical silicide gas, and besides, $Si_2H_6$, $SiH_2Cl_2$, $SiHCl_3$, $SiCl_4$, $SiF_4$ or the like can also be used. The silicide gas is used by being diluted with hydrogen or fluorine, or hydrogen or fluorine and one or more kinds of rare gas elements of helium, argon, krypton and neon; therefore, the SAS can be easily formed. At this time, the silicide gas is preferably diluted so that a dilution ratio thereof is in the range of from 10 times to 1000 times. In addition, a SAS can be formed by using a diluting method with a helium gas using $Si_2H_6$ and $GeF_4$. The reaction of film to be formed by glow discharge decomposition is preferably generated under a reduced pressure, and the pressure may be performed in the range of from 0.1 Pa to 133 Pa. High-frequency power ranging from 1 MHz to 120 MHz, preferably from 13 MHz to 60 MHz may be supplied to a power for forming glow discharge. The temperature for heating a substrate is preferably 300° C. or less, and the temperatures for heating a substrate in the range of from 100° C. to 250° C. is recommended.

In addition, a crystalline semiconductor film can be formed by crystallizing an amorphous semiconductor film or a SAS with heating or laser irradiation. A crystalline semiconductor film may be directly formed. In this case, a crystalline semiconductor film can be directly formed by using a fluorine-based gas such as $GeF_4$ or $F_2$ and a silane-based gas such as $SiH_4$ or $Si_2H_6$ and utilizing heat or plasma.

When the second semiconductor film 403 has conductivity and an n-channel TFT is formed, an element belonging to group 15, typically phosphorus or arsenic, is added. In addition, in the case of forming a p-channel TFT, an element belonging to group 13, typically boron, is added. The second semiconductor film is formed by using a plasma CVD method in which gas having an element belonging to group 13 or 15 such as boron, phosphorus or arsenic is added to a silicide gas. Furthermore, the second semiconductor film having conductivity can be formed by forming a semiconductor film and then applying a solution having an element belonging to group 13 or 15 over the semiconductor film to perform irradiation with a laser beam. Laser beam emitted from a known laser of pulsed oscillation or continuous oscillation is appropriately used as the laser beam.

Next, a first mask pattern 404 is formed over the second semiconductor film. The first mask pattern is preferably formed by using a heat resistant high molecular weight material, and is preferably formed by discharging a high molecular weight substance having an aromatic ring or a heterocyclic ring as a principle chain and including at least heteroatomic group having high polarity in an aliphatic portion with a droplet discharge method. Polyimide, polybenzimidazole or the like can be given as a typical example of such a high molecular weight substance. In the case of using polyimide, the first mask pattern can be formed by discharging a solution containing polyimide from a discharge opening over the second semiconductor film 403 and baking for 30 minutes at 200° C.

In addition, the first mask pattern can be formed by previously forming a mask pattern having a liquid-repellent surface, and then, applying or discharging a high molecular weight material to a region which is not covered with the liquid-repellent surface.

Figure 4B:
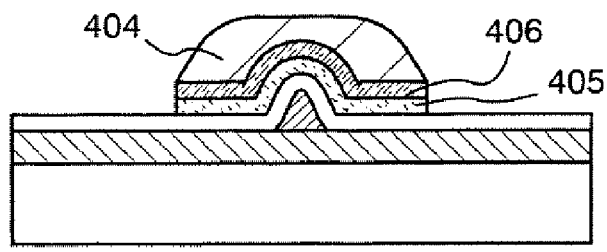

Next, as shown in FIG. 4B, the first semiconductor film 402 and the second semiconductor film 403 are etched by using the first mask pattern 404 to form each of a first semiconductor region 405 and a second semiconductor region 406. Then, the first mask pattern is removed.

The first semiconductor film and the second semiconductor film can be etched by using a chlorine-based gas typified by $Cl_2$, $BCl_3$, $SiCl_4$, $CCl_4$ or the like; a fluorine-based gas typified by $CF_4$, $SF_6$, $NF_3$, $CHF_3$ or the like; or $O_2$.

Note that the first semiconductor region 405 can be formed from an organic semiconductor material by using a printing method, a spray method, a spin coating method, a droplet discharge method or the like. In this case, since the above etching step is not required, the number of steps can be reduced. A π-electron conjugated based high molecular weight material having a skeleton thereof constituted by a conjugated double bonds is preferably used as an organic semiconductor material used in the present invention. Typically, a high molecular weight material having solubility such as polythiophene, poly(3-alkylthiophene), a polythiophene derivative or pentacene can be used.

A material with which a first semiconductor region can be formed by performing treatment after depositing a precursor having solubility is given as an example of an organic semiconductor material which can be used according to the invention. Note that polythienylenevinylene, poly(2,5-thienylenevinylene), polyacetyrene, a polyacetyrene derivative, polyallylenevinylene or the like is given as an example of such an organic semiconductor material formed by using the precursor.

In converting the precursor to an organic semiconductor, a reaction catalyst such as a hydrogen chloride gas is added additionally to a heat treatment. The following can be applied as a typical solvent which dissolves the organic semiconductor material having solubility: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran) or the like.

In addition, the first insulating film 401 can be formed with a solution having insulating properties by using a droplet discharge method, an application method, a sol-gel process or the like. A solution in which fine particles of inorganic oxide is dispersed, polyimide, polyamide, polyester, acryl, PSG (phosphorus glass), BPSG (phosphorus boron glass), silicate system SOG (Spin on Glass), polysilazane-based SOG and $SiO_2$ having a Si—$CH_3$ bond typified by alkoxy silicate-based SOG and polymethyl siloxane can be appropriately used as a typical example of the solution having insulating properties.

Figure 4C:
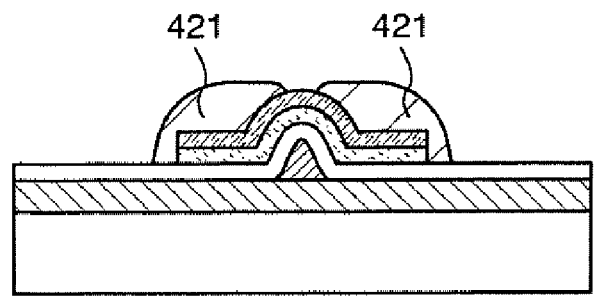

Next, as shown in FIG. 4C, a second mask pattern 421 is formed over the substrate. The second mask pattern can be formed by using the same material as the first mask pattern.

Figure 4D:
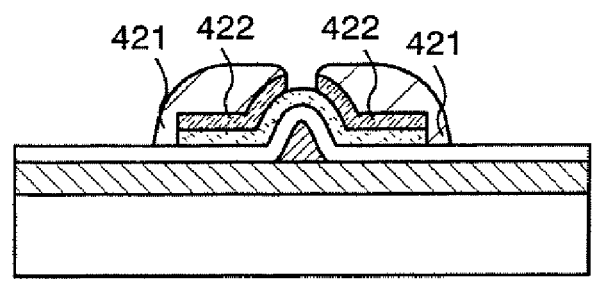

Next, the second semiconductor region 406 is etched by using the second mask pattern 421 as a mask to form a third semiconductor region (also referred to as source and drain regions or a contact layer) 422 as shown in FIG. 4D. Thereafter, the second mask pattern is removed by treatment using a peeling solution, ashing treatment using oxygen, or the like.

Note that, in the case of using an organic semiconductor for the first semiconductor region, a conductive layer formed from an organic conductive material such as polyacetyrene, polyaniline, PEDOT (poly-ethylenedioxythiophene), or PSS (poly-styrenesulphonate) can be formed. The conductive layer functions as a contact layer or source and drain electrodes.

In addition, a conductive layer formed from a metal element can be used instead of the third semiconductor region 422. In this case, since many organic semiconductor materials are p-type semiconductors which transport holes as a carrier, it is preferable to use a metal having a high work function to make an ohmic contact with the semiconductor layer.

Specifically, a metal, an alloy or the like of gold, platinum, chromium, palladium, aluminum, indium, molybdenum, nickel or the like is desirable. The conductive layer can be formed by using a conductive paste using these metal or alloy materials with a printing method, a roll coating method or a droplet discharge method.

Furthermore, the first semiconductor region formed from an organic semiconductor material, a conductive layer formed from an organic conductive material and a conductive layer formed from a metal element may be laminated.

Note that, in the case of forming the first semiconductor region from a SAS, a TFT having a so-called self-aligning structure in which the edge portion of source and drain regions and the edge portion of a gate electrode are aligned can be formed in addition to a structure in which a gate electrode is covered with source and drain regions as in this embodiment mode. Furthermore, the first semiconductor region can have a structure in which the gate electrode is not covered with the source and drain regions so as to be separated from each other with a certain distance therebetween. With this structure, since OFF current can be reduced, contrast can be enhanced when the TFT is used for a switching element of a display device.

Figure 4E:
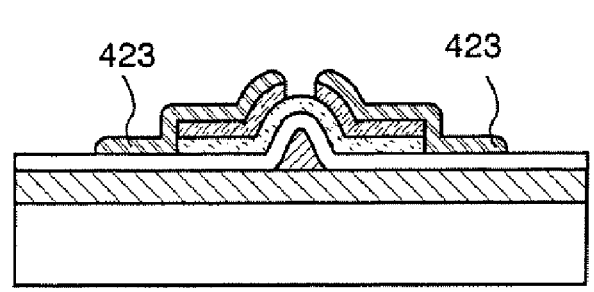

Next, as shown in FIG. 4E, source and drain electrodes 423 are formed over the source and drain regions by discharging a conductive material with a droplet discharging method. The same material as used for the first film pattern 112 which is dissolved or dispersed in a solvent can be used as the conductive material. Here, each electrode is formed to have a film thickness of from 600 nm to 800 nm by selectively discharging Ag paste and then appropriately performing drying and baking by the laser beam irradiation or the heat treatment as mentioned in the above.

Next, a passivation film is preferably formed over the source and drain electrodes 423. The passivation film can be formed by a method for forming a thin film such as a plasma CVD method or a sputtering method using silicon nitride, silicon oxide, silicon nitride oxide, silicon oxynitride, aluminum oxynitride, aluminum oxide, diamond like carbon (DLC), nitrogen containing carbon (CN) or other insulating material.

Through the steps mentioned above, a channel etched TFT having a narrow gate width, in other words, having a short channel length can be manufactured without using a photo mask.

Embodiment Mode 5

In this embodiment mode, a step of manufacturing a TFT having a gate electrode layer with a narrow width is described with reference to FIGS. 5A to 5D. Note that a channel protection TFT is used to describe the TFT in this embodiment mode. In this embodiment mode, a gate electrode layer is formed by applying Embodiment Mode 1; however, not limiting thereto, Embodiment Mode 2 or Embodiment Mode 3 can be appropriately applied.

As shown in FIG. 5A, a light absorption layer 102 is formed over a substrate 101 by applying Embodiment Mode 1, and then, a first mask pattern 112 which functions as a gate electrode layer and has a cross-section having a Gaussian curved shape is formed thereover.

Next, a first insulating film 401 and a first semiconductor film 402 are formed over the substrate and the first film pattern. Then, a protective film 501 is formed in a region overlapped with the first film pattern 112 which functions as a gate electrode layer over the first semiconductor film 402. The protective film 501 can be formed by using the same method and material as a first mask pattern 404 shown in Embodiment Mode 4.

Next, a second semiconductor film (a semiconductor film having conductivity) 403 is formed in the same manner as Embodiment Mode 4. Then, a first mask pattern 404 is formed in the same manner as Embodiment Mode 4.

Next, as shown in FIG. 5B, the first semiconductor film and the second semiconductor film are etched by using the first mask pattern to form a first semiconductor region 405 and a second semiconductor region 406. Then, the first mask pattern is removed.

Next, as shown in FIG. 5C, source and drain electrodes 423 are formed over the second semiconductor region 406.

Figure 5D:
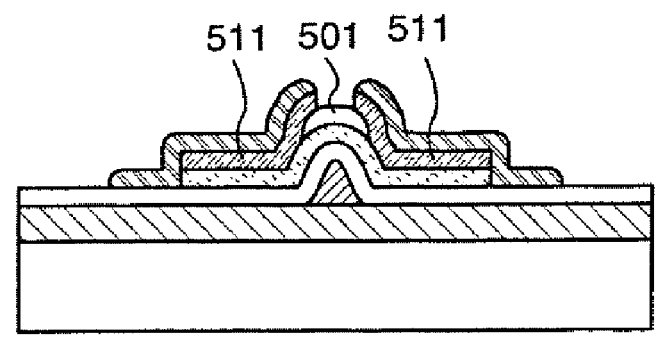

Next, as shown in FIG. 5D, an exposed portion of the second semiconductor region is etched and divided by using the source and drain electrodes 423 as a mask to form source and drain regions 511. Through this step, the protection film 501 is exposed.

Note that a method for forming the source and drain regions is not limited to this embodiment mode and the step shown in Embodiment Mode 4 may also be used. In addition, the step of forming the source and drain regions in this embodiment mode may be applied to Embodiment Mode 4.

Through the steps mentioned above, a channel protection TFT having a narrow gate width, in other words, having a short channel length can be manufactured without using a photo mask.

Embodiment Mode 6

In this embodiment mode, a step of manufacturing a forward stagger TFT having a short channel length is described with reference to FIGS. 6A to 6D. In this embodiment mode, Embodiment Mode 3 is applied to describe a method for forming source and drain regions; however, not limiting thereto, Embodiment Mode 1 or Embodiment Mode 2 can be applied appropriately.

Figure 6A:
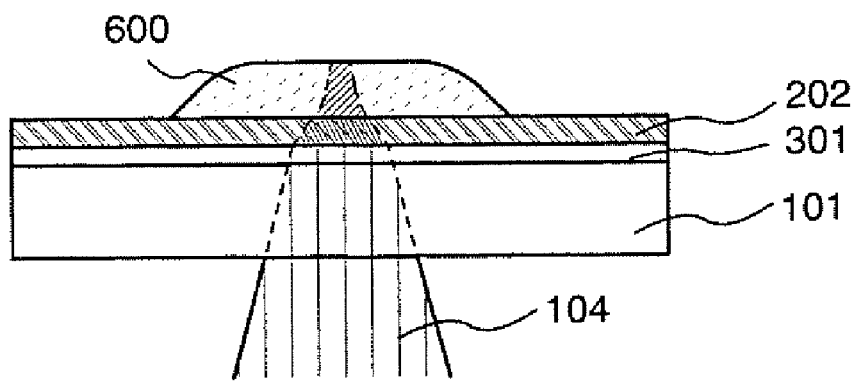
FIGS. 6A to 6D are explanatory cross-sectional views of a manufacturing step of a semiconductor device according to certain aspects of the present invention.

As shown in FIG. 6A, an insulating film 301 is formed over a substrate 101, and then, a light absorption layer 202 is formed thereover. Since the light absorption layer subsequently functions as source and drain electrodes, it is formed from a conductive material. The method and material same as a light absorption layer 202 shown in Embodiment Mode 3 can be appropriately used. Then, a thermoplastic or thermosetting material 600 is discharged over the light absorption layer 202, and then is dried. A thermoplastic material is discharged here.

Figure 6B:
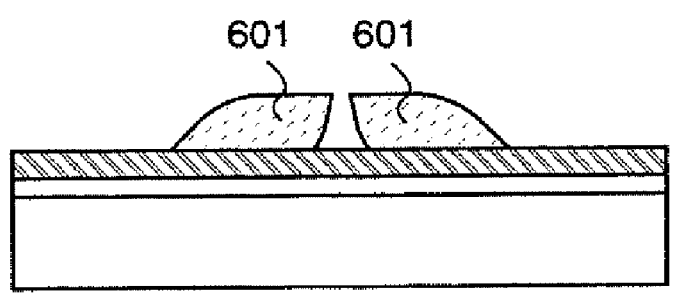

Next, the light absorption layer is irradiated with laser light from beneath the substrate to heat part of the light absorption layer and to modify the thermoplastic material with the heat. Then, a region which is not modified by heat in the thermoplastic or thermosetting material is removed by a peeling solution or the like. Here, since the thermoplastic material is used, the material over the region irradiated with the laser light is removed to form a first film pattern 601 as shown in FIG. 6B. Here, the first film pattern 601 serves as a mask pattern.

Figure 6C:
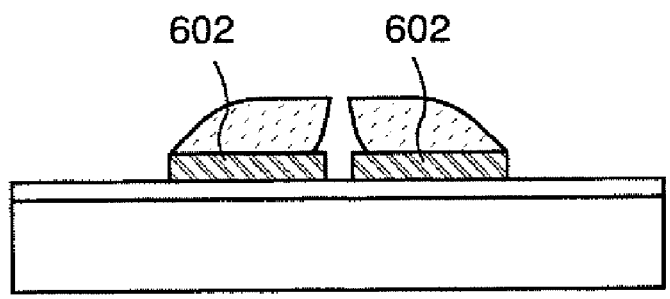

Next, as shown in FIG. 6C, the light absorption layer 202 is etched by using the first film pattern 601 to form a first conductive layer 602. The first conductive layer 602 functions as source and drain electrodes. Note that a plurality of film patterns having smaller spaces than the diameter of the laser beam can be formed according to the present invention. Accordingly, there is a minute distance between the conductive layers formed by using the film pattern, and it is possible to shorten the channel length of a TFT which is subsequently to be formed.

Figure 6D:
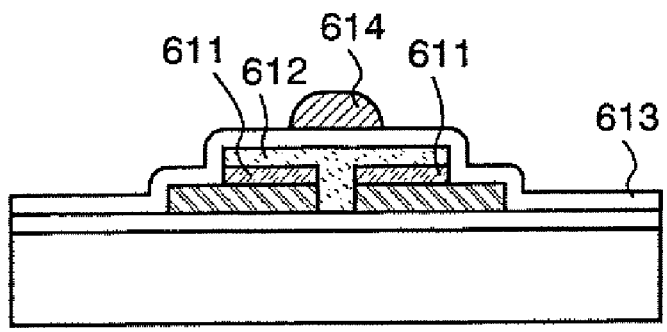

Next, as shown in FIG. 6D, a forward stagger TFT can be manufactured by forming a first semiconductor region 611 having conductivity, a second semiconductor region 612, a gate insulating film 613 and a gate electrode 614. Note that the first semiconductor region functions as source and drain regions and the second semiconductor region functions as a channel formation region.

Through the steps mentioned above, a forward stagger TFT having a short channel length can be manufactured without using a photo mask.

Embodiment Mode 7

In this embodiment mode, a method for forming a contact hole of a TFT is described with reference to FIGS. 7A to 7E.

Figure 7A:
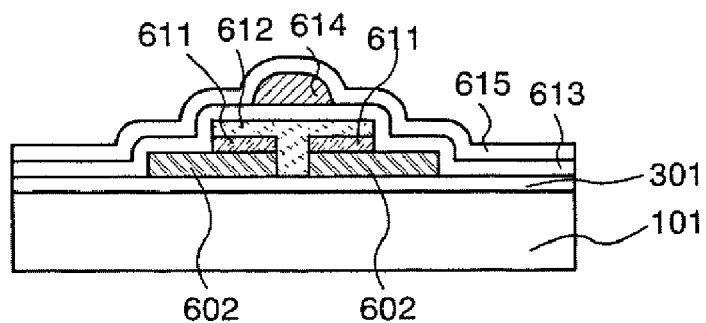
FIGS. 7A to 7E are explanatory cross-sectional views of a structure of a semiconductor device according to certain aspects of the present invention.

According to Embodiment Mode 6, a forward stagger TFT is formed as shown in FIG. 7A. Here, an insulating film 301, a first conductive layer 602, a first semiconductor region 611 having conductivity, a second semiconductor region 612, a gate insulating film 613 and a gate electrode 614 are formed over a substrate 101. Thereafter, a protective film 615 is formed so as to cover the TFT. Note that the first semiconductor region functions as source and drain regions and the second semiconductor region functions as a channel formation region.

Figure 7B:
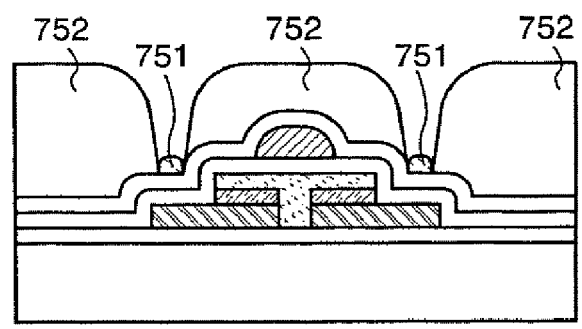

Next, as shown in FIG. 7B, a solution which forms a liquid-repellent surface is discharged to a region where the first conductive layer 602, the gate insulating film 613 and the protective film 615 are overlapped with each other to form a first mask pattern 751 by a droplet discharge method.

A region having a liquid-repellent surface refers to a region where a contact angle between the surface and liquid is large. The liquid is repelled in a hemispherical shape over the surface. On the other hand, a region having a lyophilic surface refers to a region where a contact angle between the surface and liquid is small. The liquid is applied and spread over the surface.

Therefore, when two regions having different contact angels are in contact with each other, the region where a contact angle is comparatively high is a region having a liquid-repellent surface, and the region where a contact angle is comparatively low is a region having a lyophilic surface. When a solution is applied or discharged to the two regions, the solution is applied and spread over the surface of the region having a lyophilic surface and is repelled in a hemispherical shape in an interface between the region having a lyophilic surface and the region having a liquid-repellent surface.

Note that, when a surface has a depression/projection, the region having a liquid-repellent surface has a much higher contact angle. In other words, liquid repellency is enhanced. On the other hand, the region having a lyophilic surface has a much lower contact angle. In other words, the surface becomes more lyophilic. Therefore, a layer in which an edge portion is uniform can be formed by applying or discharging a solution having a composition over each surface having a depression/projection and by baking it.

Here, a material which forms a liquid-repellent surface is applied or discharged to form a region having a liquid-repellent surface. A silane coupling agent expressed in a chemical formula $R_n$—Si—$X_{(4-n)}$ (n is equal to 1, 2 or 3) is used as an example of a composition of the solution which forms a liquid-repellent surface. Here, R denotes a substance which contains a comparatively inert group such as an alkyl group. X is formed with a hydrolytic group such as halogen, a methoxy group, an ethoxy group or an acetoxy group that is bondable by condensation with a hydroxyl group or adsorbed water on the surface of the base film of the region having a liquid-repellent surface, here the surface of the protective film 615.

In addition, liquid repellency can be further enhanced by using a fluorine-based silane coupling agent (fluoroalkyl silane (hereinafter, referred to as FAS)) containing a fluoroalkyl group as R, which is given as a typical example of the silane coupling agent. R of FAS has a structure expressed by $(CF_3)(CF_2)_x(CH_2)_y$ (x: an integer in the range of from 0 to 10, and y: an integer in the range of from 0 to 4). When a plurality of Rs or Xs are combined with Si, the Rs or Xs may be all the same or different from each other. Heptadeca fluoro tetrahydro decyl triethoxysilane, heptadeca fluoro tetrahydro decyl trichlorosilane, tridecafluoro tetrahydro octyl trichlorosilane, trifluoropropyl trimethoxysilane or the like is typically given as an example of FAS.

The following solvent which forms a liquid-repellent surface is used as a solvent of a solution which forms a liquid-repellent surface: a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene or squalane; tetrahydrofuran or the like.

In addition, a material having a fluorine carbon chain (fluorine-based resin) can be used as an example of the composition of the solution which forms a liquid-repellent surface. Polytetra-fluoroethylene (PTFE), perfluoroalkoxy alkane (PFA), perfluoroethylene propene copolymer (PFEP), ethylene-tetrafluoroethylene copolymer (ETFE), polyvinylidene fluoride (PVDF), polychloro-trifluoroethylene (PCTFE), ethylene-chlorotrifluoroethylene copolymer (ECTFE), polytetra-fluoroethylene-perfluoro dioxole copolymer (TFE/PDD), polyvinyl fluoride (PVF) or the like can be used as the fluorine-based resin.

Next, the surface to which the solution which forms a liquid-repellent surface is attached is washed with ethanol to form an extremely thin liquid-repellent surface.

In addition, an organic material which does not form a liquid-repellent surface (in other words, an organic material which forms a lyophilic surface) may be used for the mask pattern. In this case, the organic material may be treated with $CF_4$ plasma or the like to form a liquid-repellent surface. For example, a material in which water soluble resin such as polyvinyl alcohol (PVA) is mixed into a solvent such as $H_2O$ may be used. Furthermore, PVA and another water soluble resin may be used in combination. Even when the mask pattern has a liquid-repellent surface, the liquid repellency can be further enhanced by performing the plasma treatment or the like.

In addition, an electrode provided with a dielectric is prepared, and plasma treatment can be performed by generating plasma so that the dielectric is exposed to the plasma using air, oxygen or nitrogen. In this case, the dielectric is not required to cover the entire surface of the electrode. Teflon (registered trademark) can be used as the dielectric. In the case of using Teflon (registered trademark), the surface is modified by forming a $CF_2$ bond over a surface to be formed, and thus, the surface can be made liquid-repellent. In addition, plasma treatment is performed.

Next, a solution which forms a lyophilic surface is applied or discharged to form a second mask pattern 752. The following can be given as a typical example of the solution which forms a lyophilic surface: organic resin such as acrylic resin, polyimide resin, melamine resin, polyester resin, polycarbonate resin, phenol resin, epoxy resin, polyacetal, polyether, polyurethane, polyamide (nylon), furan resin or diallyl phthalate resin; siloxane or polysilazane. In addition, a solution using a polar solvent such as water, alcohols, ethers, dimethylformamide, dimethylacetamide, dimethylsulfoxide, N-methylpyrrolidone, hexamethylphosphamide, chloroform or methylene chloride can be used. A droplet discharge method, an ink-Jet method, a spin coating method, a roll coating method, a slot coating method or the like can be applied as a method for forming the second mask patterns.

Since the first mask pattern 751 has a liquid-repellent surface, a second mask pattern 752 is formed in the outer periphery of the first mask pattern, in other words, in a region where the first mask patterns is not formed.

In addition to the above steps, the second mask pattern may be formed by applying the solution which forms a lyophilic surface after drying the solvent of the first mask pattern. Moreover, the surface of the first mask pattern may be washed with ethanol. Through the steps mentioned above, an extremely thin liquid-repellent surface can be formed. Furthermore, the composition of the first mask pattern remains on the surface of the protective film 615 or penetrates into the film.

Figure 7C:
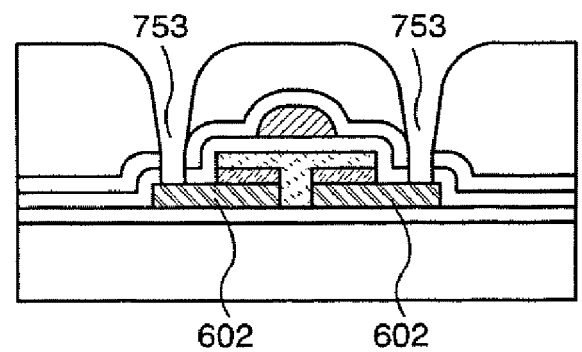

Next, as shown in FIG. 7C, the first mask pattern 751, the protective film 615 and the gate insulating film 613 are etched by using the second mask pattern 752 as a mask to partially expose the first conductive layer 602.

Figure 7D:
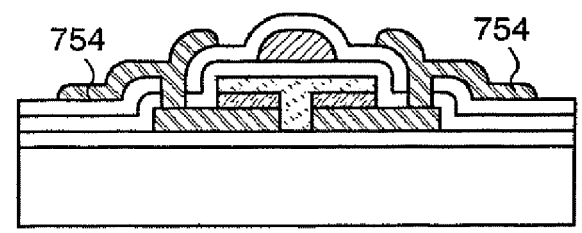

Next, as shown in FIG. 7D, a third conductive layer 754 is formed. The third conductive layer 754 functions as source and drain wiring layers.

Figure 7E:
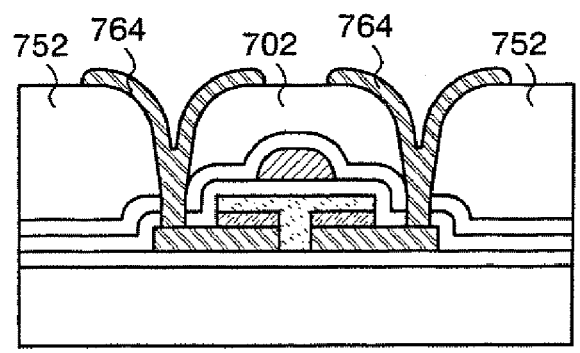

Note that, as shown in FIG. 7E, a third conductive layer 764 can be formed by using the second mask pattern 752 as an interlayer insulating film without being removed.

Through the steps mentioned above, a contact hole can be formed without using a photo mask.

Embodiment Mode 8

Figure 24:
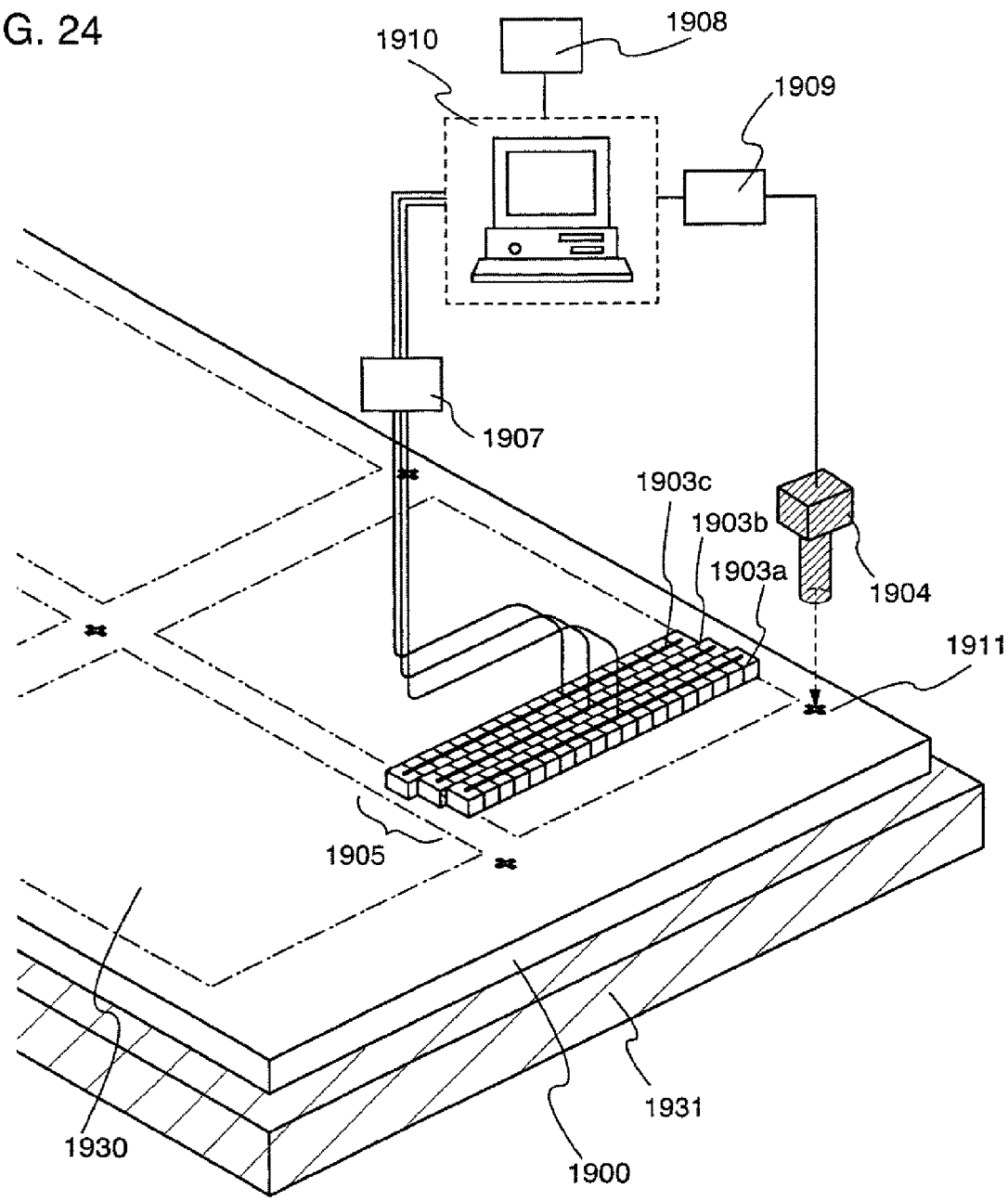
FIG. 24 is an explanatory view of a structure of a droplet discharge apparatus which can be applied to a certain aspect of the present invention.

In this embodiment mode, a droplet discharge apparatus which can be used for pattern formation in the above embodiment modes is described. In FIG. 24, a region 1930 where one panel is to be formed is shown in a dotted line on a substrate 1900.

FIG. 24 shows one mode of a droplet discharge apparatus used to form a pattern such as a wiring. A droplet discharge means 1905 has a head, and the head has a plurality of nozzles. In this embodiment mode, the case of having three heads (1903a, 1903b and 1903c) each provided with ten nozzles is described. However, the number of nozzles and heads can be set in accordance with treatment area, steps or the like.

The heads are connected to a control means 1907, and the control means controls the heads by a computer 1910, so that a preset pattern can be drawn. The timing of drawing may be determined by, for example, using a marker 1911 that is formed over the substrate 1900 or the like fixed to a stage 1931 as a reference point. Alternatively, the timing of drawing may be determined by using an edge of the substrate 1900 as a reference point. The reference point is detected by an imaging means 1904 such as a CCD, and changed into a digital signal by an image processing means 1909. Then, the digital signal is recognized by the computer 1910, and a control signal is generated and transmitted to the control means 1907. When the pattern is drawn in this manner, a distance between a pattern formation face and a tip of the nozzle may be set from 0.1 cm to 5 cm, preferably, from 0.1 cm to 2 cm, more preferably, approximately 0.1 cm. Landing accuracy of a droplet is improved by making the distance short as described above.

Information on a pattern to be formed over the substrate 1900 is stored in a recording medium 1908 at this time, and a control signal is transmitted to the control means 1907 based on the information, so that the heads 1903a, 1903b and 1903c can be individually controlled. In other words, droplets including different materials can be discharged from each nozzle of the heads 1903a, 1903b and 1903c. For example, the nozzles of the heads 1903a and 1903b can discharge a droplet including an insulating film material and the nozzles of the head 1903c can discharge a droplet including a conductive film material.

Furthermore, each nozzle of the heads can also be individually controlled. Since the nozzles can be individually controlled, droplets including different materials can be discharged from a specific nozzle. For example, one head 1903a can be provided with a nozzle which discharges a droplet including a conductive film material and a nozzle which discharges a droplet including an insulating film material.

In the case of performing droplet discharge treatment on a large area, such as a step of forming an interlayer insulating film, a droplet including an interlayer insulating film material is preferably discharged from all nozzles. Furthermore, a droplet including an interlayer insulating film material is preferably discharged from all nozzles of a plurality of heads. Accordingly, throughput can be enhanced. Of course, in the step of forming an interlayer insulating, droplet discharge treatment may be performed on a large area by discharging a droplet including an interlayer insulating film material from one nozzle and by making the nozzle scan the substrate for a plurality of times.

Pattern can be formed on a large mother glass by moving the head in zigzag or shuttling the head. At this time, the head may be made to relatively scan the substrate a plurality of times. When the head scans relative to the substrate, the head is preferably inclined toward a moving direction.

When a plurality of panels is formed out of a large mother glass, the head preferably has a width equal to that of one panel. This is because a pattern can be formed with one scanning in the region 1930 where one panel is formed; thus, high throughput can be expected.

In addition, the width of the head may be narrower than that of the panel. At this time, a plurality of heads having a narrow width may be arranged in series to have a width equal to that of one panel. Bending of the head, which is concerned as a width of the head becomes broader, can be prevented from occurring by arranging a plurality of heads having a narrow width in series. Of course, a pattern may be formed by scanning a head having a narrow width a plurality of times.

A step of discharging a droplet of a solution by a droplet discharge method as described above is preferably performed under a reduced pressure. This is because a solvent of the solution is evaporated during a period from discharging the solution until the solution lands on an object to be treated, and thus, both steps of drying and baking the solution can be omitted. Since an oxide film or the like is not formed on the surface of a conductor, it is preferable to perform the step under a reduced pressure. In addition, the step of dropping a solution may be performed in a nitrogen atmosphere or an organic gas atmosphere.

In addition, a piezo method can be applied as a droplet discharge method. Since the piezo method has superior ink-droplet controllability and a high degree of freedom for ink selection, it is utilized also for an inkjet printer. Note that the piezo method includes a bender type (typically, an MLP (Multi Layer Piezo) type), a piston type (typically, an ML Chip (Multi Layer Ceramic Hyper Integrated Piezo segments) type), a side wall type and a roof wall type. Alternatively, a droplet discharge method using a so-called bubble jet method (thermal method) which makes a heating element generate heat to generate bubbles and to push out a solution may be applied depending on a solvent of a solution.

Embodiment Mode 9

In this embodiment mode, a manufacturing step of a gate electrode in a TFT having a multi-gate structure is described with reference to FIGS. 40A to 40E, FIGS. 41A to 41E and FIGS. 42A to 42D. Note that FIGS. 40A to 40E and FIGS. 41A to 41E are cross-sectional views of the manufacturing step, and FIGS. 42A to 42D are top views of a multi-gate electrode.

A manufacturing step of a multi-gate TFT is described with reference to FIGS. 40A to 40E and FIGS. 42A to 42D. Embodiment Mode 1 is applied here to describe the manufacturing step of the multi-gate electrode; however, a multi-gate electrode having a lamination structure can also be formed by applying Embodiment Mode 2 instead of Embodiment Mode 1.

Figure 40A:
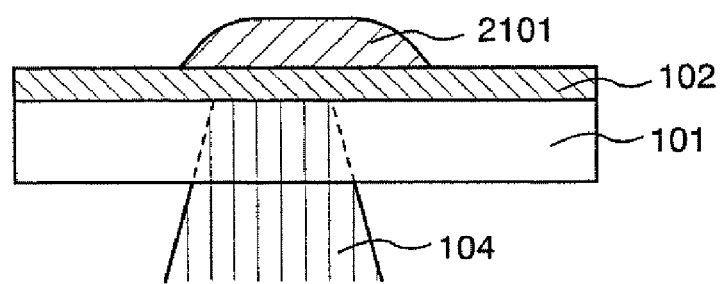
FIGS. 40A to 40E are explanatory cross-sectional views of a manufacturing step of a semiconductor device according to certain aspects of the present invention.

As shown in FIG. 40A, a light absorption layer 102 is formed over a substrate 101. An insulating material which can absorb light is used here as the light absorption layer 102. A conductor dissolved or dispersed solution 2101 is applied or discharged over the light absorption layer 102. Then, the light absorption layer 102 is irradiated with laser light 104 from the substrate side to heat part of the light absorption layer.

Figure 40B:
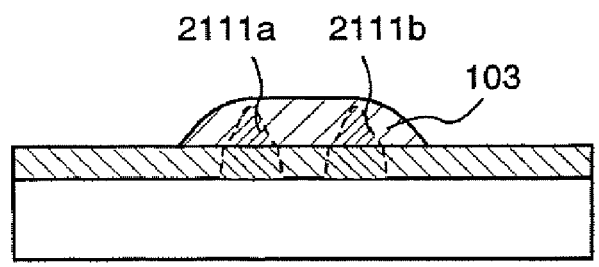
Figure 42A:
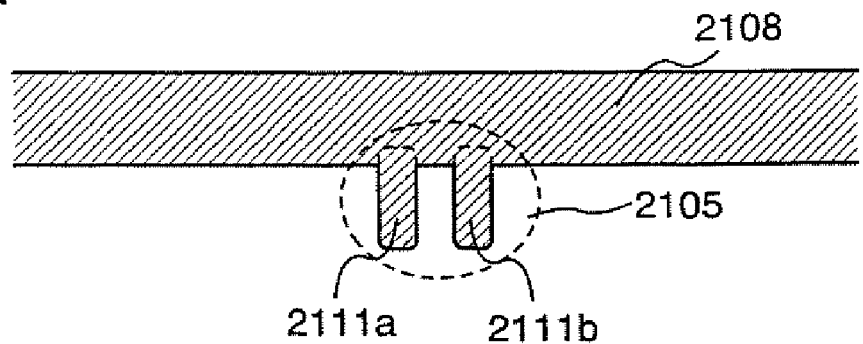
FIGS. 42A to 42D are explanatory top views of a manufacturing step of a semiconductor device according to certain aspects of the present invention.

Here, a region where a gate electrode is later formed is irradiated with the laser light. Note that, as shown in FIG. 40B, a region which is to be one electrode 2111a of the multi-gate electrode is irradiated with the laser light, and a region which is to be the other electrode 2111b is irradiated with the laser light after the conductor in the solution is welded and sintered to cool the light absorption layer in the region in order to form a multi-gate electrode. According to such steps, a comb-shaped multi-gate electrode 2105 as shown in FIG. 42A can be formed. The comb-shaped multi-gate electrode can also be formed even by irradiating the light absorption layer in an inverted "c" shape with laser light.

Figure 42B:
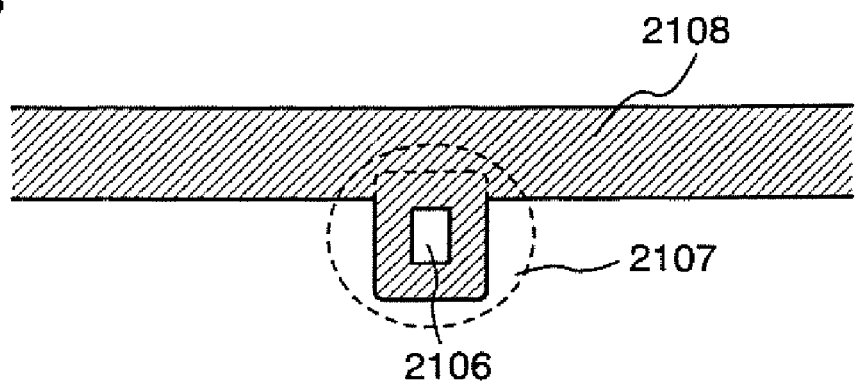

In addition, a multi-gate electrode 2107 having an opening 2106 as shown in FIG. 42B can be formed by irradiating the light absorption layer with laser light in a square shape.

Figure 40C:
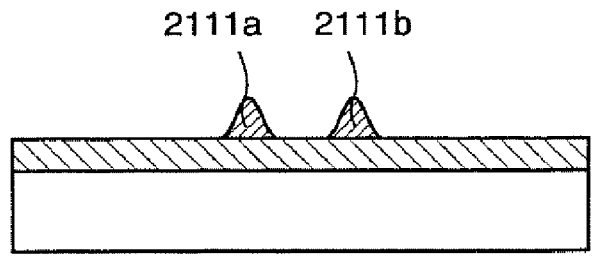

Next, as shown in FIG. 40C, the part that is not modified by irradiation of laser light and heating in a solution containing a conductive material is removed in order to expose the multi-gate electrode.

Next, as shown in FIGS. 42A and 42B, a gate wiring 2108 connected to the multi-gate electrodes 2105 and 2107 is formed. Here, a solution having a conductor is discharged by a droplet discharge method and baked to form the gate wiring 2108. Note that the multi-gate electrodes 2105 and 2107 can also be formed after forming the gate wiring 2108 instead of this step.

Figure 40D:
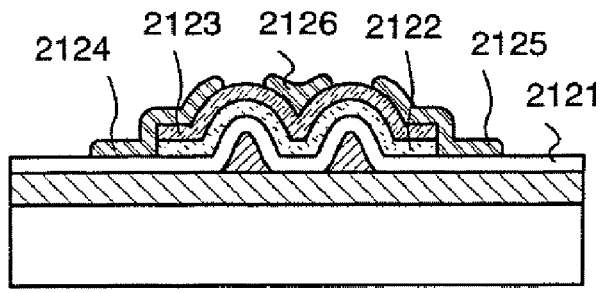

Next, as shown in FIG. 40D, a gate insulating film 2121, a first semiconductor region 2122 and a second semiconductor region 2123 are formed over the multi-gate electrodes in the same manner as in Embodiment Mode 3. Here, the first semiconductor region 2122 functions as a channel formation region, and the second semiconductor region 2123 functions as source and drain regions.

Next, conductive layers 2124 to 2126 are formed by discharging a solution containing a conductor. Each of the conductive layers 2124 and 2125 functions as source and drain electrodes. The conductive layer 2126 covers each part of the electrodes 2111a and 2111b.

Figure 40E:
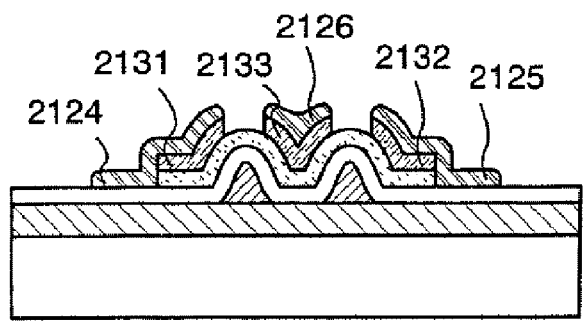

Next, as shown in FIG. 40E, the second semiconductor region is etched to form contact layers 2131 to 2133 by using the conductive layers 2124 to 2126 as masks.

Note that a manufacturing step of the channel-etch type TFT is shown here by using Embodiment Mode 4; however, Embodiment Mode 5 or Embodiment Mode 6 can be appropriately used, without limiting thereto.

Next, a step of using Embodiment Mode 3 is described as the manufacturing step of the multi-gate electrode. Note that a first mask pattern is formed here by using a thermoplastic material; however, the first mask pattern can also be formed by using a thermosetting material instead of this step. In this case, a region where the first mask pattern is formed is irradiated with laser light.

As shown in FIGS. 41A to 41E, an insulating film 301 and a light absorption layer 202 that is formed from a conductive material are formed over a substrate 101. Then, a solution 302 formed from a thermoplastic material or a thermosetting material is discharged over the light absorption layer, and then, dried. A solution containing a thermoplastic material is used here as the solution 302. Thereafter, the light absorption layer 202 is heated by irradiating the substrate with laser light to be transmitted so that part of the thermoplastic material is heated. In this case, the material and the film thickness of the light absorption layer, and the laser beam diameter and the intensity of the laser light are appropriately adjusted in part of the thermoplastic material so that heat is conducted from the substrate side to a surface.

Figure 41A:
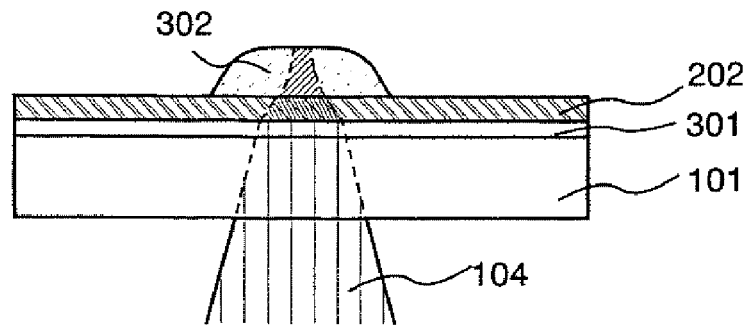
FIGS. 41A to 41E are explanatory cross-sectional views of a manufacturing step of a semiconductor device according to certain aspects of the present invention.
Figure 41B:
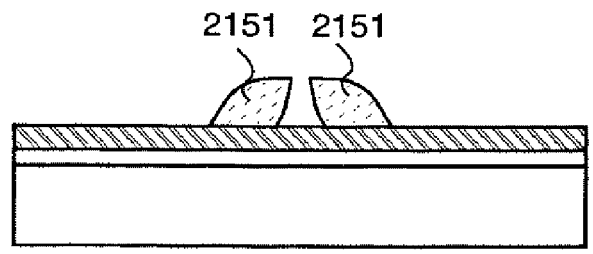
Figure 41C:
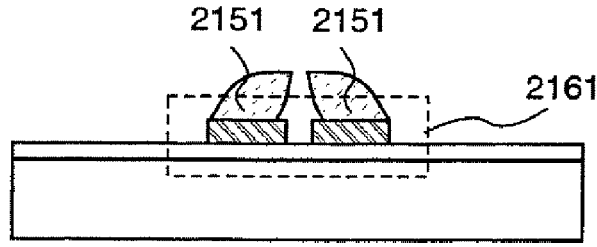

Next, as shown in FIG. 41B, a first mask pattern 2151 is formed by dissolving a modified part by heat using a peeling solution.

Figure 42C:
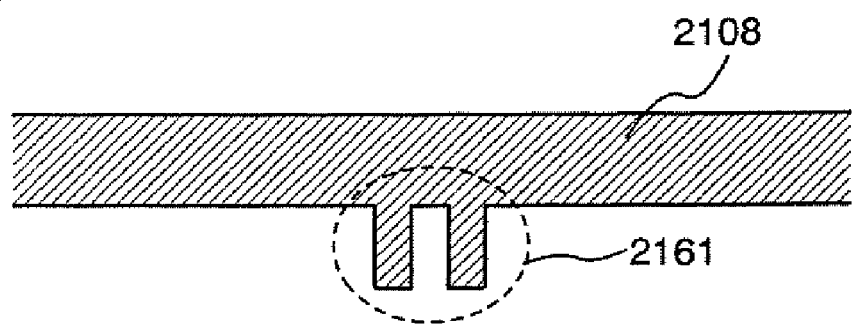
Figure 42D:
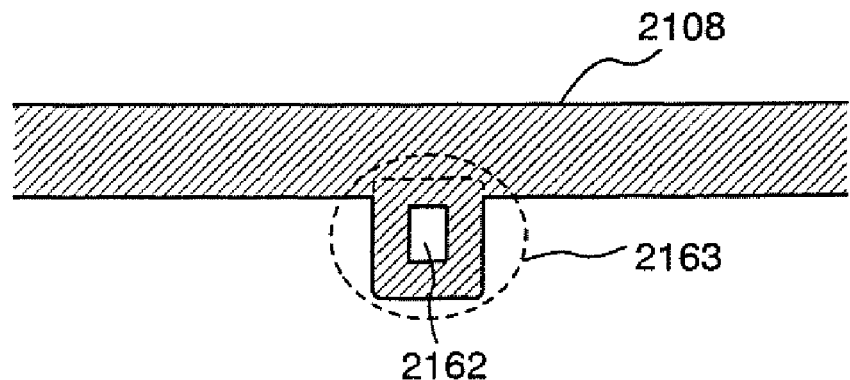

As well as in FIG. 41B, in this case, a comb-shaped multi-gate electrode 2161 as shown in FIG. 42C or a multi-gate electrode 2163 having an opening 2162 as shown in FIG. 42D can also be formed by an irradiation method of laser light.

Thereafter, a second mask pattern is formed by a droplet discharge method in a region subsequently to be the gate wiring in the light absorption layer. At this time, the second mask pattern is formed to connect to the first mask pattern. Thereafter, as shown in FIGS. 42C and 42D, the multi-gate electrode and the gate wiring connected thereto can be formed by etching the light absorption layer. In this case, they can be formed by one etching step. Then, the first mask pattern and the second mask pattern are removed.

Figure 41D:
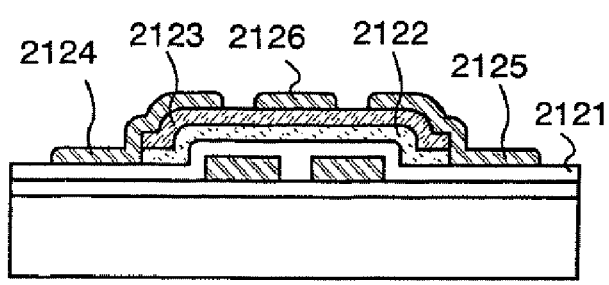

Next, as shown in FIG. 41D, as well as in Embodiment Mode 4, a gate insulating film 2121, a first semiconductor region 2122 and a second semiconductor region 2123 are formed over the multi-gate electrode.

Next, conductive layers 2124 to 2126 are formed by discharging a solution containing conductive particles. The conductive layers 2124 and 2125 function as source and drain electrodes. The conductive layer 2126 covers each part of the electrode 2111a and 2111b.

Figure 41E:
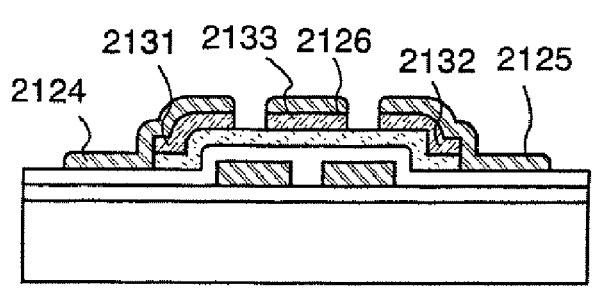

Next, as shown in FIG. 41E, the second semiconductor region is etched to form contact layers 2131 to 2133 by using the conductive layers 2124 to 2126 as masks.

Note that a manufacturing step of a channel-etch type TFT is shown here by using Embodiment Mode 4; however, Embodiment Mode 5 or 6 can be appropriately used, without limiting thereto.

Through the steps mentioned above, a channel-etch type TFT can be formed. Since the TFT in this embodiment mode has the multi-gate electrode, the electric field on the drain edge is relieved, and thus, off-current is decreased. Accordingly, the contrast is enhanced when the TFT is used as a switching element of a display device. In addition, since a TFT having a multi-gate structure with a small-occupied area can be formed, a highly integrated semiconductor device can be formed.

In addition, the width of the gate electrode can be made narrower than the beam width of laser light; therefore, a TFT having a gate electrode with a minute structure (that is, with a short channel length) can be manufactured.

Furthermore, since the gate electrodes having the openings as shown in FIGS. 42B and 42D are connected by the end portion, the resistivity of the film can be almost uniform, and variation in the characteristics of TFTs to be subsequently to be formed can be decreased even when the film thickness of the gate electrode is uneven. Note that one opening is provided in this embodiment mode; however, two or more openings can be provided. The more the number of openings is increased, the more the electric field on the drain edge is relieved, and thus, off-current can be decreased.

Embodiment 1

Next, a method for manufacturing an active matrix substrate and a display panel therewith are described with reference to FIGS. 17A to 17F, FIGS. 18A to 18E, FIGS. 19A to 19C and FIGS. 20 to 23. This embodiment mode is described using a liquid crystal display panel as a display panel. FIGS. 17A to 17F, FIGS. 18A to 18E and FIGS. 19A to 19C schematically show longitudinal sectional structures of a pixel portion and a connection terminal portion, and FIGS. 20 to 23 show planar structures corresponding to lines A-B and C-D. In addition, a step of forming a gate electrode layer is described by using Embodiment Mode 1 in this embodiment mode.

Figure 17A:
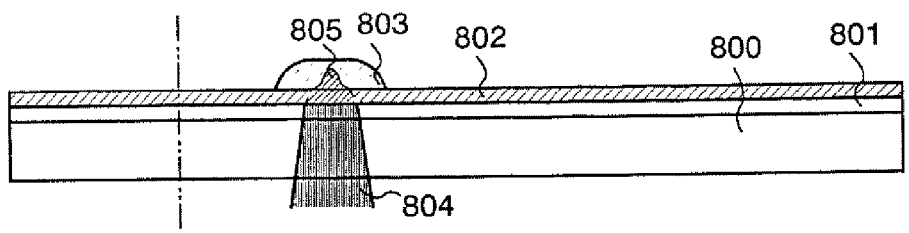
FIGS. 17A to 17F are explanatory cross-sectional views of a manufacturing step of a semiconductor device according to certain aspects of the present invention.

As shown in FIG. 17A, a surface of a substrate 800 is oxidized at 400° C. to form an insulating film 801 having a 100 nm film thickness. This insulating film functions as an etching stopper film of a conductive layer which is subsequently to be formed. Then, a first conductive layer 802 is formed over the insulating film 801, and a thermosetting material is discharged to a region where a gate electrode layer is formed later over the first conductive layer to dry by a droplet discharge method. An AN 100 glass substrate manufactured by Asahi Glass Co., Ltd. is used as the substrate 800, and a tungsten film having a 100 nm film thickness is formed by a sputtering method using a tungsten target and an argon gas as the first conductive layer 802. Polyimide is used for the thermosetting material.

Next, the first conductive layer 802 is irradiated with laser light 804 from beneath the substrate. Here, laser light emitted from an Nd:YVO$_4$ laser is used as the laser light. Consequently, part of the thermosetting material is cured, and a first mask pattern 805 is formed. Thereafter, the uncured thermosetting material is removed by using a peeling solution. Here, since the first conductive layer and the thermosetting material are heated by using a region where the light intensity is locally high due to the beam spot of the laser light, a minute mask pattern can be formed.

Figure 17B:
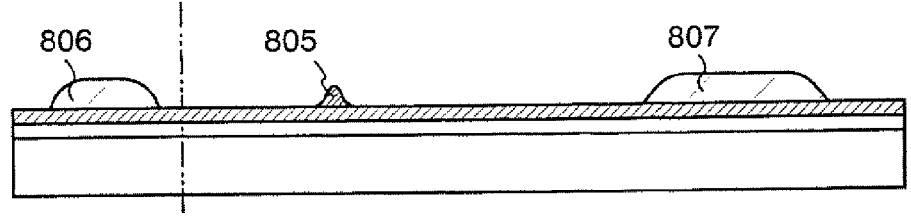

Next, as shown in FIG. 17B, second mask patterns 806 and 807 are formed. Here, polyimide is discharged to a region where a gate wiring layer and a connection conductive layer are subsequently to be formed to form the second mask patterns by heating at 200° C. for 30 minutes. The resistor of the gate wiring layer is decreased and the connection conductive layer needs a margin to form a contact hole; therefore, it is not necessary to perform miniaturization particularly. Thus, a step of miniaturizing with the irradiation of laser light is omitted. However, the second mask patterns may be formed in the same manner as the first mask pattern. In this case, the aperture ratio of a pixel can be enhanced.

Figure 17C:
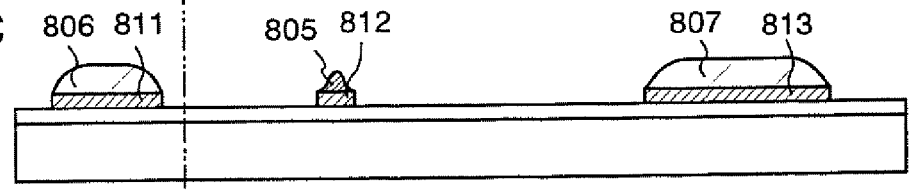
Figure 20:
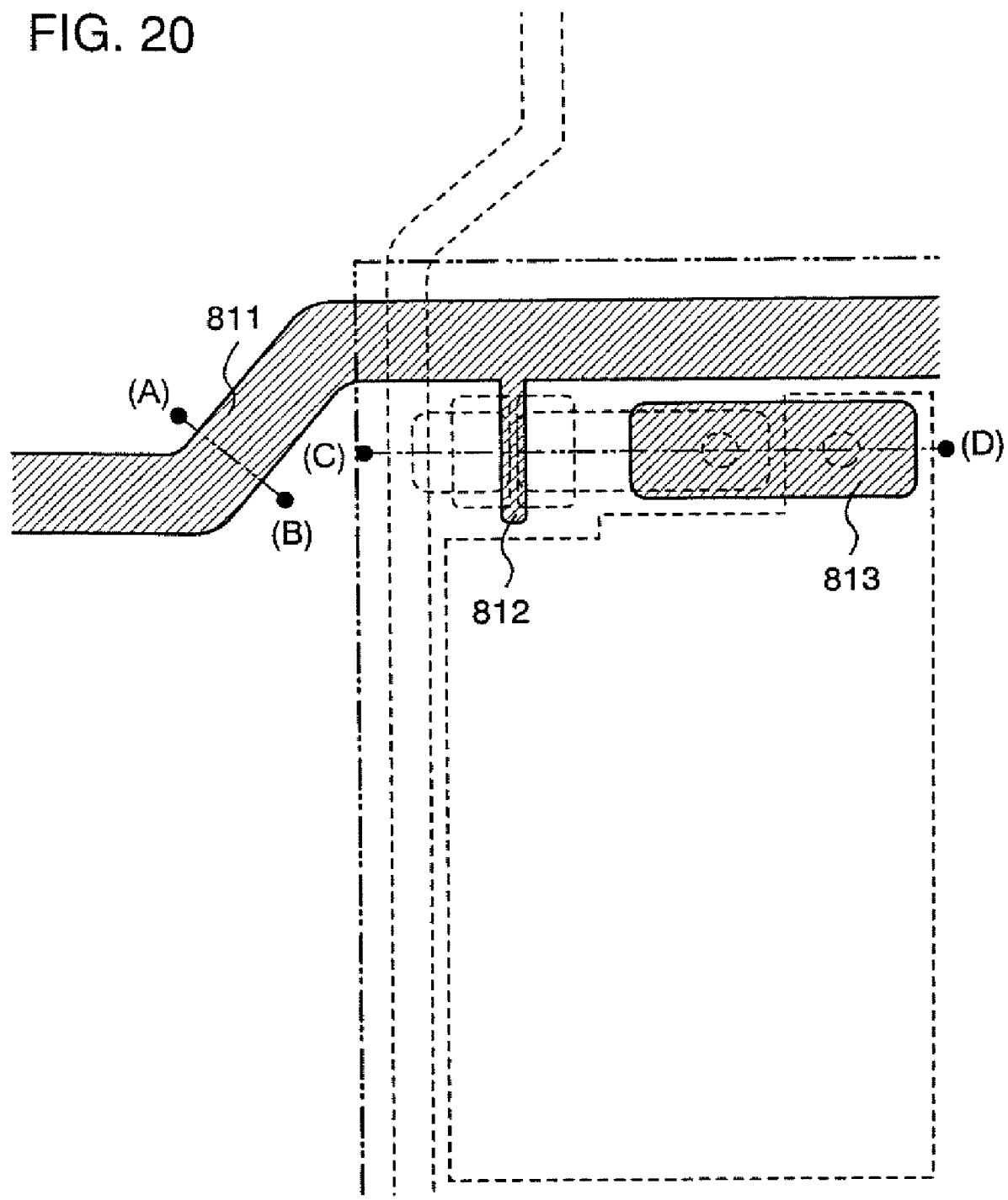
FIG. 20 is an explanatory top view of a manufacturing step of a semiconductor device according to a certain aspect of the present invention.

Next, as shown in FIG. 17C, part of the first conductive layer is etched by using the first mask pattern 805 and the second mask patterns 806 and 807 to form a gate wiring layer 811, a gate electrode layer 812 and a connection conductive layer 813. Thereafter, the first mask pattern 805 and the second mask patterns 806 and 807 are peeled by using a peeling solution. Note that FIG. 17C schematically shows a longitudinal sectional structure, and FIG. 20 shows a planar structure corresponding to lines A-B and C-D after removing the first and the second mask patterns, and the figure is to be referred to simultaneously.

Figure 17D:
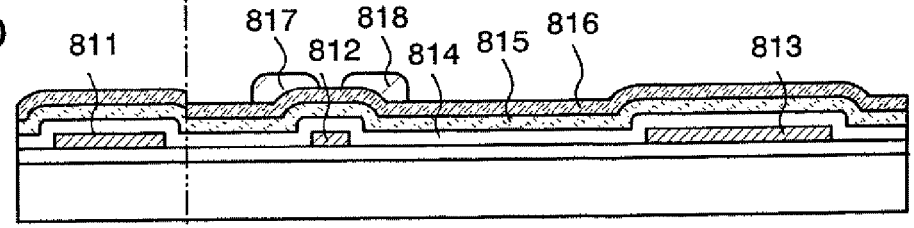

Next, as shown in FIG. 17D, a gate insulating film 814 is formed by a plasma CVD method. A silicon oxynitride film (H: 1.8%, N: 2.6%, O: 63.9% and Si: 31.7%) having a 110 nm film thickness is formed by a plasma CVD method using SiH$_4$ and N$_2$O (a flow rate of SiH$_4$:N$_2$O is equal to 1:200) in a chamber heated at 400° C. as the gate insulating film 814.

Next, a first semiconductor film 815 and a second semiconductor film 816 imparting n-type conductivity are formed. An amorphous silicon film having a 150 nm film thickness is formed by a plasma CVD method as the first semiconductor film 815. Then, an oxide film on the surface of the amorphous silicon film is removed. Thereafter, a semi-amorphous silicon film having a 50 nm film thickness is formed by using a silane gas and a phosphine gas as the second semiconductor film 816.

Next, third mask patterns 817 and 818 are formed over the second semiconductor film. Polyimide is discharged over the second semiconductor film by a droplet discharge method and is heated at 200° C. for 30 minutes to form the third mask patterns. The third mask patterns 817 and 818 are discharged over a region where first semiconductor regions are subsequently to be formed.

Figure 17E:
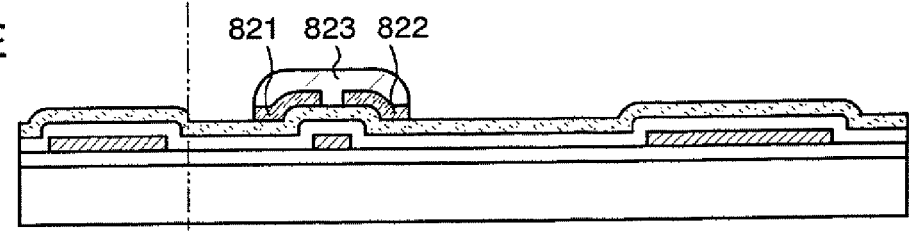

Next, as shown in FIG. 17D, the second semiconductor film 816 is etched by using the third mask patterns to form first semiconductor regions (source and drain regions, and a contact layer) 821 and 822 shown in FIG. 17E. The second semiconductor film is etched by using a mixed gas of which flow rate of CF$_4$:O$_2$ is equal to 10:9. Thereafter, the third mask patterns 817 and 818 are peeled by using a peeling solution.

Figure 17F:
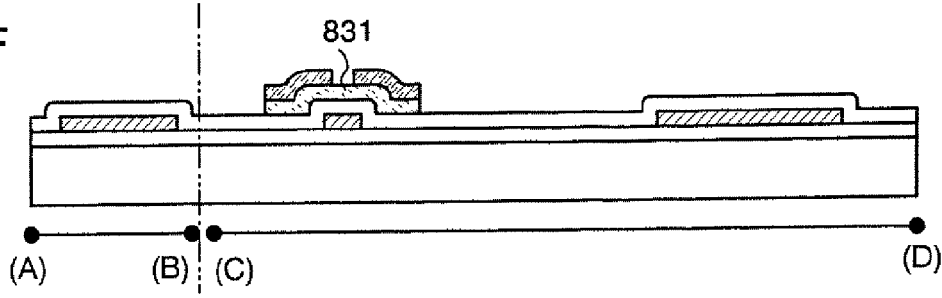
Figure 21:
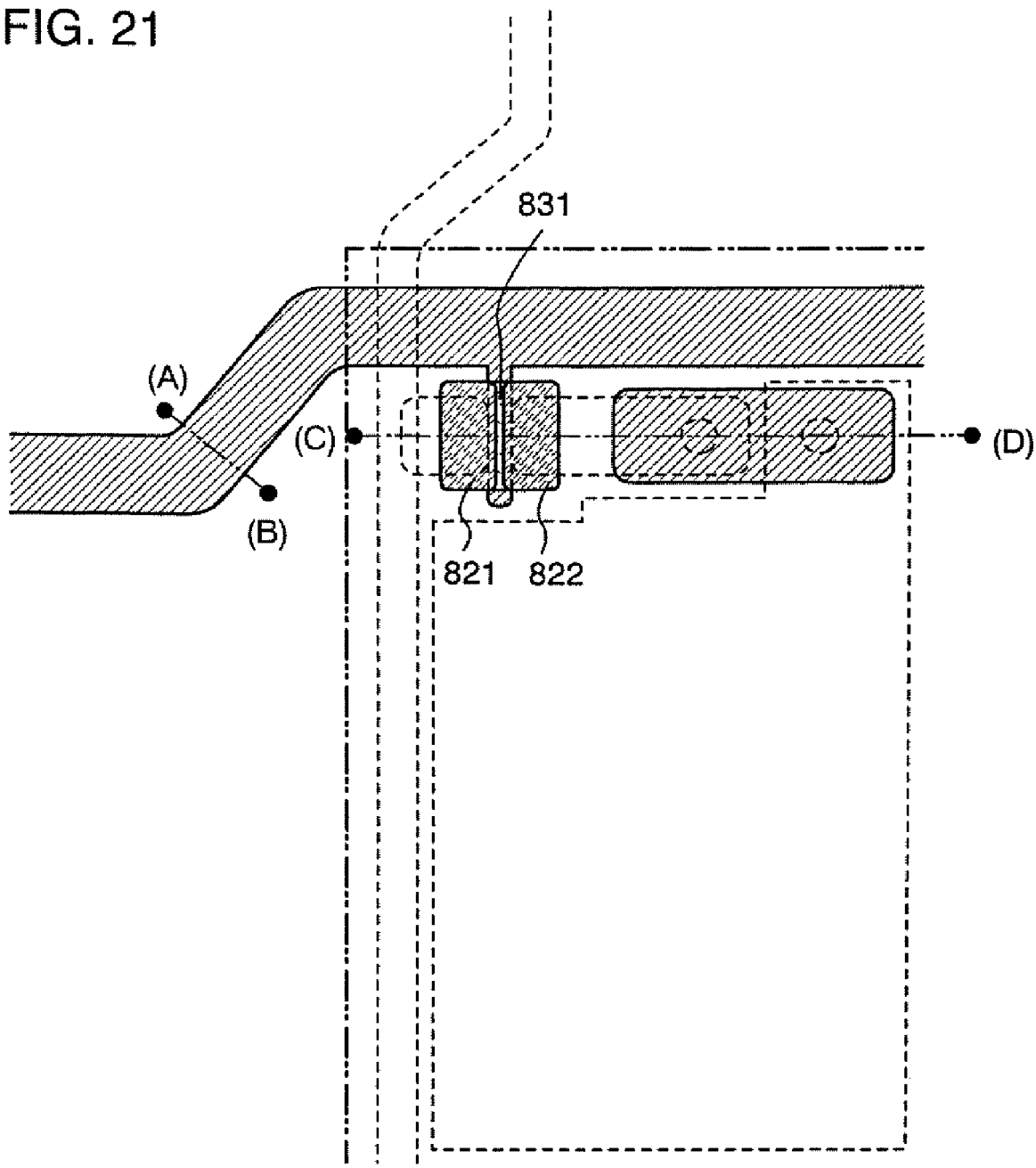
FIG. 21 is an explanatory top view of a manufacturing step of a semiconductor device according to a certain aspect of the present invention.

Next, a fourth mask pattern 823 covering the first semiconductor regions 821 and 822 and the first semiconductor film 815 therebetween is formed. The fourth mask pattern is formed using the same material and the same method as the third mask patterns. The first semiconductor film 815 is etched by using the fourth mask pattern to expose the gate insulating film 814 and to form a second semiconductor region 831 as shown in FIG. 17F. The first semiconductor film is etched by using a mixed gas of which flow rate of CF$_4$:O$_2$ is equal to 10:9, and then, ashing using oxygen is performed. Thereafter, the fourth mask pattern 823 is peeled by using a peeling solution. Note that FIG. 21 shows a planar structure corresponding to lines A-B and C-D of a longitudinal sectional structure in FIG. 17F.

Figure 18A:
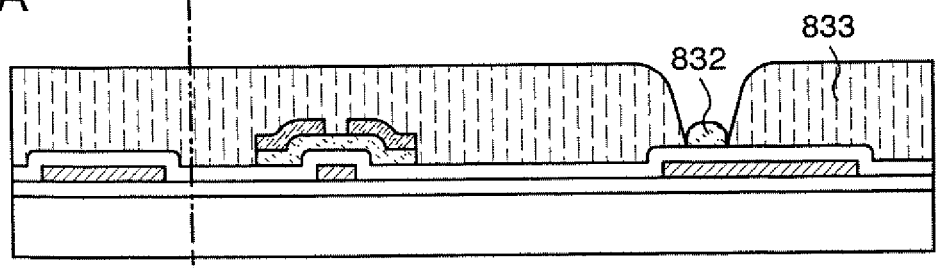
FIGS. 18A to 18E are explanatory cross-sectional views of a manufacturing step of a semiconductor device according to certain aspects of the present invention.
Figure 18B:
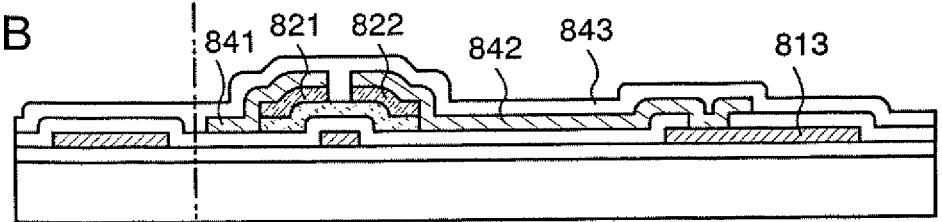

Next, as shown in FIG. 18A, a fifth mask pattern 832 is formed. A solution which forms a liquid-repellent surface is discharged by a droplet discharge method to a region where the gate insulating film 814 and the connection conductive layer 813 are superposed as the fifth mask pattern. Here, a solution of a fluorine-based silane coupling agent dissolved in a solvent is used as the solution which forms a liquid-repellent surface. The fifth mask pattern 832 is a protective film for forming a sixth mask pattern used to form a contact hole in a region where subsequent drain electrode and the connection conductive layer 813 are connected.

Next, a sixth mask pattern 833 is formed. The sixth mask pattern is a mask for forming a first contact hole, and polyimide is discharged by a droplet discharge method and heated at 200° C. for 30 minutes to form it. Since the fifth mask pattern 832 is liquid-repellent and the sixth mask pattern 833 is lyophilic at this time, the sixth mask pattern 833 is not formed in the region where the fifth mask pattern is formed.

As shown in FIG. 18A, the fifth mask pattern 832 is removed by oxygen ashing to expose part of the gate insulating film 814. Then, the exposed gate insulating film is etched by using a sixth mask pattern 833. The gate insulating film is etched by using $CHF_3$. Thereafter, the sixth mask pattern is peeled by oxygen ashing and etching using a peeling solution.

Figure 22:
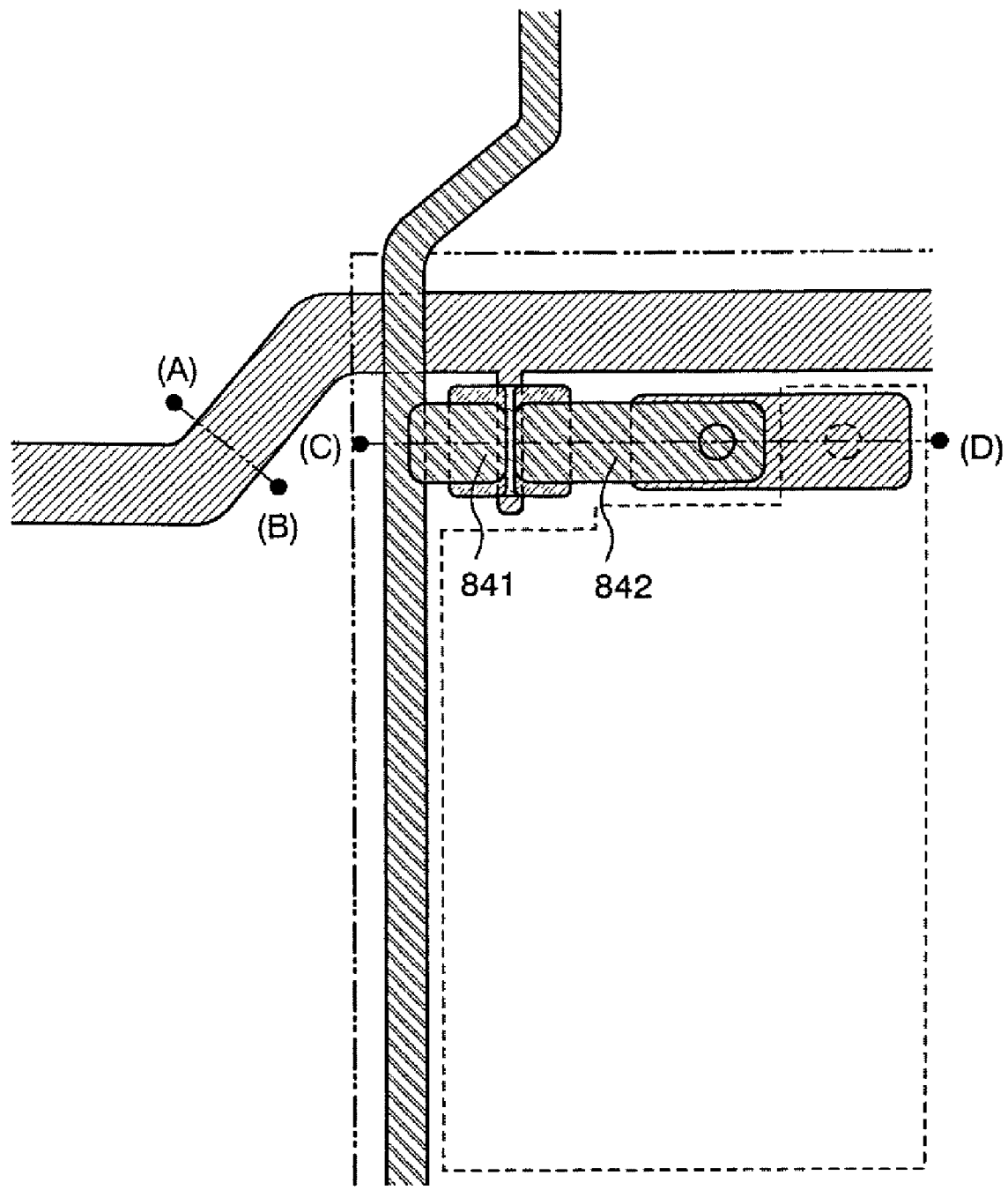
FIG. 22 is an explanatory top view of a manufacturing step of a semiconductor device according to a certain aspect of the present invention.

Next, second conductive layers 841 and 842 are formed by a droplet discharge method. The second conductive layers are to be subsequent source and drain wiring layers. The second conductive layer 841 is formed here so that it is connected to the first semiconductor region 821, and the second conductive layer 842 is formed so that it is connected to the first semiconductor region 822 and the connection conductive layer 813. After an Ag (silver) particles dispersed solution is discharged and dried at 100° C. for 30 minutes as the second conductive layers 841 and 842, the solution is to be baked by heating at 230° C. for an hour in an atmosphere of which oxygen density is 10%. Note that FIG. 22 shows a planar structure corresponding to lines A-B and C-D of a longitudinal sectional structure in FIG. 18B.

Next, a protective film 843 is formed. A silicon nitride film having a 100 nm film thickness is formed as the protective film by a sputtering method using a silicon target, and argon and nitrogen (a flow rate of $Ar:N_2$ is equal to 1:1) as a sputtering gas.

Figure 18C:
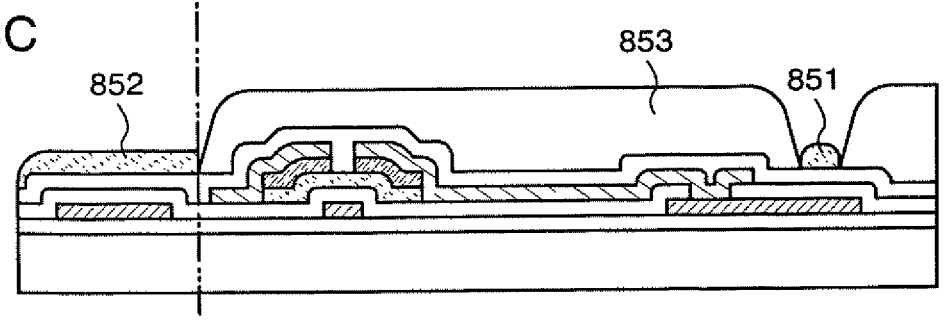

Next, as shown in FIG. 18C, an interlayer insulating film 853 is formed after forming seventh mask patterns 851 and 852 in a region where the protective film 843 and the connection conductive layer 813 are superposed and in a region where the gate and source wiring layers are connected to connection terminals. The seventh mask patterns are the masks for forming an interlayer insulating film which is subsequently to be formed. A solution which forms a liquid-repellent surface (a solution of a fluorine-based silane coupling agent dissolved in a solvent) is discharged as the seventh mask patterns, and polyimide is discharged by a droplet discharge method as the interlayer insulating film 853. Thereafter, both the seventh mask patterns 851 and 852 and the interlayer insulating film 853 are baked by heating at 200° C. for 30 minutes and heating at 300° C. for an hour.

Note that an inorganic material, a low dielectric constant (low-k) material, silicon oxide, silicon nitride, silicon oxynitride, PSG (phosphorus glass), BPSG (phosphorus boron glass), alumina film or the like can be used in addition to heat-resistant organic resin such as polyimide, acrylic or polyamide, or siloxane as the material of the interlayer insulating film 853.

Figure 18D:
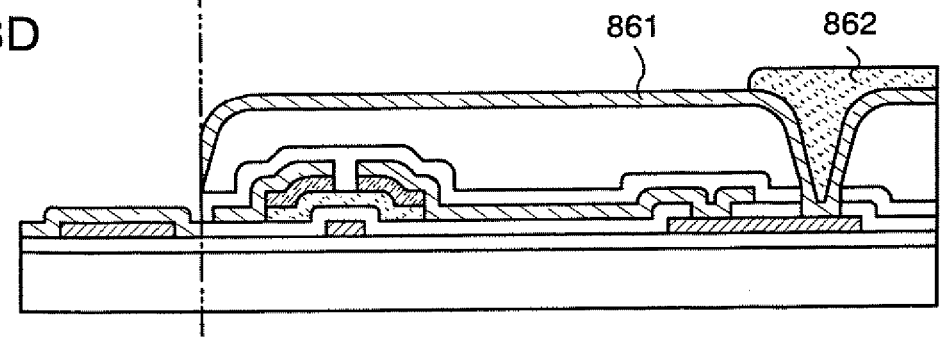
Figure 18E:
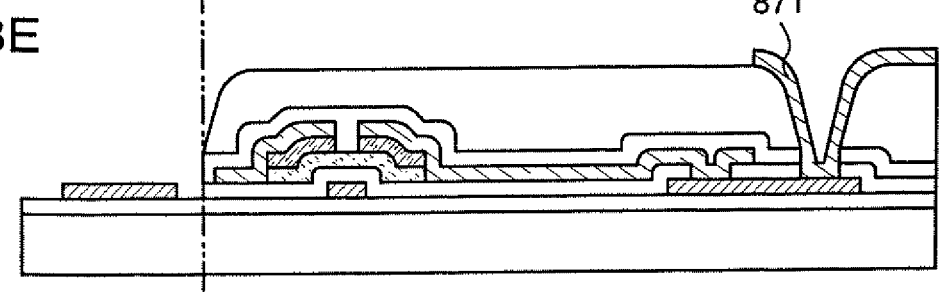

Next, as shown in FIG. 18D, the seventh mask patterns 851 and 852 are etched by using a mixed gas of $CF_4$, $O_2$, and He (a flow rate of $CF_4:O_2:He$ is equal to 8:12:7). Thereafter, parts of the protective film 843 and the gate insulating film 814 are etched to form a second contact hole. In this etching step, the protective film 843 and the gate insulating film 814 in the region where the gate and source wiring layers are connected to the connection terminals are also etched.

Next, an eighth mask pattern 862 is formed after a third conductive layer 861 is formed. Indium tin oxide (ITO) containing silicon oxide is formed to have a 110 nm film thickness as the third conductive layer, and polyimide which is the eighth mask pattern is dropped by a droplet discharge method to a region where a pixel electrode is subsequently to be formed to heat at 200° C. for 30 minutes.

In this embodiment, the third conductive layer 861 is formed from ITO containing silicon oxide to manufacture a transmission type liquid crystal display panel. However, instead of the ITO containing silicon oxide, the third conductive layer 861 may be formed by forming and baking a predetermined pattern using a solution containing indium tin oxide (ITO), zinc oxide (ZnO), indium zinc oxide (IZO), zinc oxide (GZO) added with gallium, indium tin oxide containing silicon oxide or the like. On the other hand, in the case of manufacturing a reflection type liquid crystal display panel, a solution mainly containing metal particles such as Ag (silver), Au (metal), Cu (copper), W (tungsten) or Al (aluminum) can be used.

Figure 23:
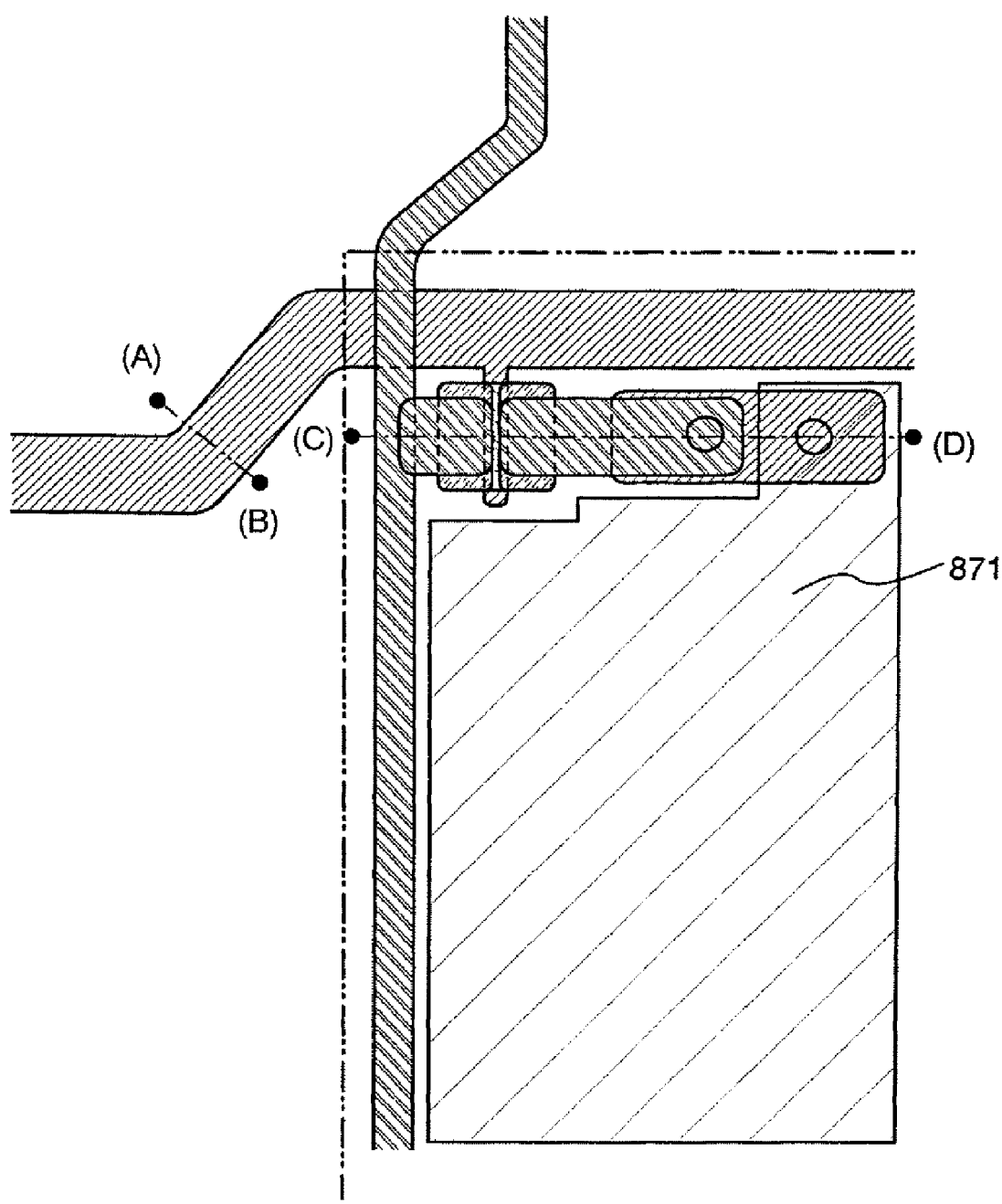
FIG. 23 is an explanatory top view of a manufacturing step of a semiconductor device according to a certain aspect of the present invention.

Then, a first pixel electrode 871 is formed using the eighth mask pattern by etching the third conductive layer. In this etching step, the third conductive layer formed in the region where the gate and source wiring layers are connected to the connection terminals is also etched. Thereafter, the seventh mask pattern is peeled by using a peeling solution. Note that FIG. 23 shows a planar view corresponding to lines A-B and C-D in FIG. 18E.

The first pixel electrode 871 is connected to the connection conductive layer 813 in the second contact hole. Since the connection conductive layer 813 is connected to the conductive layer 842 functioning as a drain wiring layer, the first pixel electrode 871 and the conductive layer 842 functioning as a drain wiring layer are electrically connected. In this embodiment, although the conductive layer 842 functioning as a drain wiring layer is formed from silver (Ag) and the first pixel electrode 878 is formed from ITO containing silicon oxide, the silver is not oxidized since the drain wiring layer and the first pixel electrode are not directly connected. Therefore, the drain wiring layer and the pixel electrode can be electrically connected without increasing the contact resistance.

Alternatively, the pixel electrode can be formed without an etching step by selectively dropping a solution containing a conductive material by a droplet discharge method as another method for forming the pixel electrode. Furthermore, after forming a solution, which forms a liquid-repellent surface, in a region where the pixel electrode is not subsequently to be formed as a mask pattern, the pixel electrode can be formed by discharging a conductive solution. In this case, the mask pattern can be removed by ashing using oxygen. Alternatively, the mask pattern may be left over without removing it.

Through the steps mentioned above, an active matrix substrate can be formed.

Figure 19A:
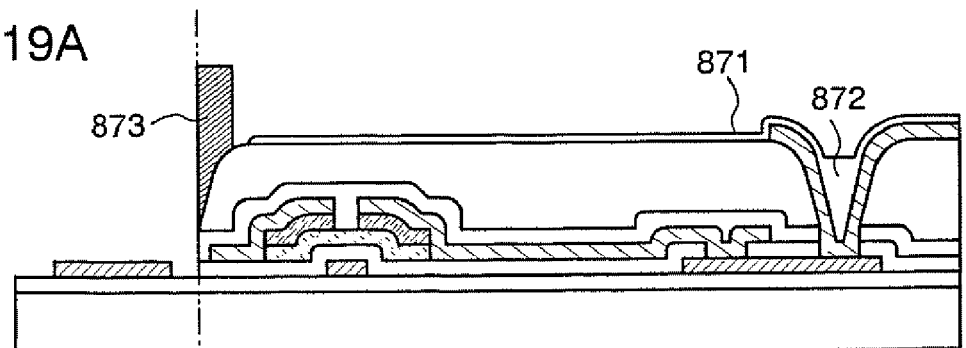
FIGS. 19A to 19C are explanatory cross-sectional views of a manufacturing step of a semiconductor device according to certain aspects of the present invention.

Next, as shown in FIG. 19A, an insulating film is formed by a printing method or a spin-coating method to cover the first pixel electrode 871, and an alignment film 872 is formed by rubbing. Note that the alignment film 872 can also be formed by an oblique evaporation method.

Then, a sealant 873 having a closed-loop shape is formed by a droplet discharge method in a periphery region where a pixel is formed. A liquid crystal material is dropped inside the closed loop formed with the sealant 873 by a dispenser method (drop method).

Figure 25A:
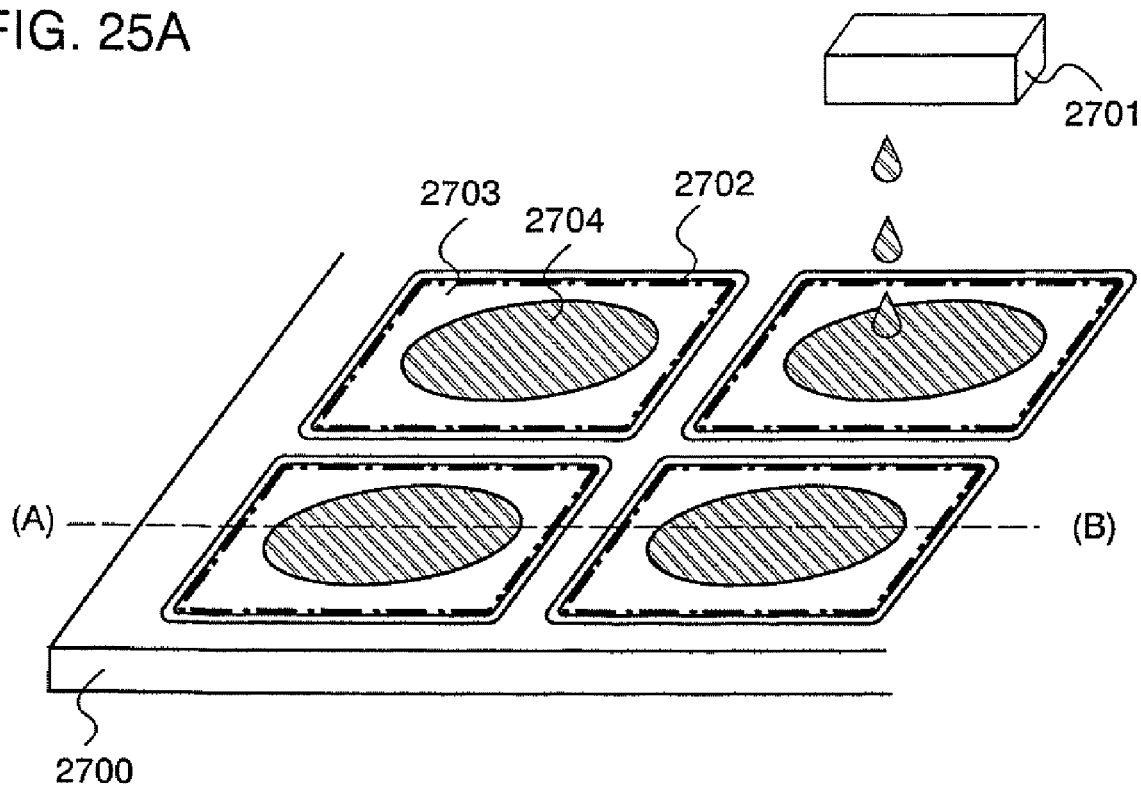
FIGS. 25A and 25B are an explanatory perspective view and cross-sectional view of a method for dropping a liquid crystal which can be applied to certain aspects of the present invention.
Figure 25B:
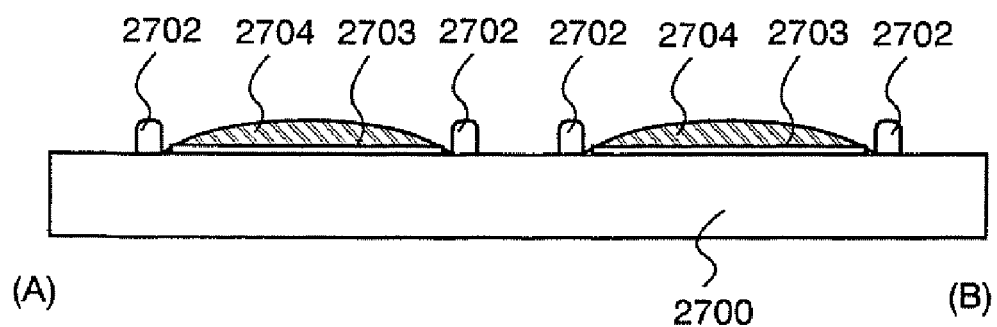

A step of dropping the liquid-crystal material is shown here with reference to FIGS. 25A and 25B. FIG. 25A is a perspective view showing the step of dropping the liquid crystal material by a dispenser 2701, and FIG. 25B is a cross-sectional view taken along a line A-B in FIG. 25A.

A liquid crystal material 2704 is dropped or discharged from the dispenser 2701 to cover a pixel portion 2703 surrounded by a sealant 2702. A liquid crystal layer can be formed either by moving the dispenser 2701 or by fixing the dispenser 2701 and moving a substrate 2700. Alternatively, the liquid crystal material may be dropped at once by providing a plurality of dispensers 2701.

In addition, the liquid crystal material is dropped in the pixel portion. However, the liquid crystal material may be dropped on the side of a counter substrate, and then, a substrate having the pixel portion may be attached thereto.

As shown in FIG. 25B, the liquid crystal material 2704 can be selectively dropped or discharged to a region surrounded by the sealant 2702.

Figure 19B:
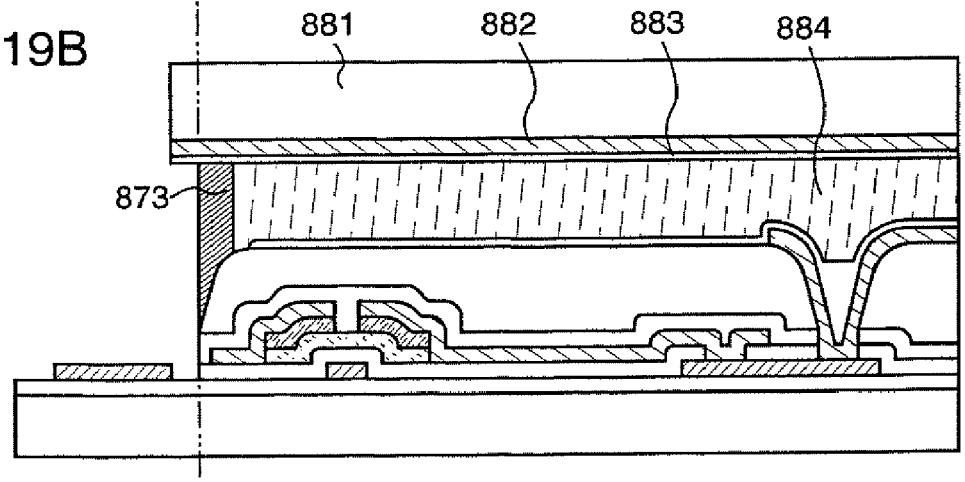

Next, as shown in FIG. 19B, in a vacuum, a liquid crystal layer 884 filled with the liquid crystal material is formed by attaching the substrate 800 to a counter substrate 881 provided with an alignment film 883 and a second pixel electrode (counter electrode) 882 and by performing ultraviolet curing.

The sealant 873 may be mixed with a filler, and further, a color filter, a shielding film (black matrix) or the like may be formed in the counter substrate 881. In addition, a dipping method (pipe method) injecting the liquid crystal material by using a capillary phenomenon after attaching the counter substrate can be used instead of the dispenser method (drop method) as a method for forming the liquid crystal layer 884.

Figure 19C:
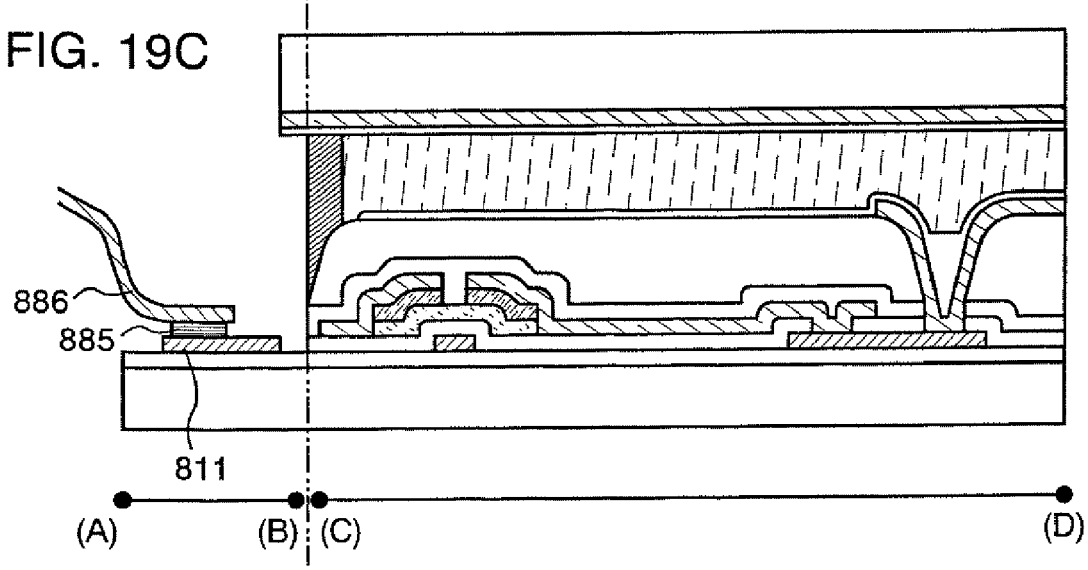

Next, as shown in FIG. 19C, when an insulating film is formed over each end portion of the gate wiring layer 811 and the source wiring layer (not shown), a connection terminal 886 (a connection terminal connected to the gate wiring layer. A connection terminal connected to the source wiring layer is not shown) is attached with an anisotropic conductive layer 885 therebetween after the insulating film is removed. Furthermore, it is preferable to seal connection portions of each wiring layer and connection terminal with the sealing resin. This structure can prevent moisture generated from a cross-sectional portion from penetrating and deteriorating the pixel portion.

Through the steps mentioned above, a liquid crystal display panel can be manufactured. Note that a protective circuit, typically a diode or the like may be used between the connection terminal and the source wiring (gate wiring) or in the pixel portion in order to prevent electrostatic discharge damage. In this case, the electrostatic discharge damage can be prevented by manufacturing in the same step as the above TFT and by connecting the gate wiring layer of the pixel portion to the drain or source wiring layer of the diode.

Note that any of Embodiment Mode 1 to Embodiment Mode 9 can be applied to this embodiment.

Embodiment 2

In this embodiment, a method for manufacturing a light-emitting display panel as a display panel is described with reference to FIGS. 27A to 27C, FIGS. 28A to 28C, FIGS. 29A to 29C, FIGS. 30A and 30B and FIGS. 31 to 34. FIGS. 27A to 27C, FIGS. 28A to 28C, FIGS. 29A to 29C and FIGS. 30A and 30B schematically show longitudinal sectional structures of a pixel portion and a connection terminal, and FIGS. 31 to 34 show planar structures corresponding to lines A-B and C-D. In this embodiment, Embodiment Mode 1 is used to explain a step of manufacturing a gate electrode layer.

Figure 27A:
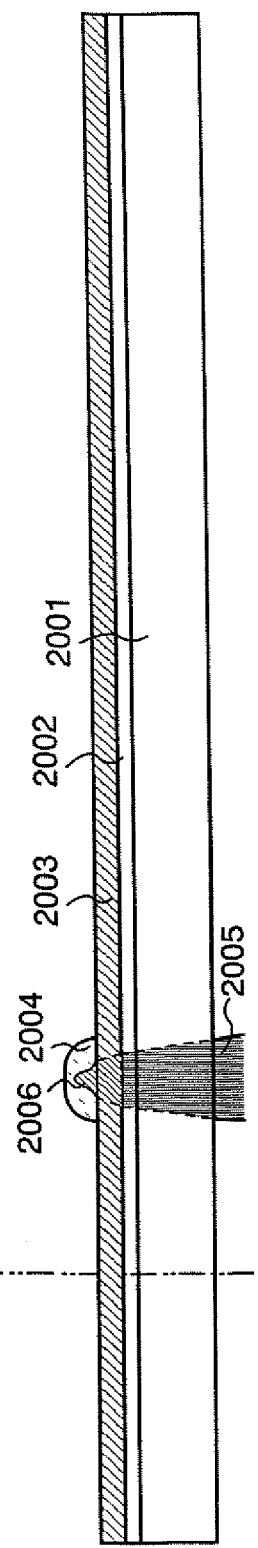
FIGS. 27A to 27C are explanatory cross-sectional views of a manufacturing step of a semiconductor device according to certain aspects of the present invention.
Figure 27B:
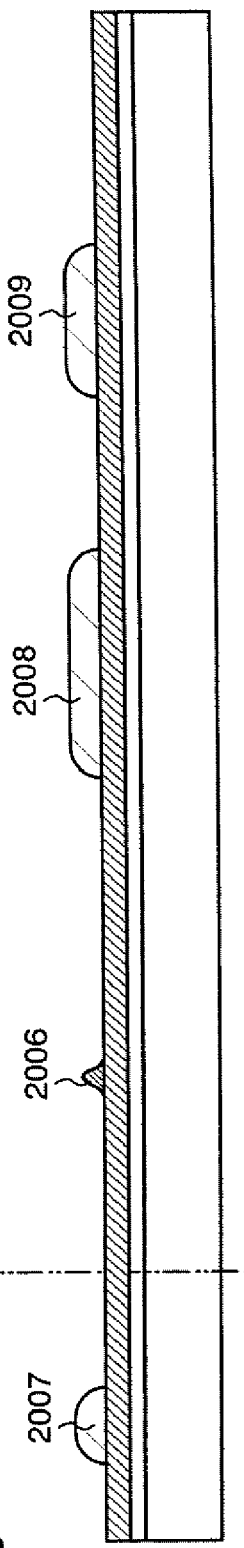

As shown in FIG. 27A, as well as in Embodiment 1, a surface of a substrate 2001 is oxidized at 400° C. to form an insulating film 2002 having a 100 nm film thickness. Then, a first conductive layer 2003 is formed over the insulating film in order to discharge a thermosetting material 2004 over the first conductive layer by a droplet discharge method in a region where a gate electrode layer is subsequently to be formed. An AN 100 glass substrate manufactured by Asahi Glass Co., Ltd. is used as the substrate 2001, a tungsten film having a 100 nm film thickness is formed by a sputtering method as the first conductive layer, and polyimide is used as the thermosetting material.

Next, the first conductive layer 2003 is irradiated with laser light 2005 from beneath the substrate 2001. Laser light emitted from an Nd:YVO$_4$ laser is used here as the laser light. Consequently, part of the thermosetting material is cured to form a first mask pattern 2006. Thereafter, the thermosetting material is removed by using a peeling solution. Since the first conductive layer and the thermosetting material are locally heated here by using a region where the light intensity is high due to the beam of the laser light, a minute mask pattern can be formed.

Next, second mask patterns 2007 to 2009 are formed. The second mask patterns are formed by using the same material as second mask patterns of Embodiment 1. The second mask patterns are discharged to regions where a gate wiring layer, a gate electrode layer and a connection conductive layer are subsequently to be formed.

Figure 27C:
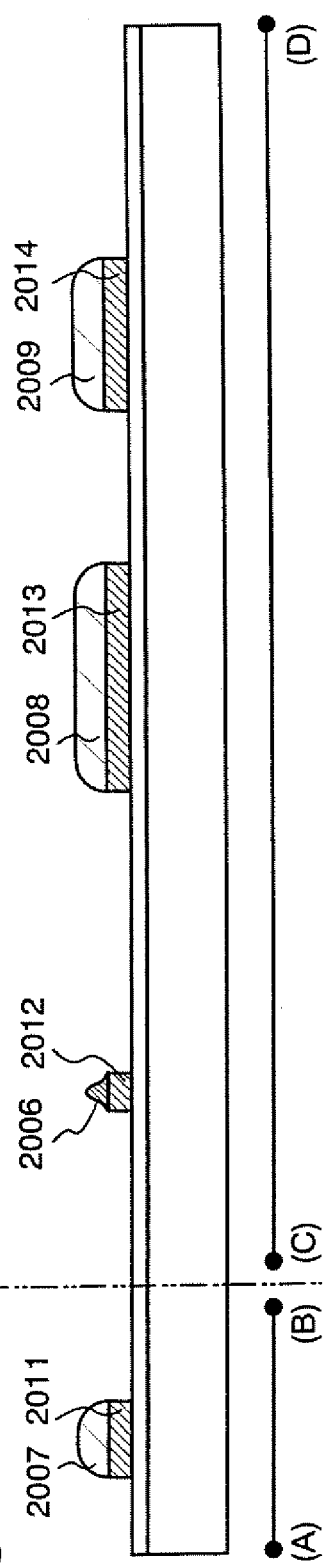
Figure 31:
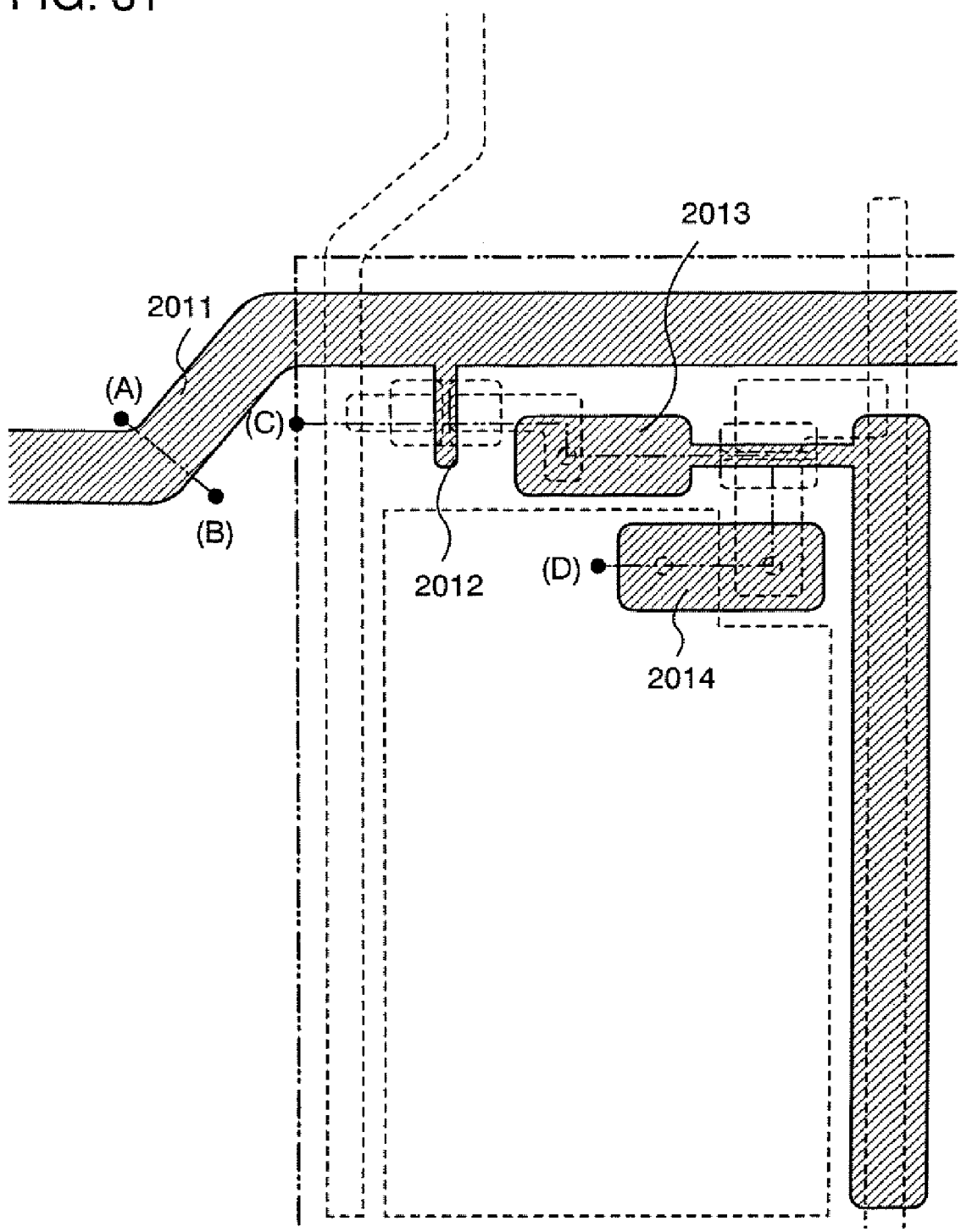
FIG. 31 is an explanatory top view of a manufacturing step of a semiconductor device according to a certain aspect of the present invention.

Next, part of the first conductive layer is etched by using the first mask pattern and the second mask patterns 2007 to 2009 to form a gate wiring layer 2011, gate electrode layers 2012 and 2013 and a connection conductive layer 2014. Thereafter, the first and second mask patterns 2007 to 2009 are peeled by using a peeling solution. Note that FIG. 27C schematically shows a longitudinal sectional structure, and FIG. 31 shows a planar structure corresponding to lines A-B and C-D, and the figure is to be referred to simultaneously.

Next, as shown in FIG. 28A, as well as in Embodiment 1, a gate insulating film 2021, a first semiconductor film 2022 and a second semiconductor film 2023 imparting n-type conductivity are formed by a plasma CVD method. Third mask patterns 2024 to 2026 are formed over the second semiconductor film over the region where subsequent first and third semiconductor regions are formed. The third mask patterns can be formed in the same manner as third mask patterns 817 and 818 of Embodiment 1.

As shown in FIG. 28B, as well as in Embodiment 1, the second semiconductor film 2023 is etched by using each of the third mask patterns to form first semiconductor regions 2031 to 2033. Thereafter, the third mask patterns are peeled by using a peeling solution.

Figure 32:
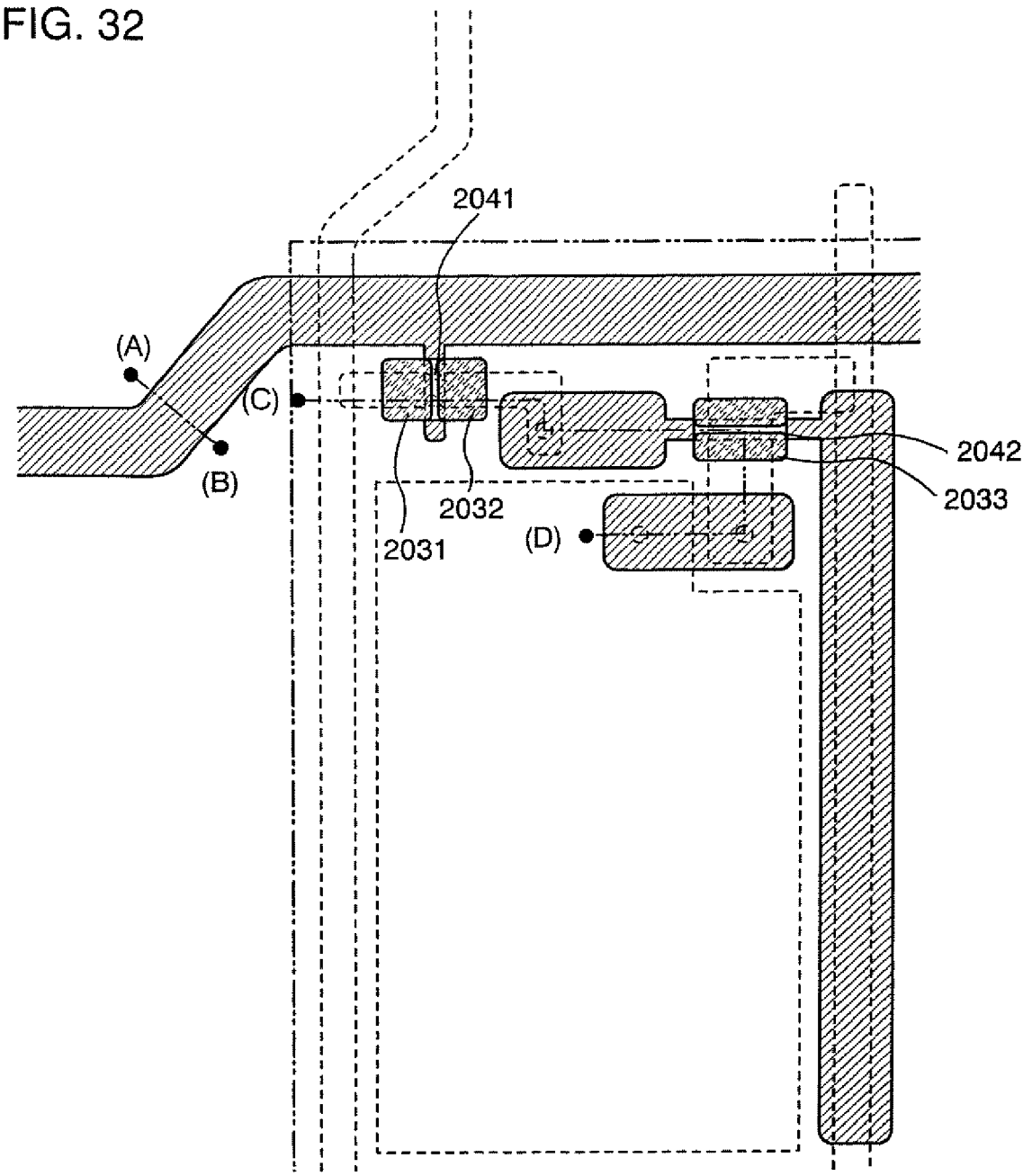
FIG. 32 is an explanatory top view of a manufacturing step of a semiconductor device according to a certain aspect of the present invention.

Next, fourth mask patterns 2034 and 2035 covering the first semiconductor regions 2031 to 2033 and the first semiconductor film 2022 formed therebetween are formed. Then, the first semiconductor film 2022 is etched by using the fourth mask patterns to form second semiconductor regions 2041 and 2042 and to expose the gate insulating film 2021 as shown in FIG. 28C. Thereafter, the fourth mask patterns 2034 and 2035 are peeled by using a peeling solution. Note that FIG. 32 shows a planar structure corresponding to lines A-B and C-D of a longitudinal sectional structure at this time, and the figure is to be referred to simultaneously.

Next, as well as in Embodiment 1, fifth mask patterns 2043 and 2044 are formed. A solution which forms a liquid-repellent surface is discharged as the fifth mask patterns by a droplet discharge method to a region where the gate insulating film 2021 and the gate electrode layer 2013, and the insulating film 2021 and the connection conductive layer 2014 are each superposed. Then, a sixth mask pattern 2045 is formed. The sixth mask pattern is a mask for forming a first contact hole, and polyimide is discharged by a droplet discharge method and heated at 200° C. for 30 minutes to form it. Since the fifth mask patterns 2043 and 2044 are liquid-repellent and the sixth mask pattern 2045 is lyophilic at this time, the sixth mask pattern 2045 is not formed in the region where the fifth mask patterns are formed.

As shown in FIG. 29A, the fifth mask patterns 2043 and 2044 are removed by oxygen ashing to expose part of the gate insulating film 2021. Then, the exposed gate insulating film is etched as well as in Embodiment 1 by using the sixth mask pattern 2045. Thereafter, the sixth mask pattern is peeled by oxygen ashing and etching using a peeling solution.

Figure 33:
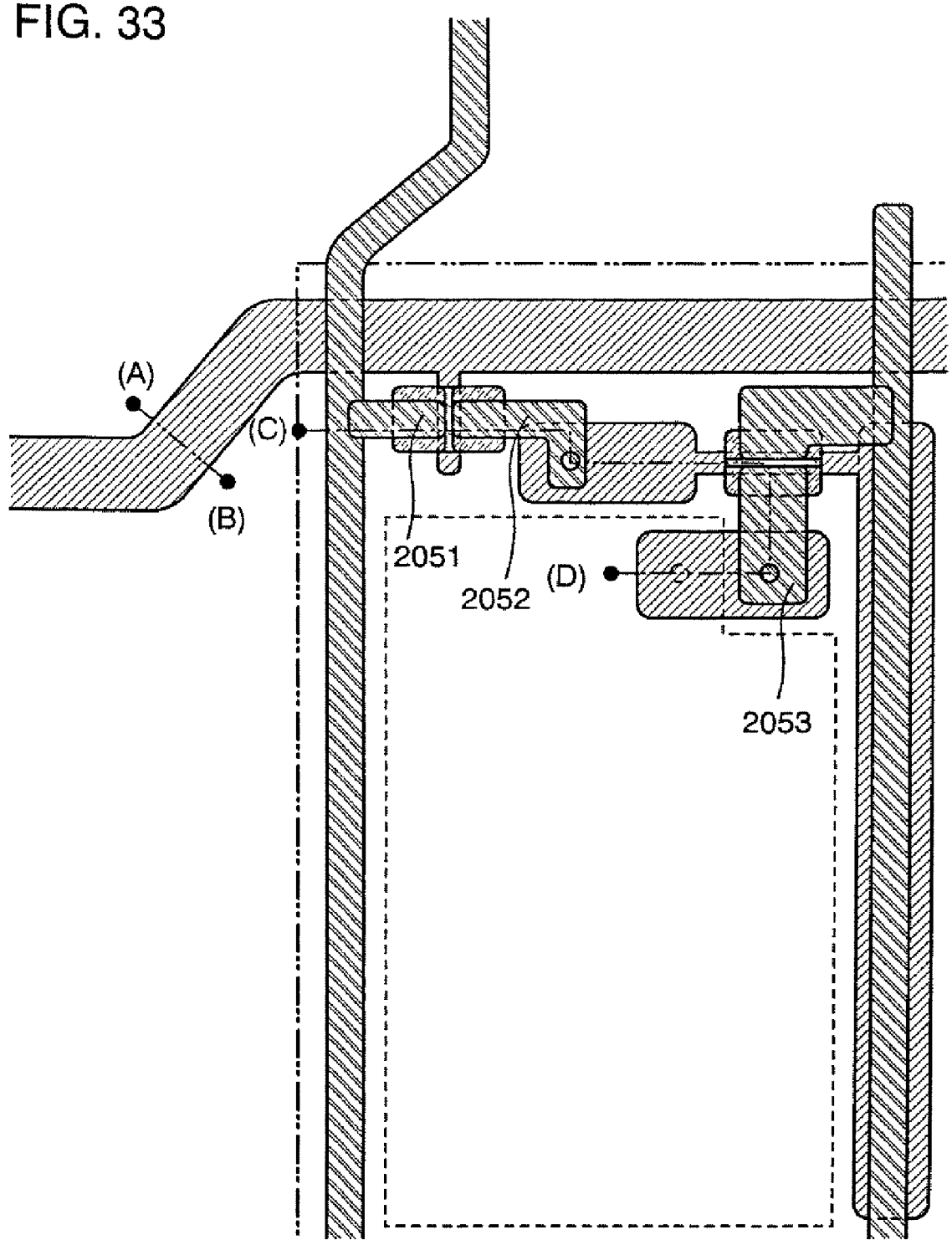
FIG. 33 is an explanatory top view of a manufacturing step of a semiconductor device according to a certain aspect of the present invention.

Next, second conductive layers 2051 to 2053 are formed by a droplet discharge method. The second conductive layers are to be subsequent source and drain wiring layers. The second conductive layer 2051 is formed here to be connected to the first semiconductor region 2031, the second conductive layer 2052 is formed to connect the first semiconductor region 2032 to the gate electrode layer 2013, and the second conductive layer 2053 is formed to connect the first semiconductor region 2033 to the connection conductive layer 2014. Note that FIG. 33 shows a plan view corresponding to lines A-B and C-D in FIG. 29A.

Next, as shown in FIG. 29B, a protective film 2061 is formed as well as in Embodiment 1. An interlayer insulating film 2064 is formed after seventh mask patterns 2062 and 2063 are formed in a region where the protective film 2061 and the connection conductive layer 2014 are superposed and regions where the gate wiring 2011 and source wiring layers are connected to connection terminals. A solution which forms a liquid-repellent surface, a solution of a fluorine-based silane coupling agent dissolved in a solvent is used here, is discharged as the seventh mask patterns. Among a compound made from silicon, oxygen, and hydrogen formed from a siloxane-based material as a start material by a droplet discharge method, an insulating material of inorganic siloxane containing Si—O—Si bond or organic siloxane in which hydrogen combined with silicon is substituted by an organic group such as methyl or phenyl is discharged as the interlayer insulating film. Thereafter, both the seventh mask patterns 2062 and 2063, and the interlayer insulating film 2064 are baked by heating at 200° C. for 30 minutes and at 300° C. for an hour.

Next, as shown in FIG. 29C, part of the protective film 2061 and the gate insulating film 2021 are etched after etching the seventh mask patterns 2062 and 2063 as well as in Embodiment 1 to form a second contact hole. In this etching step, the protective film 2061 and the gate insulating film 2021 in regions where the gate and source wiring layers are connected to the connection terminals are also etched.

Next, an eighth mask pattern is formed after forming a third conductive layer connected to the connection conductive layer 2014. As well as in Embodiment 1, indium tin oxide (ITO) containing silicon oxide having a 110 nm film thickness is formed and etched in a desired shape to form a first pixel electrode 2071 as the third conductive layer. In this etching step, the third conductive layer formed in the regions where the gate and source wiring layers are connected to the connection terminals may also be etched.

Alternatively, the pixel electrode can be formed without an etching step by selectively dropping a solution containing a conductive material, using a droplet discharge method, as another method for forming the pixel electrode. Furthermore, after forming a solution, which forms a liquid-repellent surface, as a mask pattern in a region where the pixel electrode is not subsequently to be formed, the pixel electrode can be formed by discharging a conductive solution. In this case, the mask pattern can be removed by ashing using oxygen. Alternatively, the mask pattern may be left over without removing it.

Alternatively, instead thereof indium tin oxide (ITO), zinc oxide (ZnO), indium zinc oxide (IZO), zinc oxide (GZO) added with gallium or indium tin oxide containing silicon oxide may be used as the material of the pixel electrode.

Since this embodiment relates to the structure in which light is emitted in the direction of the substrate 2001, in other words, the transmission type light-emitting display panel, the pixel electrode is formed from the light-transmitting conducive film. On the other hand, in the case of a structure in which light is emitted in the opposite direction of the substrate 2001, in other words, manufacturing a reflection type light-emitting display panel, a solution mainly containing metal particles such as Ag (silver), Au (metal), Cu (copper), W (tungsten) or Al (aluminum) can be used. In this case, the interlayer insulating film can be formed from an insulating film containing a color pigment, resist or the like. In this case, since the interlayer insulating film functions as a shielding film, the contrast of a display device, which is subsequently to be formed, is enhanced.

Figure 34:
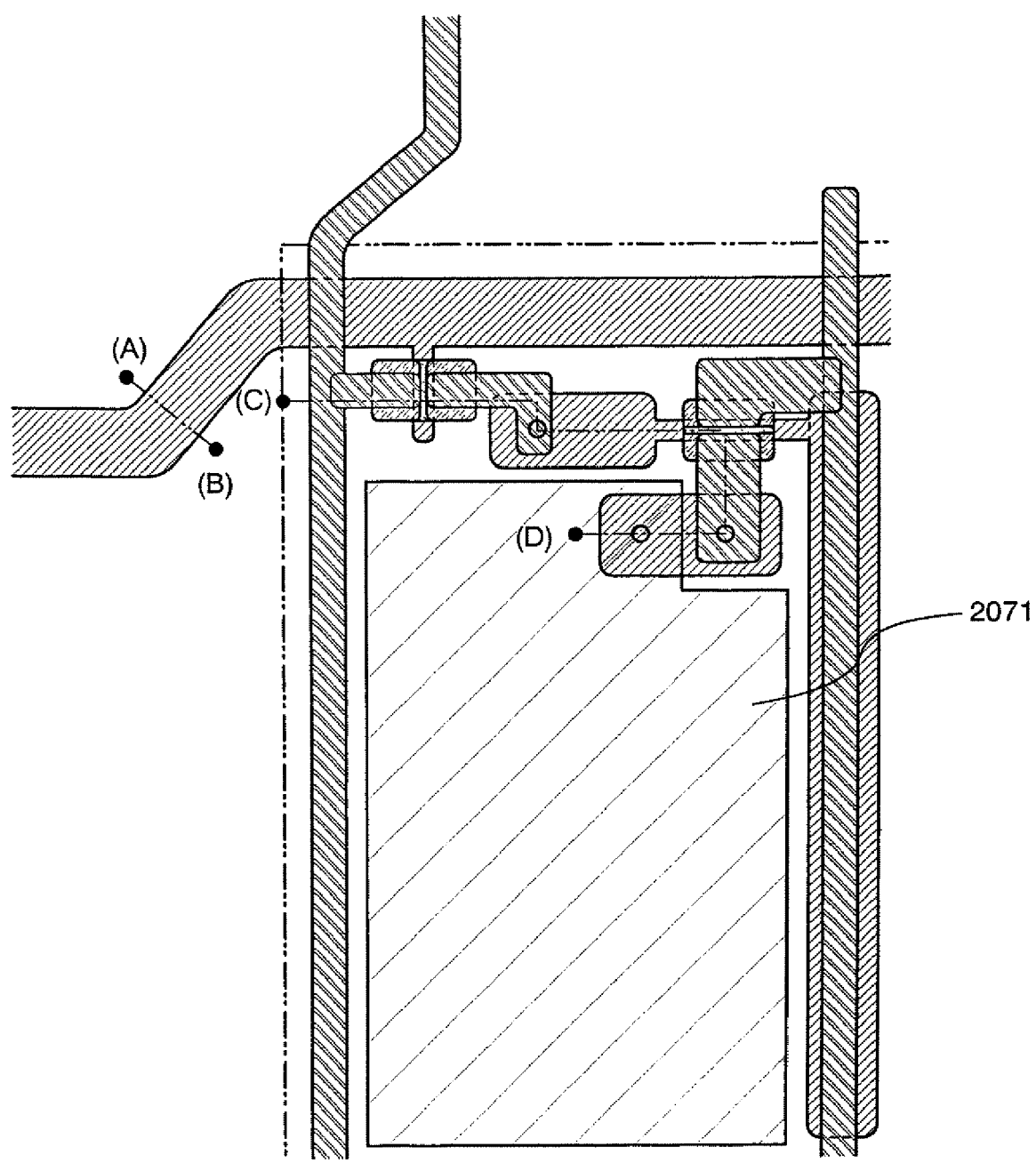
FIG. 34 is an explanatory top view of a manufacturing step of a semiconductor device according to a certain aspect of the present invention.

Thereafter, the eighth mask pattern is peeled by using a peeling solution. Note that FIG. 34 shows a planar view corresponding to lines A-B and C-D in FIG. 29C.

The first pixel electrode 2071 is connected to the connection conductive layer 2014 in the second contact hole. Since the connection conductive layer 2014 is connected to the conductive layer 2053 which functions as a drain wiring layer, the first pixel electrode 2071 and the conductive layer 2053 which functions as a drain wiring layer are electrically connected. In this embodiment, although the conductive layer 2053 which functions as a drain wiring layer is formed from silver (Ag) and the first pixel electrode 2071 is formed from ITO containing silicon oxide, the silver is not oxidized since the drain wiring layer and the pixel electrode are not directly connected. Therefore, the both the drain wiring layer and the pixel electrode can be electrically connected without increasing the contact resistance.

Through the steps mentioned above, an active matrix substrate having a switching TFT 2070a and a driving TFT 2070b can be formed.

Next, a protective layer of silicon nitride or silicon nitride oxide and an insulating layer 2072 are formed over the entire surface. Then, after forming the insulating layer over the entire surface by a spin-coating method or a dipping method, an opening is formed by an etching process as shown in FIG. 30A. This etching is processed to expose the first pixel electrode 2071 by etching simultaneously with the protective layer by using the insulating layer 2072 as a mask. In addition, when the insulating layer 2072 is formed by a droplet discharge method, the etching process is not necessarily needed.

The insulating layer 2072 is formed providing an opening having a through hole in accordance with a position where a pixel is formed corresponding to the first pixel electrode 2071. This insulating layer 2072 can be formed from an inorganic insulating material such as silicon oxide, silicon nitride, silicon oxynitride, aluminum oxide, aluminum nitride or aluminum oxynitride; acrylic acid, methacrylic acid and a derivative thereof; a high molecular weight material which is heat resistant such as polyimide, aromatic polyamide or polybenzimidazole; an inorganic siloxane insulating material including a Si—O—Si bond, among the compound made from silicon, oxygen, and hydrogen, formed by using a siloxane-based material as a start material; or an organic siloxane insulating material in which hydrogen combined with silicon is substituted by an organic group such as methyl or phenyl. Since the edge thereof has a shape in which a curvature radius changes continuously and a thin film in the upper layer is formed without a step disconnection, it is preferable to form the insulating layer 2072 from a photosensitive material or a non-photosensitive material such as acrylic or polyimide.

Next, after forming a light-emitting substance containing layer 2073 by an application method such as a spin-coating method or ink-jet, a second pixel electrode 2074 is formed and then a light-emitting element 2075 is formed. The light-emitting element 2075 is connected to the driving TFT 2070*b* in its structure. Thereafter, a protective laminated layer is formed to seal the light-emitting element 2075. The protective laminated layer includes lamination of a first inorganic insulating film, a stress relaxation film and a second inorganic insulating film.

Note that, before forming the light-emitting substance containing layer 2073, moisture adsorbed in the insulating layer 2072 or on the surface thereof is to be removed at a heat treatment of 200° C. in an atmospheric pressure. In addition, it is preferable to perform heat treatment at temperatures from 200° C. to 400° C., preferably temperatures from 250° C. to 350° C. under a reduced pressure to form the light-emitting substance containing layer 2073 by a vacuum evaporation method or a droplet discharge method under a reduced pressure without exposing it to an atmosphere.

Additionally, surface treatment may be added by exposing the surface of the first pixel electrode 2071 to oxygen plasma or irradiating the surface thereof with ultraviolet radiation light.

The light-emitting substance containing layer 2073 is formed from a charge injection transport substance and a light-emitting material containing an organic compound or an inorganic compound. The light-emitting substance containing layer 2073 includes one or a plurality of layers selected from a low molecular weight organic compound, a middle molecular weight organic compound typified by oligomer, dendrimer or the like, and a high molecular weight organic compound. Alternatively, an inorganic compound having electron injection transportability or hole injection transportability may be combined.

The following metal complex or the like having a quinoline skeleton or a benzoquinoline skeleton can be given particularly as an example of a substance having high electron transportability among the charge injection transport substance: tris(8-quinolinolato)aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato)aluminum (abbreviated as BAlq) or the like.

In addition, the following aromatic amine-based compound (that is, a compound having a benzene ring-nitrogen bond) can be given as an example of a substance having high hole transportability: 4,4'-bis[N-(1-naphthyl)-N-phenyl-amino]-biphenyl (abbreviated as α-NPD), 4,4'-tris[N-(3-methylphenyl)-N-phenyl-amino]biphenyl (abbreviated as TPD), 4,4',4"-tris(N,N-diphenyl-amino)-triphenylamine (abbreviated as TDATA), 4,4',4"-tris[N-(3-methylphenyl)-N-phenyl-amino]-triphenylamine (abbreviated as MTDATA) or the like.

In addition, a compound of alkaline metal or alkaline earth metal such as lithium fluoride (LiF), cesium fluoride (CsF) or calcium fluoride ($CaF_2$) can be given particularly as an example of a substance having high electron injectability among the charge injection transport substance. Additionally, a mixture of a substance having high electron transportability such as $Alq_3$ and an alkaline earth metal such as magnesium (Mg) may also be applied.

The following metal oxide can be given as an example of a substance having high hole injectability among the charge injection transport substance: molybdenum oxide ($MoO_x$), vanadium oxide ($VO_x$), ruthenium oxide ($RuO_x$), tungsten oxide ($WO_x$), manganese oxide ($MnO_x$) or the like. Additionally, a phthalocyanine-based compound such as phthalocyanine (abbreviated as $H_2Pc$) or copper phthalocyanine (CuPc) can be given as an example.

A light-emitting layer may have a structure performing a color display by forming a light-emitting layer having different emission wavelength ranges per pixel. Typically, a light-emitting layer corresponding to each color of R (red), G (green) and B (blue) is formed. In this case, color purity can also be improved and a mirror surface of a pixel portion can be prevented by having a structure provided with a filter (colored layer) in which light in the emission wavelength range is transmitted in the direction of light radiation of the pixel. It is possible to skip providing a circular polarizing plate or the like which is conventionally necessary by providing the filter (colored layer), and this can prevent loss of light emitted from the light-emitting layer. Furthermore, there can be less variation of color tone generated in the case of obliquely seeing the pixel portion (a display screen).

There are various light-emitting materials which form the light-emitting layer. The following can be used as a low molecular weight organic light-emitting material: 4-dicyanomethylene-2-methyl-6-[2-(1,1,7,7-tetramethyljulolidine-9-yl)ethenyl]-4H-pyran (abbreviated as DCJT), 4-dicyanomethylene-2-t-butyl-6-[2-(1,1,7,7-tetramethyljulolidyl-9-yl)ethenyl]-4H-pyran, periflanthen, 2,5-dicyano-1,4-bis[2-(10-methoxy-1,1,7,7-tetramethyljulolidine-9-yl)ethenyl]benzene, N,N'-dimethylquinacridon (abbreviated as DMQd), coumarin6, coumarin545T, tris(8-quinolinolato)aluminum (abbreviated as $Alq_3$), 9,9'bianthryl, 9,10-diphenylanthracene (abbreviated as DPA), 9,10-bis(2-naphthyl)anthracene (abbreviated as DNA) or the like. Alternatively, another substance may also be used.

On the other hand, a high molecular weight organic light-emitting material has higher physical intensity and higher durability of an element compared with the low molecular weight organic light emitting material. In addition, since the deposition by application is possible, manufacturing the element is comparatively easy. The structure of a light-emitting element using the high molecular weight organic light-emitting material is the same as in the case of using the low molecular weight organic light-emitting material, in which a cathode, a light-emitting substance containing layer and an anode are sequentially laminated. However, in forming a light-emitting substance containing layer using the high molecular weight organic light-emitting material, it is difficult to form a laminated structure as in the case of using the low molecular weight organic light-emitting material, and thus, a double-layered structure is formed in many cases. Specifically, a cathode, a light-emitting layer, a hole transport layer and an anode are sequentially laminated in the structure.

Since luminescence color depends on materials which form a light-emitting layer, a light-emitting element that shows a desired luminescence by selecting these materials can be formed. Polyparaphenylene vinylene based, polyparaphenylene based, polythiophene based and polyfluorene based light-emitting materials are given as an example of a high molecular weight light-emitting material which can be used to form a light-emitting layer.

The following can be given as an example of the polyparaphenylene vinylene based light-emitting material: a derivative of poly(paraphenylenevinylene) [PPV], poly(2,5-dialkoxy-1,4-phenylenevinylene) [RO-PPV], poly(2-(2'-ethyl-hexoxy)-5-methoxy-1,4-phenylenevinylene) [MEH-PPV], poly(2-(dialkoxyphenyl)-1,4-phenylenevinylene) [ROPh-PPV] or the like. The following can be given as an example of the polyparaphenylene based light-emitting material: a derivative of polyparaphenylene [PPP], poly(2,5-dialkoxy-1,4-phenylene) [RO-PPP], poly(2,5-dihexoxy-1,4-phenylene) or the like. The following can be given as an example of the polythiophene based light-emitting material: a derivative of polythiophene [PT], poly(3-alkylthiophene) [PAT], poly(3-hexylthiopbene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT] or the like. The following can be given as an example of the polyfluorene based light-emitting material: a derivative of polyfluorene [PF], poly(9,9-dialkylfluorene) [PDAF], poly(9,9-dioctylfluorene) [PDOF] or the like.

Note that the hole injectability from an anode can be enhanced when a high molecular weight organic light-emitting material having hole transportability is sandwiched between an anode and a high molecular organic light-emitting material having light-emitting properties. Generally, a solution in which an acceptor material is dissolved in water is applied by a spin-coating method or the like. In addition, since the acceptor material is insoluble in an organic solvent, the light-emitting material having light-emitting properties mentioned above can be laminated therewith. A mixture of PEDOT and camphor sulfonic acid (CSA) as an acceptor material, a mixture of polyaniline [PANI] and polystyrenesulphonic [PSS] as an acceptor material or the like can be given as an example of the high molecular weight organic light-emitting material having hole transportability.

In addition, a light-emitting layer can have a structure emitting monochromatic or white light emission. The case of using a white light-emitting material enables a color display by constituting a structure provided with a filter (a colored layer) transmitting light having a particular wavelength on the side where light from a pixel is emitted.

In order to form a light-emitting layer having white light emission, for example, $Alq_3$, $Alq_3$ partially doped with Nile Red, which is a red light emitting pigment, p-EtTAZ, and TPD (aromatic diamine) are sequentially laminated by an evaporation method, thereby being able to obtain white light emission. In addition, in the case of forming a light-emitting layer by an application method using spin coating, the light-emitting layer is preferably baked by vacuum heating after the application. For example, a poly (ethylenedioxythiophene)/poly (styrenesulfonic acid) solution (PEDOT/PSS) may be applied to an entire surface and baked in order to form a film that serves as a hole injection layer. Thereafter, a polyvinyl carbazole (PVK) solution doped with luminescent center pigment (such as 1,1,4,4-tetraphenyl-1,3-butadiene (TPB), 4-dicyanomethylene-2-methyl-6-(p-dimethylamino-styryl)-4H-pyran (DCM1), Nile red or coumarin 6) may be applied to the entire surface and baked in order to form a film that serves as a light emitting layer.

A light-emitting layer can be formed in a single-layer, and a 1,3,4-oxadiazole derivative (PBD) having electron transportability may be dispersed in polyvinyl carbazole (PVK) having hole transportability. In addition, white light emission can be obtained by dispersing PBD for 30 wt % as an electron transport agent and dispersing appropriated doses of four kinds of dyes (TPB, coumarin6, DCM1 and Nile Red). In addition to the light-emitting element with which white light emission is obtained, as shown here, a light-emitting element that can obtain red light emission, green light emission or blue light emission can be manufactured by appropriately selecting the materials of the light-emitting layer.

Furthermore, a triplet excited light-emitting material including a metal complex or the like may be used for the light-emitting layer in addition to a singlet excited light-emitting material. For example, among a pixel having red light-emitting properties, a pixel having green light-emitting properties and a pixel having blue light-emitting properties, the pixel having red light-emitting properties with comparatively short half reduced luminescence time is formed from a triplet excited light-emitting material, and other pixels are formed from a singlet excited light-emitting material. Since the triplet excited light-emitting material has preferable luminous efficiency, there is a feature that less power consumption is required to obtain the same luminance. In other words, in the case of applying the triplet excited light-emitting material to the red pixel, a few amount of current flown to a light-emitting element is required; therefore, the reliability can be enhanced. The pixel having red light-emitting properties and the pixel having green light-emitting properties may be formed from a triplet excited light-emitting material, and the pixel having blue light-emitting properties may be formed from a singlet excited light-emitting material to reduce the power consumption. Further low power consumption can be realized by also forming the green light-emitting element, which has high human spectral luminous efficacy, from a triplet excited light-emitting material.

A metal complex used as a dopant, a metal complex in which platinum, which is a third transition series element, serves as a center metal, a metal element in which iridium serves as a center metal or the like is known as an example of a triplet excited light-emitting material. The triplet excited light-emitting material is not limited to these compounds and it is also possible to use a compound having the above structure and having an element belonging to Groups 8 to 10 of a periodic table for a center metal.

The substance mentioned above that forms the light-emitting substance containing layer is just an example, and a light-emitting element can be formed by appropriately laminating each functional layer such as a hole injection transport layer, a hole transport layer, an electron injection transport layer, an electron transport layer, a light-emitting layer, an electron block layer or a hole block layer. In addition, a mixed layer or a mixed junction may be formed with the combination of each layer. The layer structure of the light-emitting layer can be varied. Instead of not equipping a particular electron injection region or light-emitting region, the variation of entirely providing an electrode for this purpose or providing a light-emitting material by dispersing can be permitted under the scope not departing the content of the present invention.

The light-emitting element formed by using the material mentioned above is emits light by being biased in a forward direction. A pixel of a display device formed by using the light-emitting element can be driven by a simple matrix mode or an active matrix mode. In any event, each pixel is emitted by applying a forward bias thereto in specific timing; however, the pixel is in a non-luminescent state for a certain period. Reliability of a light-emitting element can be enhanced by applying bias in the opposite direction at this non-luminescent time. In a light-emitting element, there is a deterioration mode in which emission intensity is decreased under a certain driving condition or a deterioration mode in which luminance is apparently decreased due to the expansion of a non-luminescent region in the pixel. However, the progression of deterioration can be delayed by alternating current driving. Accordingly, reliability of a light emitting device can be enhanced.

Next, as shown in FIG. 30B, a sealant 2081 is formed to seal the substrate 2001 using a sealing substrate 2082. Thereafter, a connection terminal 2084 (a connection terminal connected to the gate wiring layer. A connection terminal connected to the source wiring layer is not shown) is attached to each end portion of the gate wiring layer 2011 and the source wiring layer (not shown) with an anisotropic conductive layer 2083 therebetween. Furthermore, it is preferable to seal connection portions of each wiring layer and the connection terminals with a sealing resin 2085. This structure can prevent moisture generated from a cross-sectional portion from penetrating and deteriorating the pixel portion.

Through the steps mentioned above, a light-emitting display panel can be manufactured. Note that a protective circuit, typically a diode or the like may be used between the connection terminal and the source wiring (gate wiring) or in the pixel portion in order to prevent electrostatic discharge damage. In this case, the electrostatic discharge damage can be prevented by manufacturing in the same step as the above TFT and by connecting the gate wiring layer of the pixel portion and the drain or source wiring layer of the diode.

Note that any of Embodiment Mode 1 to Embodiment Mode 9 can be applied to this embodiment. Methods for manufacturing a liquid crystal display panel and a light-emitting display panel are shown as a display panel; however, Embodiments 1 and 2 are not limited thereto. Embodiments 1 and 2 can be appropriately applied to an active-type display panel such as a DMD (Digital Micromirror Device), a PDP (Plasma Display Panel), an FED (Field Emission Display) or an electrophoretic display device (an electronic paper).

Embodiment 3

A mode of a light-emitting element applicable to the above embodiment is explained with reference to FIGS. 36A to 36D.

Figure 36A:
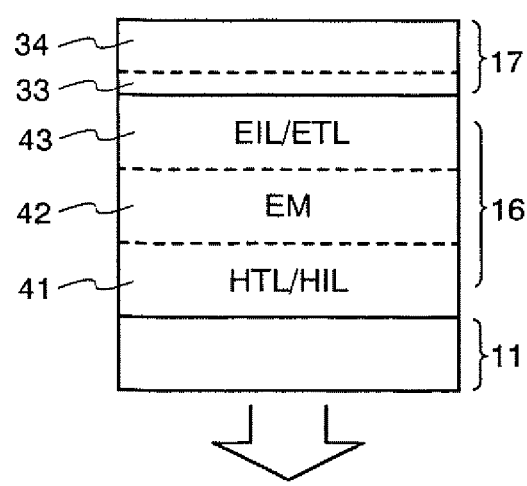
FIGS. 36A to 36D are explanatory diagrams of a mode of a light-emitting element which can be applied to certain aspects of the present invention.

FIG. 36A shows an example of a light-emitting element of which first pixel electrode 11 is formed from a light-transmitting oxide conductive material, which is formed from an oxide conductive material containing silicon oxide with a concentration of from 1 atomic % to 15 atomic %. A light-emitting substance containing layer 16 with a lamination of a hole injection layer or hole transport layer 41, a light-emitting layer 42 and an electron transport layer or electron injection layer 43 is provided thereover. A second pixel electrode 17 is formed from a first electrode layer 33 containing alkaline metal or alkaline earth metal such as LiF or MgAg and a second electrode layer 34 formed from a metal material such as aluminum. A pixel having such a structure can emit light through the first pixel electrode 11 as indicated by an arrow in FIG. 36A.

Figure 36B:
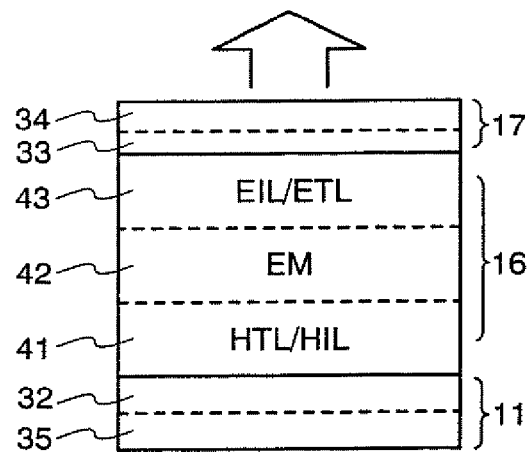

FIG. 36B shows an example of a light-emitting element which emits light through the second pixel electrode 17. A first pixel electrode 11 is formed from a first electrode layer 35 formed from a metal such as aluminum or titanium or a metal material containing the metal and nitrogen with concentrations of a stoichiometric composition ratio or less, and a second electrode with a concentration of from 1 atomic % to 15 atomic %. A light-emitting substance containing layer 16 with a lamination of a hole injection layer or hole transport layer 41, a light-emitting layer 42 and an electron transport layer or electron injection layer 43 is provided thereover. The second pixel electrode 17 is formed from a third electrode layer 33 containing alkaline metal or alkaline earth metal such as LiF or CaF and a fourth electrode layer 34 formed from a metal material such as aluminum. Any one of layers has a film thickness of 100 nm or less so that the layer can transmit light; therefore, light can be emitted through the second pixel electrode 17.

In a light-emitting element having a structure shown in FIG. 36A or FIG. 36B, a conductive film having light-transmitting properties and a high work function is used for the first pixel electrode 11 and a conductive film having light-transmitting properties and a low work function is used for the second pixel electrode 17 in the case of emitting light in the both directions, in other words, through the first pixel electrode and the second pixel electrode. Typically, the first pixel electrode 11 is preferably formed from an oxide conductive material containing silicon oxide with a concentration of from 1 atomic % to 15 atomic %, and the second pixel electrode 17 is preferably formed from the third electrode layer 33 containing alkaline metal or alkaline earth metal such as LiF or CaF and the fourth electrode layer 34 formed from a metal material such as aluminum to each have a film thickness of 100 nm or less.

Figure 36C:
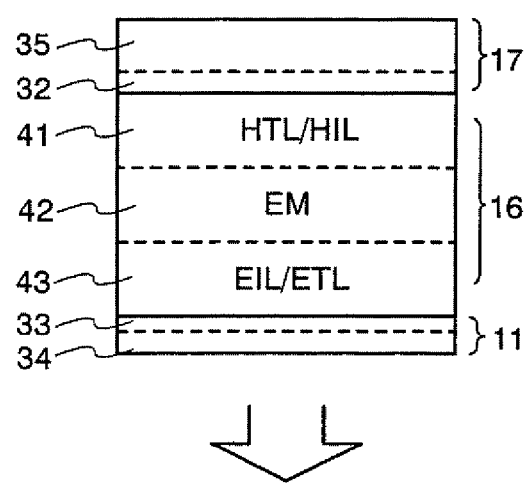

FIG. 36C shows an example of a light-emitting element which emits light through a first pixel electrode 11 and shows a structure of a light-emitting substance containing layer 16 in which an electron transport layer or electron injection layer 43, a light-emitting layer 42, a hole injection layer or hole transport layer 41 are sequentially laminated. A second pixel electrode 17 is formed, from the side of the light-emitting substance containing layer 16, from a second electrode layer 32 formed from an oxide conductive material containing silicon oxide with a concentration of from 1 atomic % to 15 atomic %, and a first electrode layer 35 formed from a metal such as aluminum or titanium or a metal material containing the metal and nitrogen with a concentration of a stoichiometric composition ratio or less. The first pixel electrode 11 is formed from a third electrode layer 33 containing alkaline metal or alkaline earth metal such as LiF or CaF and a fourth electrode layer 34 formed from a metal material such as aluminum. Any one of layers has a film thickness of 100 nm or less so that the layer can transmit light; therefore, light can be emitted through the first pixel electrode 11.

Figure 35A:
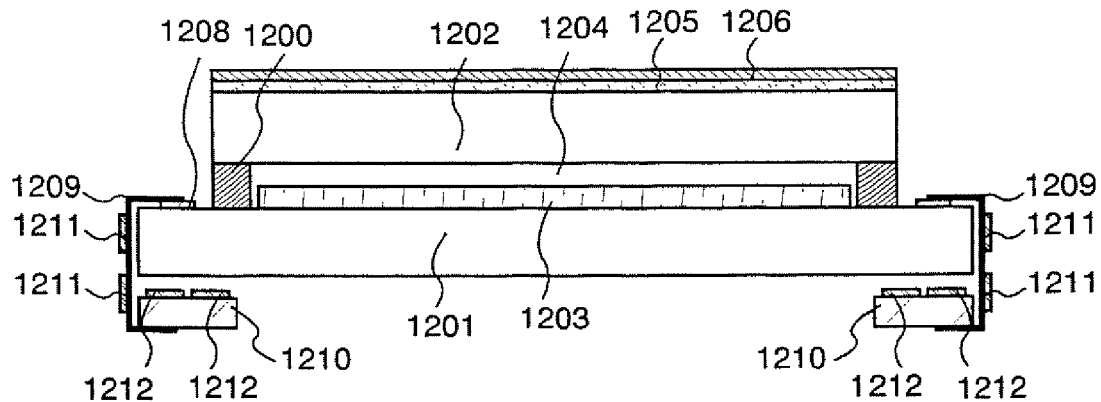
FIGS. 35A to 35C are explanatory views of a structure of a light-emitting display module according to certain aspects of the present invention.
Figure 36D:
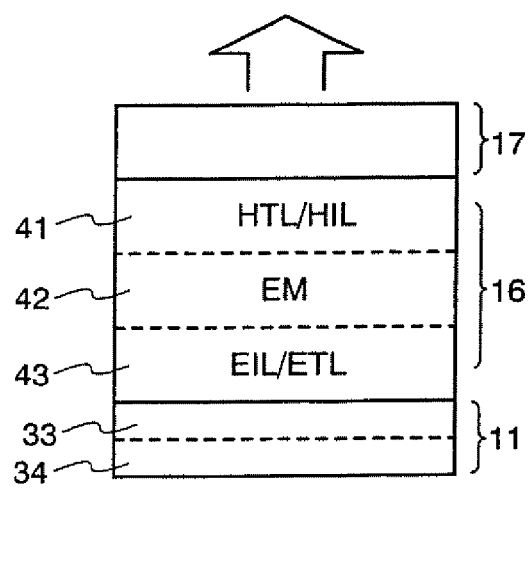

FIG. 36D shows an example of a light-emitting element which emits light through a second pixel electrode 17 and shows a structure of a light-emitting substance containing layer 16 in which an electron transport layer or electron injection layer 43, a light-emitting layer 42 and a hole injection layer or hole transport layer 41 are sequentially laminated. A first pixel electrode 11 has the same structure as in FIG. 35A, and the film thickness is formed thick enough to be able to reflect the light emitted in the light-emitting substance containing layer 16. The second pixel electrode 17 is constituted of an oxide conductive material containing silicon oxide with a concentration of from 1 atomic % to 15 atomic %. In this structure, the hole injection layer of hole transport layer 41 is formed from inorganic metal oxide (typically, molybdenum oxide or vanadium oxide); therefore, oxygen to be introduced in forming a second electrode layer 33 is supplied, and thus, the hole injectability can be enhanced and a driving voltage can be reduced.

In a light-emitting element having a structure shown in FIG. 36C or FIG. 36D, a conductive film having light-transmitting properties and a low work function is used for the first pixel electrode 11 and a conductive film having light-transmitting properties and a high work function is used for the second pixel electrode 17 in the case of emitting light in the both direction, in other words, through the first pixel electrode and the second pixel electrode. Typically, the first pixel electrode 11 is preferably formed from the third electrode layer 33 containing alkaline metal or alkaline earth metal such as LiF or CaF and the fourth electrode layer 34 formed from a metal material such as aluminum to each have a film thickness of 100 nm or less. The second pixel electrode 17 is preferably formed from an oxide conductive material containing silicon oxide with a concentration of from 1 atomic % to 15 atomic %.

Embodiment 4

A pixel circuit of a light-emitting display panel shown in the above embodiment and an operation structure thereof are described with reference to FIGS. 37A to 37F.

Figure 37A:
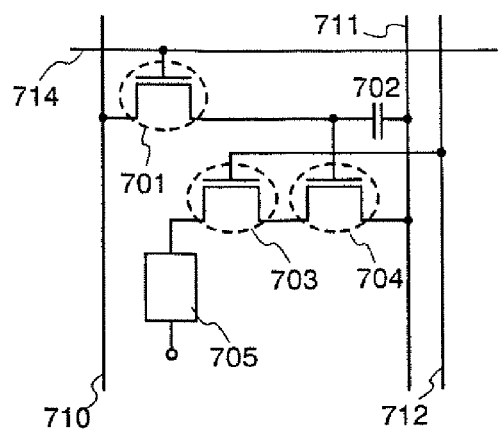
FIGS. 37A to 37F are explanatory equivalent circuit diagrams of a pixel structure which can be applied to a light-emitting display panel of the present invention.

In a pixel shown in FIG. 37A, a signal line 710 and power supply lines 711 and 712 are arranged in a column direction, and a scanning line 714 is arranged in a row direction. In addition, the pixel includes a switching TFT 701, a driving TFT 703, a current control TFT 704, a capacitor element 702 and a light-emitting element 705.

Figure 37B:
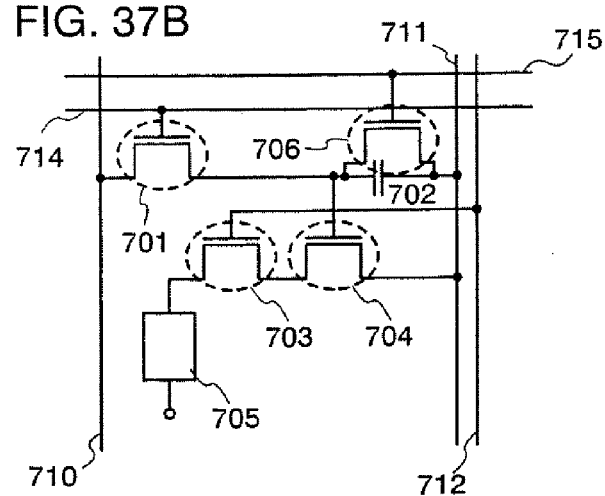
Figure 37C:
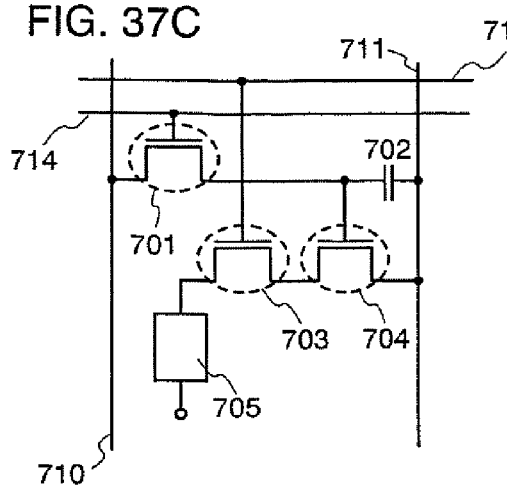
Figure 37D:
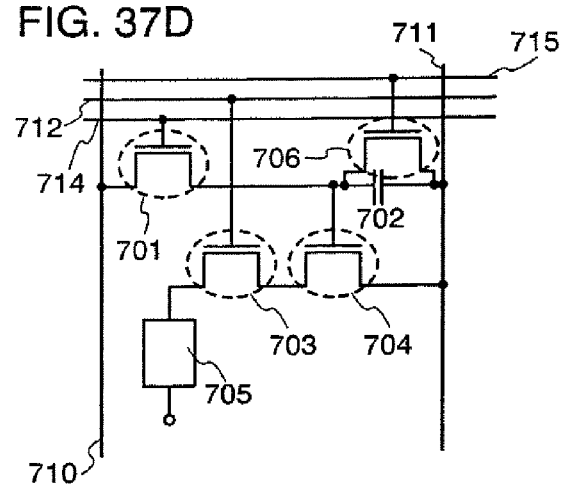

A pixel shown in FIG. 37C has the same structure as the pixel shown in FIG. 37A except that a gate electrode of a driving TFT 703 is connected to a power supply line 712 arranged in a row direction. In other words, equivalent circuit diagrams of both of the pixels shown in FIGS. 37A and 37C are the same. However, each power supply line is formed using a conductive layer in a different layer when the power supply line 712 is arranged in a Tow direction (FIG. 37A) and when a power supply line 712 is arranged in a column direction (FIG. 37C). Here, a wiring connected to the gate electrode of the driving TFT 703 is focused and the figures are separately shown in FIGS. 37A and 37C in order to show that the wiring is formed in different layer.

As a feature of the pixel each shown in FIGS. 37A and 37C, the driving TFT 703 and the current control TFT 704 are connected in series in the pixel. It is preferable to set a channel length L(703) and a channel width W(703) of the driving TFT 703 and a channel length L(704) and a channel width W(704) of the current control TFT 704 to satisfy L(703)/W(703):L(704)/W(704)=5 to 6000:1.

The driving TFT 703 operates in a saturation region and has a role of controlling the amount of a current value flowing through the light-emitting element 705. The current control TFT 704 operates in a linear region and has a role of controlling supply of the amount of current to the light-emitting element 705. It is preferable in terms of manufacturing steps that both TFTs have the same conductivity, and the TFTs are formed as an n-channel type TFT in this embodiment. In addition, the driving TFT 703 may be a depletion mode TFT as well as an enhancement mode TFT. In the present invention having the structure mentioned above, the current control TFT 704 operates in a linear region; therefore, a slight variation of VGS in the current control TFT 704 does not affect a current value of the light-emitting element 705. In other words, the amount of the current value of the light-emitting element 705 depends on the driving TFT 703 operated in a saturation region. According to the structure mentioned above, luminance variation resulted from variations in characteristics of the TFT, can be improved, and a display device with improved image quality can be provided.

In pixels shown in FIGS. 37A to 37D, the switching TFT 701 controls input of a video signal to a pixel. When the switching TFT 701 is turned ON, a video signal is inputted into the pixel. Note that FIGS. 37A and 37C each show a structure in which the capacitor element 702 is provided; however, the invention is not limited thereto. When a gate capacitor or the like can be used as a capacitor that can hold a video signal, the capacitor element 702 may not be provided.

The pixel shown in FIG. 37B has the same structure as the pixel shown in FIG. 37A except that a TFT 706 and a scanning line 715 are added. In the same manner, a pixel shown in FIG. 37D has the same structure as the pixel structure shown in FIG. 37C except that a TFT 706 and a scanning line 715 are added.

In the TFT 706, ON or OFF is controlled by the scanning line 715 that is newly arranged. When the TFT 706 is turned ON, an electric charge held in the capacitor element 702 is discharged, and the current control TFT 704 is turned OFF. In other words, it is possible to forcefully make a state in which current does not flow through the light-emitting element 705 by disposing the TFT 706. Therefore, the TFT 706 can be referred to as an erasing TV. Accordingly, in the structures in FIGS. 37B and 37D, a lighting period can be started simultaneously with or right after a start of a writing period without waiting for writing of a signal in all pixels. Consequently, a duty ratio can be improved.

Figure 37E:
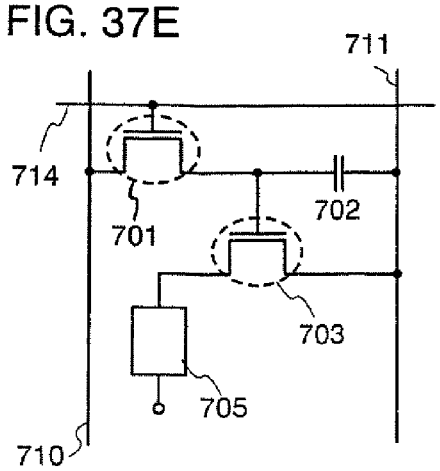
Figure 37F:
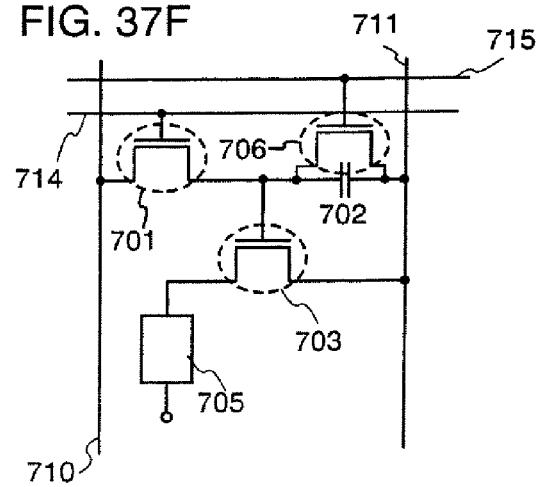

In a pixel shown in FIG. 37E, a signal line 710 and a power supply line 711 are arranged in a column direction, and a scanning line 714 is arranged in a row direction. In addition, the pixel includes a switching TFT 701, a driving TFT 703, a capacitor element 702 and a light-emitting element 705. A pixel shown in FIG. 37F has the same structure as a pixel shown in FIG. 37E except that a TFT 706 and a scanning line 715 are added. Note that a duty ratio can be improved also in a structure in FIG. 37F by disposing the TFT 706.

It is preferable to make a semiconductor film of a driving TFT large particularly in the case of forming a thin film transistor having an amorphous semiconductor or the like as in the above embodiment. Therefore, the pixel circuit shown in FIG. 37E or 37F, which has a small number of TFTs, is preferably used in consideration of an aperture ratio.

Since each pixel is provided with TFTs, such an active matrix light emitting device is considered to be advantageous to low voltage driving when a pixel density is increased. On the other hand, a passive matrix type light-emitting device in which a TFT is provided for every column can also be formed. In the passive matrix type light emitting device, TFTs are not provided for each pixel; therefore, a high aperture ratio can be obtained.

In addition, a method for driving a screen display is not particularly limited in a display device of the invention and, for example, a dot-sequential driving method, a line-sequential driving method, an area-sequential driving method or the like may be used. The line-sequential driving method is typically applied, and a time division gradation driving method or an area gradation driving method may be appropriately used. In addition, a video signal inputted into a source line of a display device may be either an analog signal or a digital signal, and a driver circuit or the like may be appropriately designed depending on the video signal.

Furthermore, in a display device using a digital video signal, a video signal inputted into a pixel includes one at a constant voltage (CV) and one at a constant current (CC). The video signal at a constant voltage (CV) is further classified into a video signal with a constant voltage applied to a light-emitting element (CVCV), and a video signal with a constant current applied to a light-emitting element (CVCC). In addition, the video signal at a constant current (CC) is classified into a video signal with a constant voltage applied to a light-emitting element (CCCV), and a video signal with a constant current applied to a light-emitting element (CCCC).

As described above, various pixel circuits can be applied.

Embodiment 5

In this embodiment, mounting of driver circuits (a signal line driver circuit 1402 and scanning line driver circuits 1403a and 1403b) on a display panel shown in the above embodiments is described with reference to FIGS. 9A to 9C.

Figure 9A:
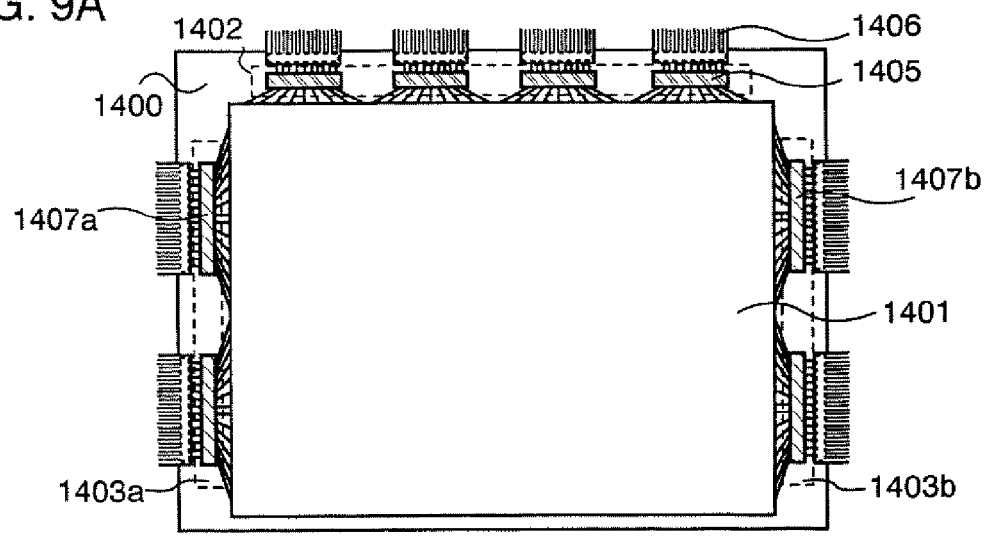
FIGS. 9A to 9C are explanatory top views of a method for mounting a driver circuit of a display device according to certain aspects of the present invention.

As shown in FIG. 9A, the signal line driver circuit 1402 and the scanning line driver circuits 1403a and 1403b are mounted on a periphery of a pixel portion 1401. In FIG. 9A, IC chips 1405, 1407a and 1407b are mounted on a substrate 1400 by a COG method as the signal line driver circuit 1402 and the scanning line driver circuits 1403a, 1403b and the like. Then, the IC chip is connected to an external circuit through an FPC (flexible printed circuit) 1406.

Figure 9B:
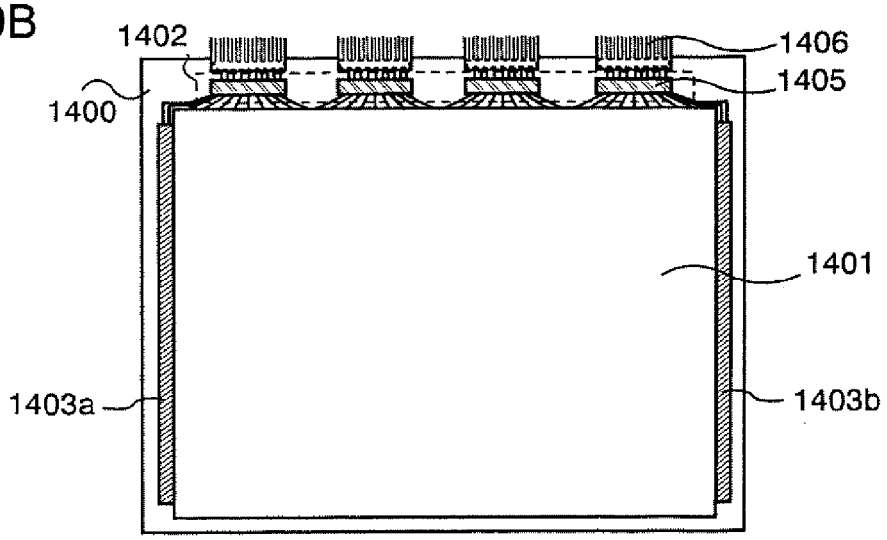

As shown in FIG. 9B, in the case of forming a TFT from a SAS or a crystalline semiconductor, a pixel portion 1401, scanning line driver circuits 1403a and 1403b and the like are integrally formed over a substrate, and a signal line driver circuit 1402 or the like is separately mounted as an IC chip. In FIG. 9B, an IC chip 1405 is mounted on a substrate 1400 by a COG method as the signal line driver circuit 1402. Then, the IC chip is connected to an external circuit through an FPC (flexible printed circuit) 1406.

Figure 9C:
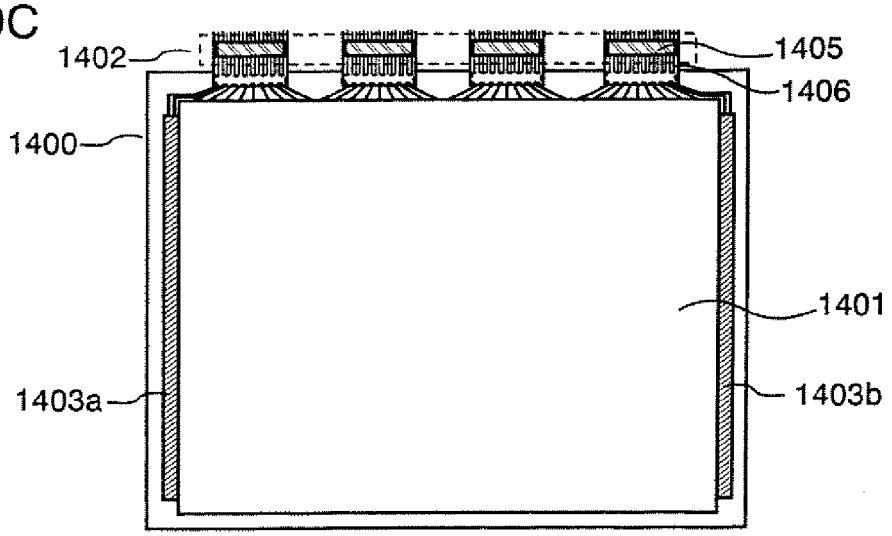

Furthermore, as shown in FIG. 9C, a signal line driver circuit 1402 or the like may be mounted by a TAB method instead of a COG method. Then, an IC chip is connected to an external circuit through an FPC (flexible printed circuit) 1406. In FIG. 9C, the signal line driver circuit is mounted by a TAB method; however, the scanning line driver circuit may be mounted by a TAB method.

When the IC chip is mounted by a TAB method, a pixel portion can be largely provided with respect to a substrate, and thus, a frame can be narrowed.

The IC chip is formed by using a silicon wafer; however, an IC in which a circuit is formed over a glass substrate (hereinafter referred to as a driver IC) may be provided instead of the IC chip. Since the IC chip is taken out of a circular silicon wafer, there is limitation on a shape of a mother substrate. On the other hand, the driver IC has a glass mother substrate and there is no limitation on the shape; therefore, the productivity can be enhanced. Accordingly, the shape and dimension of the driver IC can be arbitrarily set. For example, when the driver IC is formed to have a major axis of from 15 mm to 80 mm, the necessary number of the driver ICs can be reduced compared with the case of mounting the IC chip. Consequently, the number of connection terminals can be reduced, and thus, a yield in terms of manufacturing can be enhanced.

The driver IC can be formed by using a crystalline semiconductor formed over a substrate, and it is preferable to form a crystalline semiconductor by the irradiation of continuous-wave laser light. A semiconductor film obtained by being irradiated with continuous-wave laser light has few crystal defects and has crystal grains with large grain sizes. Consequently, a transistor having such a semiconductor film has satisfactory mobility and response speed, high-speed driving can be performed, which is suitable for the driver IC.

Embodiment 6

In this embodiment, a method for mounting driver circuits (a signal line driver circuit 1402 and scanning line driver circuits 1403a and 1403b) on a display panel shown in the above embodiment is described with reference to FIGS. 10A to 10D. A connection method using an anisotropic conductive material, a wire bonding method or the like may be applied as the mounting method, and an example thereof is described with reference to FIGS. 10A to 10D. Note that this embodiment shows an example using a driver IC for the signal line driver circuit 1402 and the scanning line driver circuits 1403a and 1403b. An IC chip can be appropriately used instead of the driver IC.

Figure 10A:
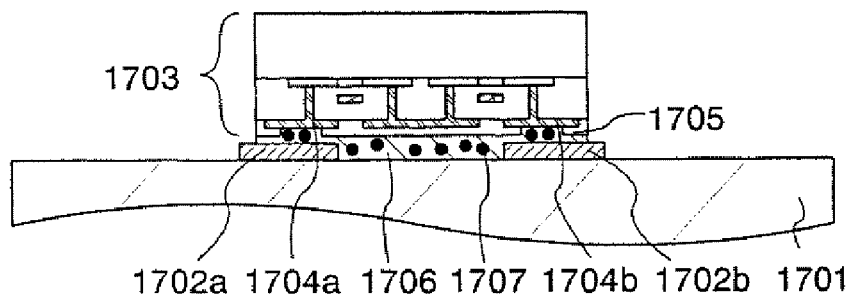
FIGS. 10A to 10D are explanatory cross-sectional views of a method for mounting a driver circuit of a display device according to certain aspects of the present invention.

FIG. 10A shows an example of a driver IC 1703 mounted on an active matrix substrate 1701 by using an anisotropic conductive material. Each wiring such as a source or gate wiring (not shown) and electrode pads 1702a and 1702b of the wirings are formed over the active matrix substrate 1701.

Connection terminals 1704a and 1704b are provided on the surface of the driver IC 1703, and a protective insulating film 1705 is formed in the periphery portion.

The driver IC 1703 is fixed to the active matrix substrate 1701 with an anisotropic conductive adhesive 1706. The connection terminals 1704a and 1704b and the electrode pads 1702a and 1702b are electrically connected to one another with conductive particles 1707 contained in the anisotropic conductive adhesive. The anisotropic conductive adhesive is adhesive resin in which the conductive particles (with a grain size of approximately from 3 μm to 7 μm) are dispersed and contained. Epoxy resin, phenol resin or the like can be given as an example of the anisotropic conductive adhesive. In addition, the conductive particles (with a grain size approximately from several μm to several hundred μm) are formed from an element of gold, silver, copper, palladium and platinum or alloy particles of a plurality of elements. Alternatively, particles having a multilayer structure of the above may also be used. Furthermore, resin particles coated with an element of gold, silver, copper, palladium and platinum or an alloy of a plurality of elements may also be used.

In addition, an anisotropic conductive film which is transferred to a base film in a filmed shape may be used instead of the anisotropic conductive adhesive. The conductive particles that are similar to those in the anisotropic conductive adhesive are dispersed in the anisotropic conductive film. The size and concentration of the conductive particles 1707 mixed in the anisotropic conductive adhesive 1706 are adjusted adequately, so that the driver IC can be mounted on the active matrix substrate in this mode. This mounting method is suitable for a method for mounting the driver ICs in FIGS. 9A and 9B.

Figure 10B:
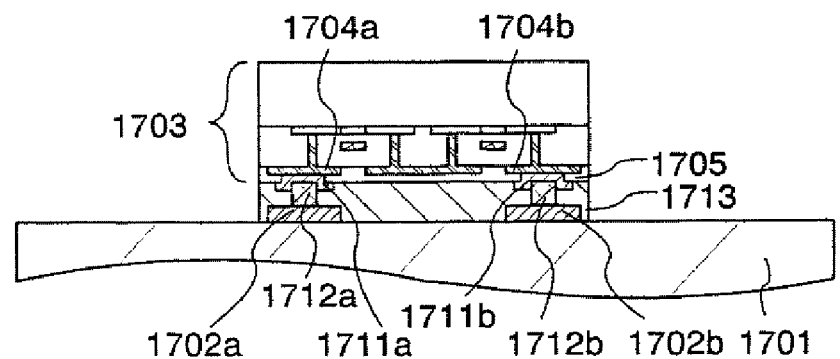

FIG. 10B shows an example of a mounting method in which shrinkage of organic resin is utilized. Buffer layers 1711a and 1711b are formed on the surface of the connection terminals 1704a and 1704b of a driver IC by using Ta, Ti or the like, and Au is formed thereover to be approximately 20 μm in thickness by an electroless plating method or the like to form bumps 1712a and 1712b. The driver IC can be mounted by interposing photocurable insulating resin 1713 between the driver IC and an active matrix substrate and by welding electrodes with pressure using the contractive force of the solidified photocurable resin. This mounting method is suitable for methods for mounting the driver IC in FIGS. 9A and 9B.

Figure 10C:
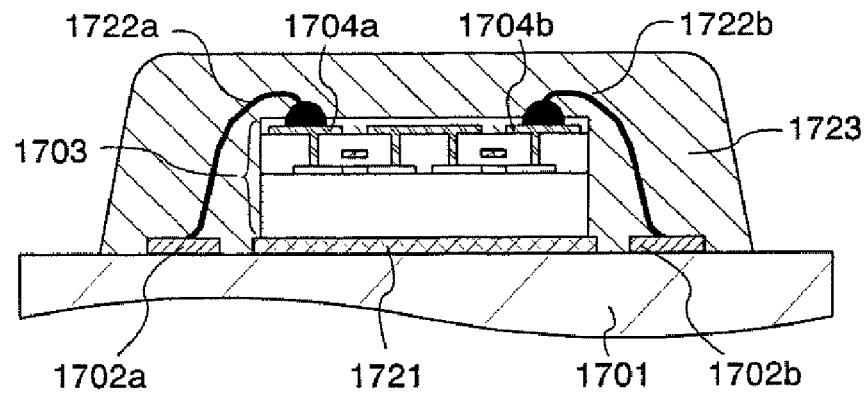

In addition, as shown in FIG. 10C, a driver IC 1703 may be fixed to an active matrix substrate 1701 by using an adhesive 1721, and the connection terminals 1704a and 1704b of a CPU and electrode pads 1702a and 1702b over the wiring board may be connected by wiring 1722a and 1722b. Then, an organic resin 1723 is used to seal the connection terminal 1704a and 1704b, the electrode pads 1702a and 1702b, the driver IC 1703 and the wirings 1722a and 1722b. This mounting method is suitable for a method for mounting the driver IC in FIGS. 9A and 9B.

Figure 10D:
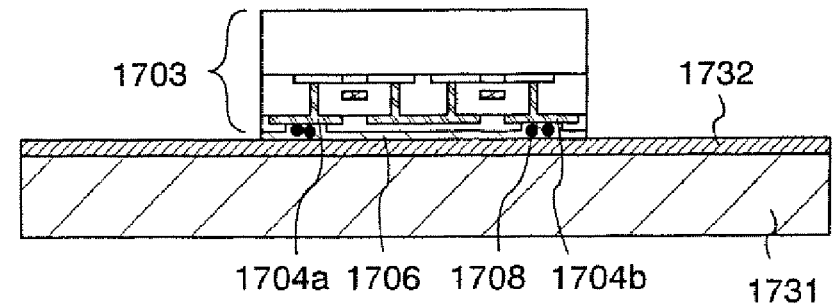

In addition, as shown in FIG. 10D, a driver IC 1703 may be provided over an FPC (Flexible printed circuit) 1731 with a wiring 1732 and an anisotropic conductive adhesive 1706 containing conductive particles 1707 therebetween. This structure is extremely effective in the case of applying it for an electronic device that is limited in the size of a casing such as a portable terminal. This mounting method is suitable for a method for mounting the driver IC in FIG. 9C.

Note that a method for mounting the driver IC is not particularly limited thereto, and a known COG method or a wire bonding method, a TAB method or reflow treatment using a solder bump can be used. Note that highly heat-resistant plastic, typically a polyimide substrate, an HT substrate (manufactured by Nippon Steel Chemical Co., Ltd.), ARTON made from norbornene resin with a polar group (manufactured by JSR Corp.) or the like is preferably used for a substrate used for a driver IC or an active matrix substrate in the case of performing reflow treatment.

Embodiment 7

As shown in FIGS. 9B and 9C, this embodiment describes a driver circuit when a scanning line side driver circuit is formed over a substrate 1400 by forming a semiconductor layer from a SAS in a display panel shown in Embodiment 6.

Figure 14:
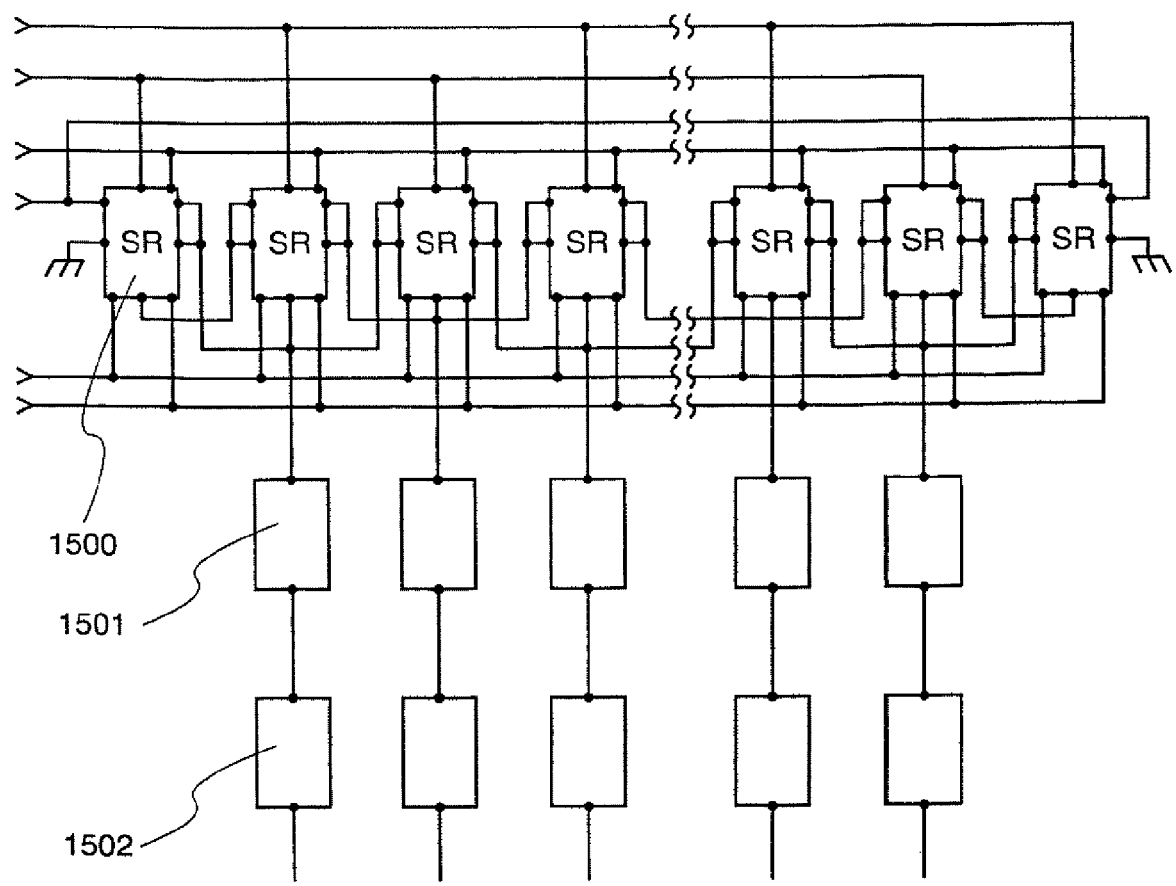
FIG. 14 is a diagram showing a circuit configuration in the case of forming a scanning line side driver circuit by a TFT in a liquid crystal display panel according to a certain aspect of the present invention.

FIG. 14 shows a block diagram of the scanning line driver circuit composed of an n-channel type TFTs using a SAS in which field effect mobility of from 1 cm$^2$/V·sec to 15 cm$^2$/V·sec can be obtained.

A block denoted by reference numeral 1500 in FIG. 14 corresponds to a pulse output circuit for outputting a sampling pulse for one stage, and a shift register includes n pulse output circuits. A pixel 1502 is connected at the end of a buffer circuit.

Figure 15:
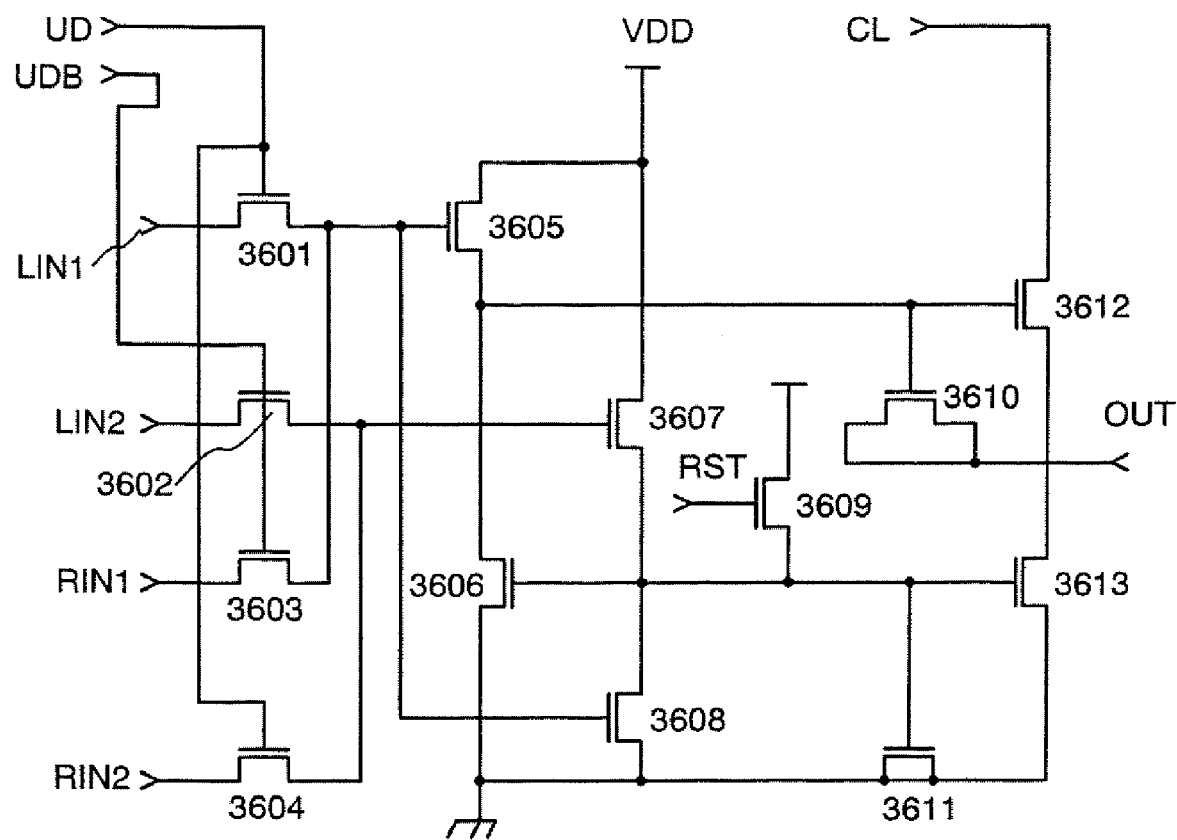
FIG. 15 is a diagram showing a circuit configuration in the case of forming a scanning line side driver circuit by a TFT in a liquid crystal display panel according to a certain aspect of the present invention (a shift register circuit)

FIG. 15 shows a specific structure of the pulse output circuit 1500, and the circuit includes n-channel type TFTs 3601 to 3613. The size of the TFTs may be decided at this time in consideration of an operating characteristic of the n-channel type TFTs using a SAS. For example, when a channel length is set to be 8 μm, a channel width can be set ranging from 10 μm to 80 μm.

Figure 16:
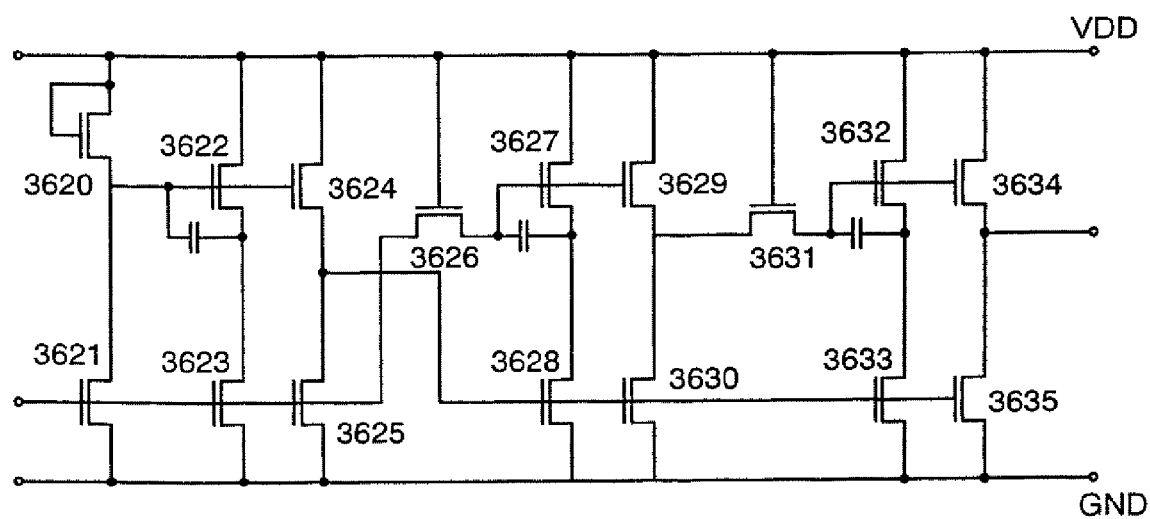
FIG. 16 is a diagram showing a circuit configuration in the case of forming a scanning line side driver circuit by a TFT in a liquid crystal display panel according to a certain aspect of the present invention (a buffer circuit)

In addition, FIG. 16 shows a specific structure of the buffer circuit 1501. The buffer circuit includes n-channel type TFTs 3620 to 3636 in the same manner. The size of the TFTs may be decided at this time in consideration of an operating characteristic of the n-channel type TFTs using a SAS. For example, when a channel length is set to be 10 μm, a channel width can be set ranging from 10 μm to 1800 μm.

Embodiment 8

Figure 26:
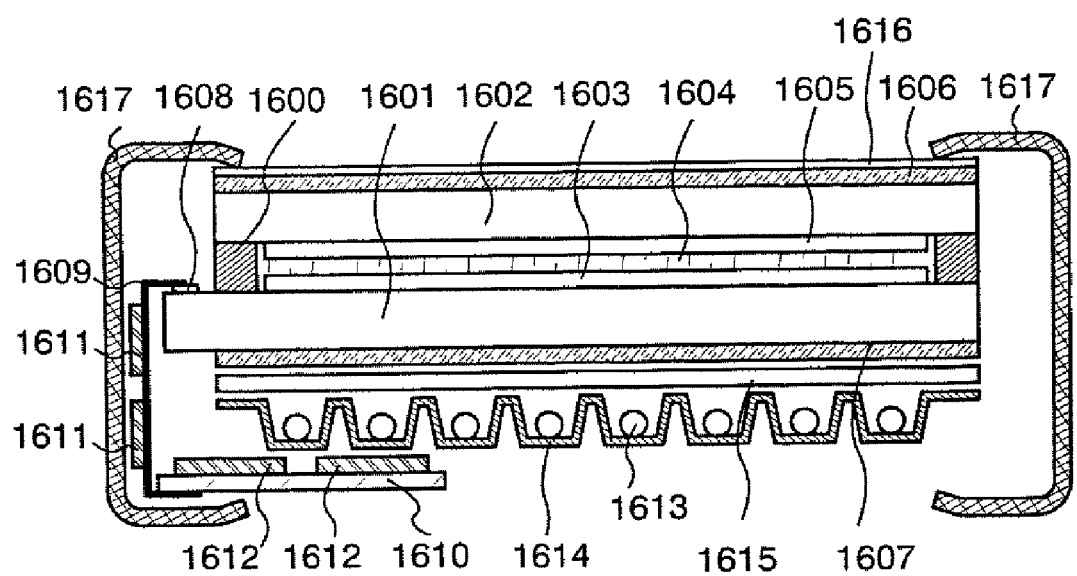
FIG. 26 is an explanatory view of a structure of a liquid crystal display module according to a certain aspect of the present invention.

This embodiment describes a display module. A liquid crystal module is shown here as an example of a display module with reference to FIG. 26.

An active matrix substrate 1601 and a counter substrate 1602 are fixed with a sealant 1600, and a pixel portion 1603 and a liquid crystal layer 1604 are provided therebetween to form a display region.

A colored layer 1605 is necessary to performing a color display. A colored layer corresponding to each color of red, green and blue is provided corresponding to each pixel in the case of RGB system. Polarizing plates 1606 and 1607 are arranged outside the active matrix substrate 1601 and the counter substrate 1602. In addition, a protective film 1616 is formed on the surface of the polarizing plate 1606, which relieves impact from outside.

A connection terminal 1608 provided for the active matrix substrate 1601 is connected to a wiring board 1610 through an FPC 1609. The FPC or a connection wiring is provided with a pixel driver circuit (an IC chip, a driver IC or the like) 1611, and an external circuit 1612 such as a control circuit or a power supply circuit is incorporated in the wiring substrate 1610.

A cold cathode tube 1613, a reflection board 1614 and an optical film 1615 are a backlight unit and serve as a light source to project light on a liquid crystal display panel. The liquid crystal display panel, the light source, the wiring board, the FPC and the like are held or protected by a bezel 1617.

Note that any of Embodiment Mode 1 to Embodiment Mode 9 can be applied to this embodiment.

Embodiment 9

Figure 35B:
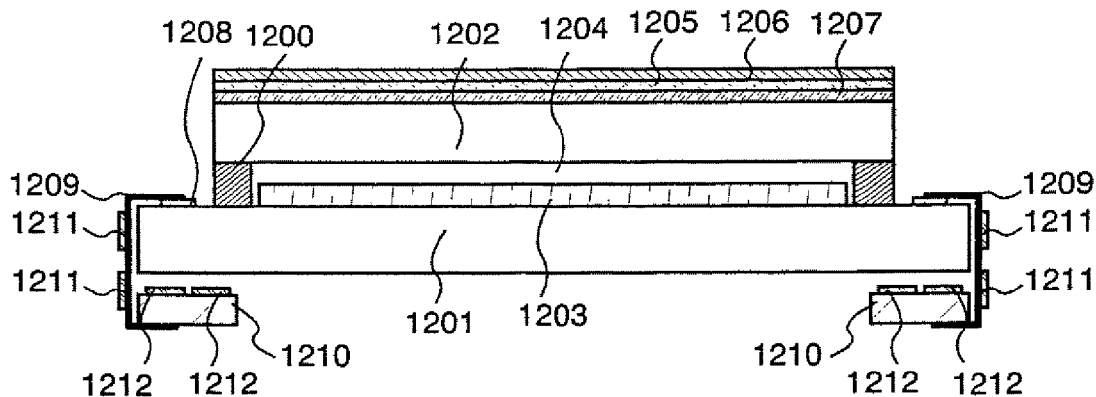
Figure 35C:
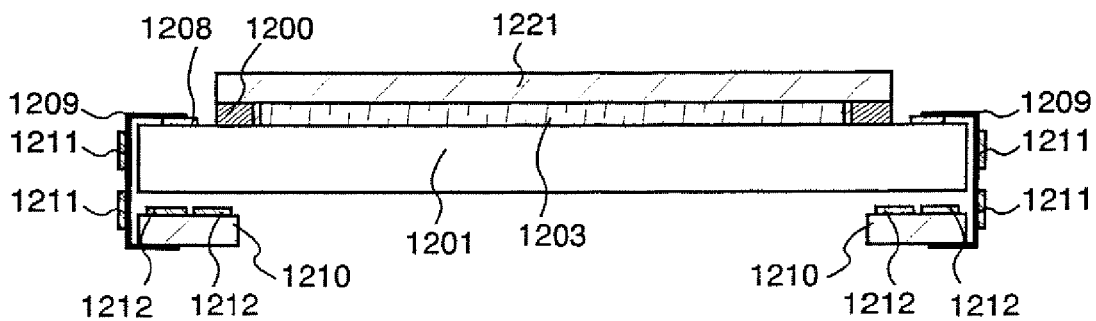

This embodiment shows a cross-sectional view of a light-emitting display module as an example of a display module with reference to FIGS. 35A to 35C.

FIG. 35A shows a cross section of a light-emitting display module in which an active matrix substrate 1201 and a counter substrate 1202 are fixed to each other with a sealant 1200, and a pixel portion 1203 is provided therebetween to form a display region.

A space 1204 is formed between the counter substrate 1202 and the pixel portion 1203. The penetration of moisture or oxygen can be further prevented by filling the space with an inert gas, for example, a nitrogen gas or forming a light-transmitting resin having a highly water absorbing material in the space. In addition, a light-transmitting and highly water absorbing resin may be formed. Even in the case of emitting light through a light-emitting element to a second substrate, a display module can be formed without decreasing the transmittance due to the light-transmitting resin.

In addition, in order to enhance the contrast, a polarizing plate or a circularly polarizing plate (a polarizing plate, ¼λ plate and ½λ plate) is preferably provided at least in a pixel portion of a module. When display is recognized from the counter substrate 1202 side, a quarter-wave plate and a half-wave plate 1205 and a polarizing plate 1206 may be sequentially provided over the counter substrate 1202. Furthermore, an antireflection film may be provided over the polarizing plate.

In addition, when display is recognized from both sides of the counter substrate 1202 and the active matrix substrate 1201, the surface of the active matrix substrate is preferably provided with a quarter-wave plate and a half-wave plate, and a polarizing plate in the same manner.

A connection terminal 1208 provided for the active matrix substrate 1201 is connected to a wiring board 1210 through an FPC 1209. The FPC or a connection wiring is provided with a pixel driver circuit 1211 (an IC chip, a driver IC or the like), and an external circuit 1612 such as a control circuit or a power supply circuit is incorporated into the wiring board 1210.

As shown in FIG. 35B, a colored layer 1207 can be provided between a pixel portion 1203 and the polarizing plate or between the pixel portion and the circularly polarizing plate. In this case, full color display can be performed by providing the pixel portion with a light-emitting element capable of emitting white light and by separately providing a colored layer showing RGB. In addition, full color display can be performed by providing the pixel portion with a light-emitting element capable of emitting blue light and by separately providing a color conversion layer or the like. Furthermore, each pixel portion can be provided with light-emitting elements capable of emitting red, green and blue light, and the colored layer 1207 can be used. Such a display module has high color purity of each RBG and is capable of high-definition display.

FIG. 35C, which is different from FIG. 35A, shows the case of sealing an active matrix substrate and a light-emitting element by using a protective film 1221 such as a film or resin without using a counter substrate. The protective film 1221 is provided to cover a second pixel electrode in a pixel portion 1203. An organic material such as epoxy resin, urethane resin or silicone resin can be used as the protective film 1221. In addition, the protective film 1221 may be formed by dropping a polymer material by a droplet discharge method. In this embodiment mode, epoxy resin is discharged by using a dispenser and is dried. Furthermore, a counter substrate may be provided over the protective film. The rest of the structures are the same as in FIG. 35A.

A display device can be reduced in weight, size and thickness by sealing the active matrix substrate and the light-emitting element without using a counter substrate in such a manner.

The wiring board 1210 is mounted by using the FPC 1209 in the module of this embodiment; however, this embodiment is not necessarily limited to the structure. The pixel driver circuit 1211 and the external circuit 1212 may be directly mounted on the substrate by using a COG (Chip on Glass) method.

Note that any of Embodiment Modes 1 to 7 can be applied to this embodiment. A liquid crystal display module and a light-emitting display module are shown as an example of a display module; however, Embodiment 8 and Embodiment 9 are not limited thereto. Embodiment 8 and Embodiment 9 can be appropriately applied to a display module such as a DMD (Digital Micromirror Device), a PDP (Plasma Display Panel), an FED (Field Emission Display) or an electrophoretic display device (electronic paper).

Embodiment 10

Figure 38A:
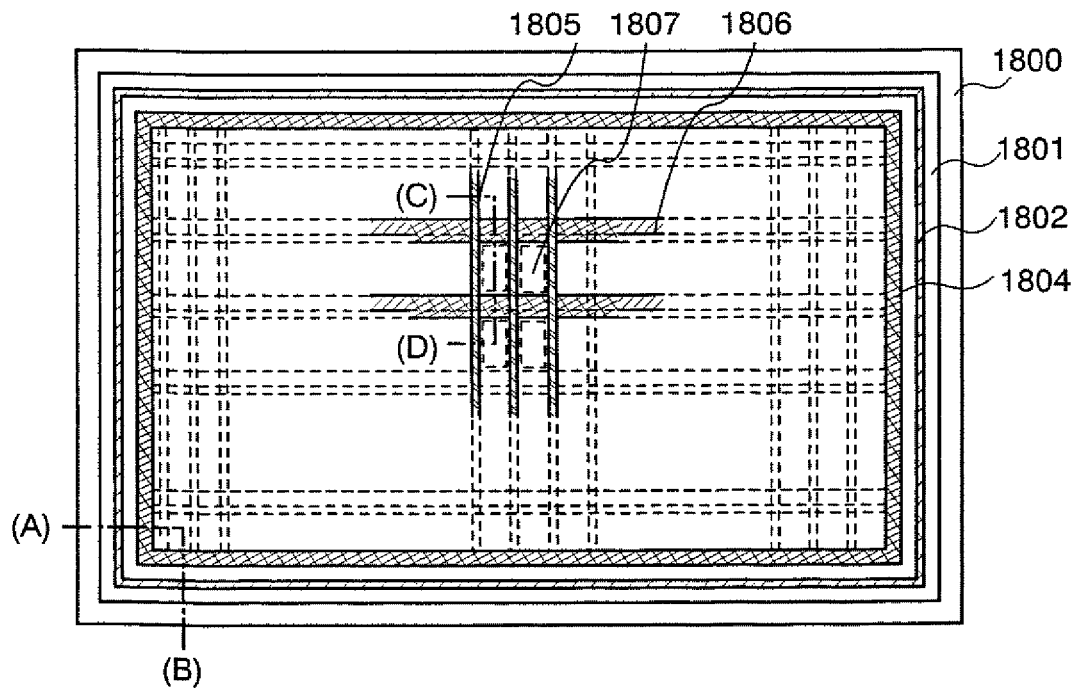
FIGS. 38A to 38C are an explanatory top view and cross-sectional view of a structure of a light emitting display panel of the present invention.
Figure 38B:
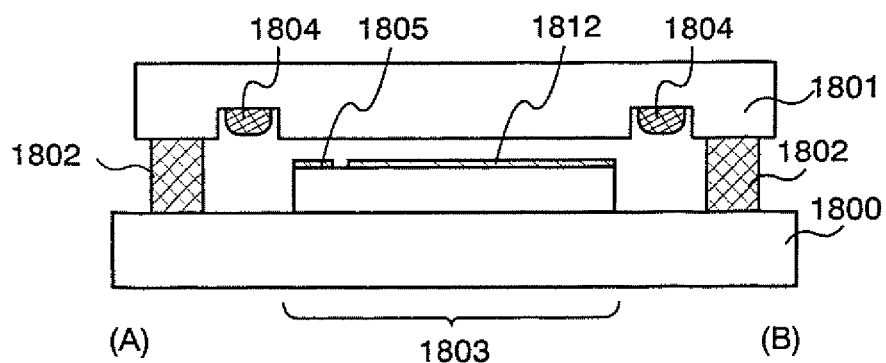
Figure 38C:
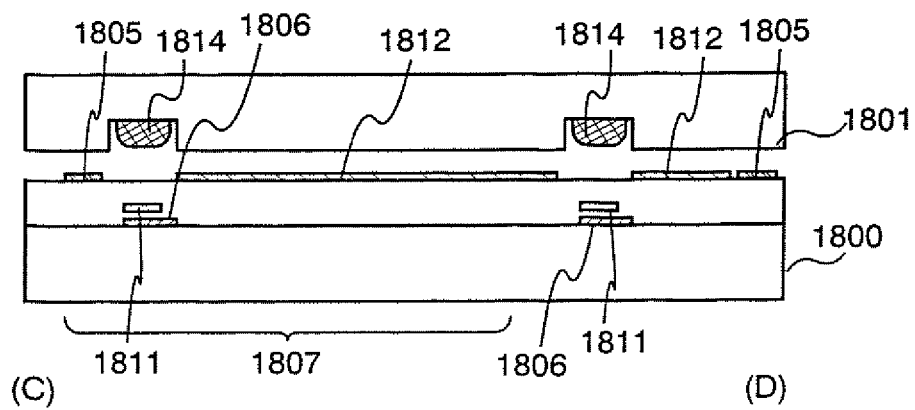

This embodiment describes a drying agent of a display panel shown in the above embodiment with reference to FIGS. 38A to 38C.

FIG. 38A is a surface view of the display panel, and FIG. 38B is a cross-sectional view taken along a line A-B in FIG. 38A and FIG. 38C is a cross-sectional view taken along a line C-D in FIG. 38A.

As shown in FIG. 28A, an active matrix substrate 1800 and a counter substrate 1801 are sealed with a sealant 1802. A pixel region is provided between the active matrix substrate and the counter substrate. The pixel region is provided with a pixel 1807 in a region at the intersection of a source wiring 1805 and a gate wiring 1806. A drying agent 1804 is provided between the pixel region and the sealant 1802. In the pixel region, a drying agent 1814 is provided over the gate or source wiring. Here, the drying agent 2814 is provided over the gate wiring; however, it can be provided over the gate and source wirings.

It is preferable to use a substance that adsorbs water ($H_2O$) by chemical adsorption like oxide of alkaline earth metal such as calcium oxide (CaO) or barium oxide (BaO) as the drying agents 1804 and 1814. However, not limiting thereto, a substance that adsorbs water by physical adsorption such as zeolite or silica gel can also be used.

The drying agent can be fixed to the substrate with a granular drying agent contained in a highly moisture permeable resin. The following can be given as an example of the highly moisture permeable resin: an acrylic resin such as ester acrylate, ether acrylate, ester urethane acrylate, ether urethane acrylate, butadiene urethane acrylate, special urethane acrylate, epoxy acrylate, amino resin acrylate or acrylic resin acrylate. In addition, an epoxy resin such as a bisphenol A type liquid resin, a bisphenol A type solid resin, a resin containing bromo-epoxy, a bisphenol F type resin, a bisphenol AD type resin, a phenol type resin, a cresol type resin, a novolac type resin, a cyclic aliphatic epoxy resin, an epibis type epoxy resin, a glycidyl ester resin, a glycidyl amine resin, a heterocyclic epoxy resin or a modified epoxy resin can be used. In addition, other substances may be used, too. For example, an inorganic substance such as siloxane or the like may be used, too.

Further, a solidified solution mixed in an organic solvent with a molecule that can absorb water by chemical absorption or the like can be used as a water-absorbing substance.

Note that a more highly moisture permeable substance is preferably selected than a substance used as the sealant as the highly moisture permeable resin or the inorganic substance.

In the light emitting device according to the invention as described above, external water mixed in the light emitting device can be absorbed before the water reaches a region provided with a light-emitting element. Accordingly, the deterioration of an element provided for the pixel, typically a light-emitting element due to water can be suppressed.

As shown in FIG. 38B, a drying agent 1804 is provided between a sealant 1802 and a pixel region 1803 in the periphery of a display panel. In addition, the display panel can be thinned by providing a counter substrate or an active matrix substrate with a depression and providing the depression with the drying agent 1804.

As shown in FIG. 38C, a semiconductor region 1811 that is part of a semiconductor element for driving a display element, a gate wiring 1806, a source wiring 1805, and a pixel electrode 1812 are formed in a pixel 2807. In the pixel portion of a display panel, a drying agent 1814 is provided for a region of a counter substrate overlapped with the gate wiring 1806. The gate wiring is two to four times as wide as the source wiring. Therefore, an aperture ratio is not decreased by providing the drying agent 1814 over the gate wiring 1806 that is a non-display region, and penetration of moisture through the display element and the deterioration caused thereby can be suppressed. In addition, a display panel can be thinned by providing the counter substrate with a depression and providing the depression with the drying agent.

Embodiment 11

According to the present invention, it is possible to form a semiconductor device having a circuit in which semiconductor elements with a minute structure are highly integrated, typically, a signal line driver circuit, a controller, a CPU, a converter of an audio processing circuit, a power supply circuit, a transmit and receive circuit, a memory, an amplifier of an audio processing circuit or the like. Further, a system-on-chip can be manufactured, in which circuits such as an MPU (microcomputer), a memory and an I/O interface constituting a system (function circuit) are mounted on one chip in monolithic, and which can realize high speed, high reliability and low power consumption.

Embodiment 12

Figure 12:
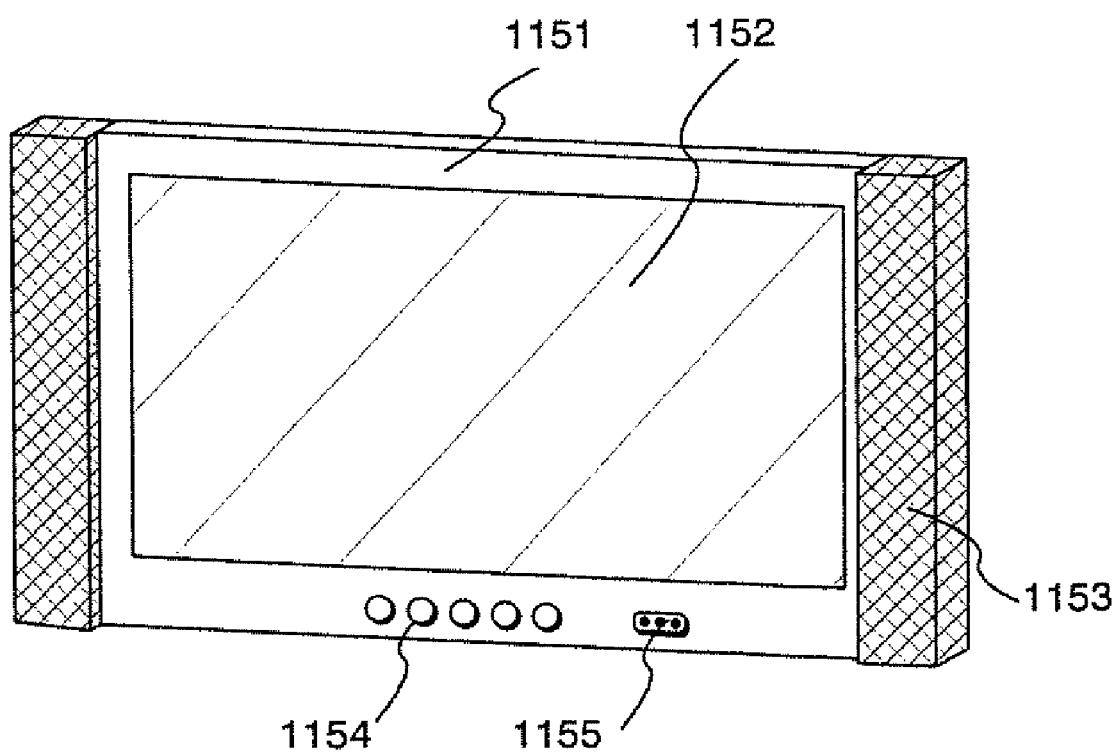
FIG. 12 is an explanatory view of an example of an electronic device.
Figure 13A:
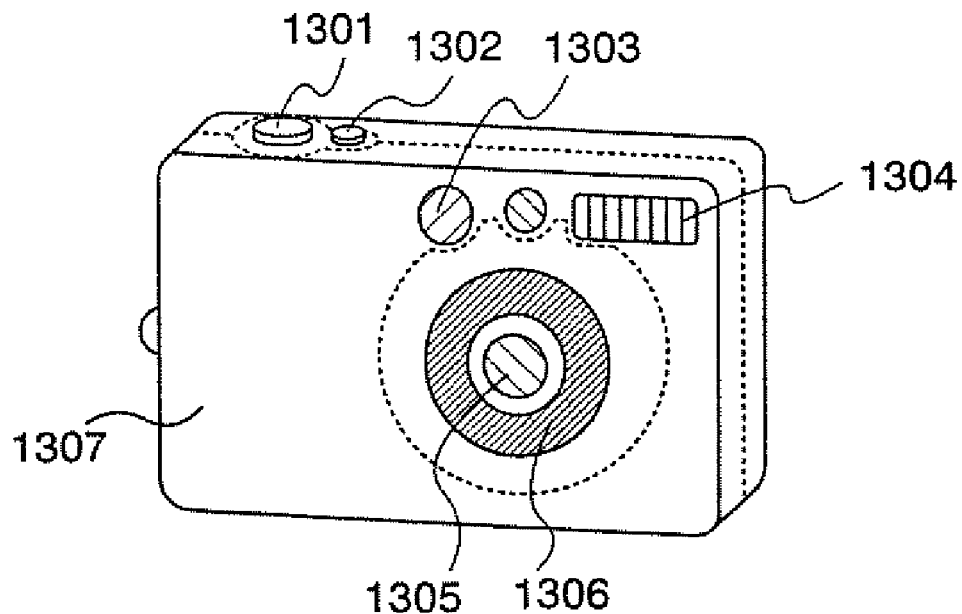
FIGS. 13A and 13B are explanatory views of one example of an electronic device.
Figure 13B:
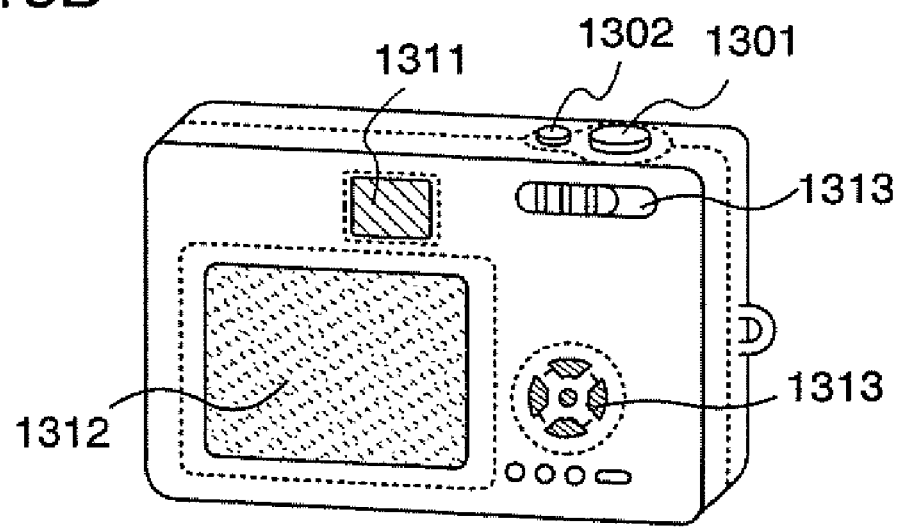

Various electronic devices can be manufactured by incorporating the semiconductor device described in embodiments mentioned above in a casing. Examples of electronic devices can be given as follows: a television set, a camera such as a video camera or a digital camera, a goggle type display (head mount display), a navigation system, an audio reproducing device (a car audio, an audio component or the like), a personal computer, a game machine, a personal digital assistant (a mobile computer, a cellular phone, a portable game machine, an electronic book or the like), an image reproducing device including a recording medium (specifically, a device capable of processing data in a recording medium such as a Digital Versatile Disc (DVD) and having a display that can display the image of the data) or the like. Here, a television set and a block diagram thereof are shown in FIG. 11 and FIG. 12, respectively, and a digital camera is shown in FIGS. 13A and 13B as typical examples of the electronic devices.

Figure 11:
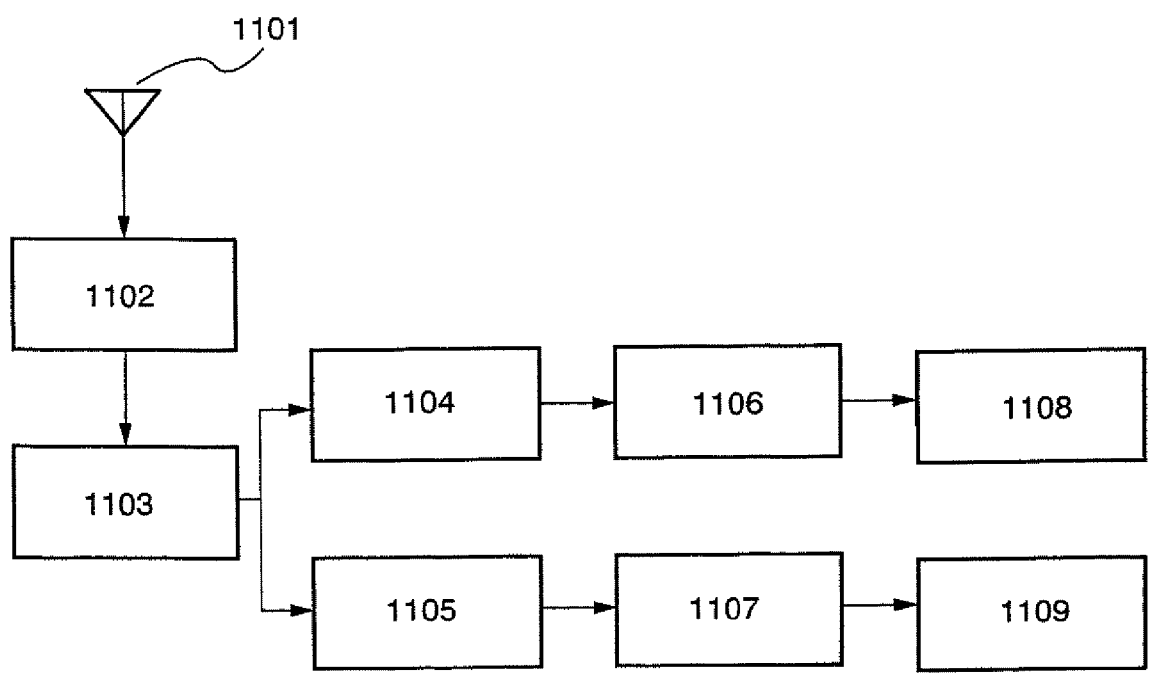
FIG. 11 is an explanatory block diagram of a structure of an electronic device.

FIG. 11 is a diagram showing a general structure of a television set that receives analog television broadcasting. In FIG. 11, the airwaves for television broadcasting received by an antenna 1101 are inputted into a tuner 1102. The tuner 1102 generates and outputs intermediate frequency (IF) signals by mixing the high frequency television signals inputted from the antenna 1101 with locally-oscillating frequency signals that are controlled in accordance with the desired reception frequency.

The IF signals taken out by the tuner 1102 are amplified to the required voltage by an intermediate frequency amplifier (IF amplifier) 1103. Thereafter, the amplified IF signals are detected by an image detection circuit 1104 and an audio detection circuit 1105. The image signals outputted from the image detection circuit 1104 are separated into luminance signals and chrominance signals by an image processing circuit 1106. Further, the luminance signals and the chrominance signals are subjected to the predetermined image signal processing to be image signals, so that the image signals are outputted to an image output portion 1108 of a display device that is a semiconductor device of the present invention, typically, a liquid crystal display device, a light-emitting display device, a DMD (Digital Micromirror Device), a PDP (Plasma Display Panel), an FED (Field Emission Display), an electrophoretic display device (an electronic paper) or the like. Note that a liquid crystal television uses the liquid crystal display device for the display device, and an EL television uses the light-emitting display device for the display device. It is the same when other display devices are used.

The signals outputted from the audio detection circuit 1105 are subjected to processing such as FM demodulation in an audio processing circuit 1107 to be audio signals. The audio signals are then amplified appropriately to be outputted to an audio output portion 1109 of a speaker or the like.

The television set according to the invention may be applicable to digital broadcastings such as terrestrial digital broadcasting, cable digital broadcasting and BS digital broadcasting as well as analog broadcastings such as terrestrial broadcasting in a VHF band, a UHF band or the like, cable broadcasting and BS broadcasting.

FIG. 12 is a front perspective view of the television set, which includes a casing 1151, a display portion 1152, a speaker portion 1153, an operational portion 1154, a video input terminal 1155 and the like. The television set shown in FIG. 12 has the structure as shown in FIG. 11.

The display portion 1152 is an example of the image output portion 1108 in FIG. 11, which displays images.

The speaker portion 1153 is an example of the audio output portion in FIG. 11, which outputs sound.

The operational portion 1154 is provided with a power source switch, a volume switch, a channel select switch, a tuning switch, a selection switch and the like to turn ON and/or OFF the television set, select images, control sound, select a tuner and the like, respectively by holding the switches down. Note that the selections mentioned above can be performed also by a remote-control operation unit, though not shown in the drawing.

The video input terminal 1155 inputs image signals into the television set from an external portion such as a VTR, a DVD or a game machine.

In the case of a wall-mounted television set, a portion for hanging on walls is provided on the rear of the television set shown in this embodiment.

A television set can be manufactured at low cost with high throughput and yield by applying the display device that is an example of a semiconductor device according to the invention to the display portion of the television set. In addition, a television set can be manufactured at low cost with high throughput and yield by applying a semiconductor device according to the invention to a CPU for controlling an image detection circuit, an image processing circuit, an audio detection circuit and an audio processing circuit of a television set. Consequently, such a television is widely applicable particularly to large area display mediums such as wall-mounted television set, information display boards used in railway stations, airports or the like, and advertisement display boards on the streets.

FIGS. 13A and 13B show an example of a digital camera. FIG. 13A is a front perspective view of the digital camera, and FIG. 13B is a rear perspective view thereof. In FIG. 13A, a digital camera is provided with a release button 1301, a main switch 1302, a viewfinder window 1303, a flash 1304, a lens 1305, a lens barrel 1306 and a casing 1307.

In FIG. 13B, the digital camera is provided with a viewfinder eyepiece 1311, a monitor 1312 and an operational button 1313.

When the release button 1301 is held halfway down, a focus adjustment mechanism and an exposure adjustment mechanism are operated. When the release button is held all the way down, a shutter is released.

The digital cameras is turned ON and/or OFF by pressing or rotating the main switch 1302.

The viewfinder window 1303 is disposed above the lens 1305 on the front face of the digital camera, and is used to check a shooting range and a focusing point through the viewfinder eyepiece 1311 shown in FIG. 13B.

The flash 1304 is disposed at the upper portion of the front face of the digital camera body. When a subject of the low luminance level is photographed, the release button is held down to emit auxiliary light and to release the shutter simultaneously.

The lens 1305 is disposed on the front of the digital camera. The lens is made of a focusing lens, a zoom lens and the like. An optical shooting system includes the lens along with a shutter and an aperture, which are not shown in the drawing. An image sensing device such as a CCD (charge coupled device) is provided at the rear of the lens.

The lens barrel 1306 is used for shifting the lens position to focus the focusing lens, the zoom lens or the like on a subject. When taking a picture, the lens barrel is protruded from the body so that the lens 1305 is shifted toward a subject. When carrying the digital camera, the lens 1305 is stored inside the main body to be reduced in size. Note that, although the lens can be zoomed in to enlarge a subject by shifting the lens barrel in this embodiment, this embodiment is not limited to this structure. This embodiment is applicable to a digital camera that can take close-up pictures without zooming a lens due to a structure of an optical shooting system inside the casing 1307.

The viewfinder eyepiece 1311 is provided at the upper portion of the rear of the digital camera, through which the shooting range and the focusing point are checked by sight.

The operational button 1313 is a button for various kinds of functions and is provided on the rear of the digital camera.

The operational button includes a setup button, a menu button, a display button, a functional button, a selection button and the like.

A digital camera can be manufactured at low cost with high throughput and yield by applying the display device that is one embodiment of the semiconductor device according to the invention to a monitor. A digital camera can be manufactured at low cost with high throughput and yield by applying a CPU that is an example of the semiconductor device according to the invention to a CPU for processing in response to input operation of various functional buttons, a main switch, a release button and the like, a CPU for controlling various circuits such as a circuit for auto-focusing and auto-focusing adjustment, a timing control circuit for controlling electric flash drive and CCD drive, an imaging circuit for generating an image signal from a signal that is photo-electrically converted by an imaging device such as a CCD, an A/D converter circuit for converting an image signal generated in an imaging circuit into a digital signal or a memory interface for writing and reading image data in a memory.

This application is based on Japanese Patent Application serial No. 2004-059819 filed in Japan Patent Office on Mar. 3, 2004, the entire contents of which are hereby incorporated by reference.

What is claimed is:

1. A semiconductor device comprising:
a light absorption layer formed over a substrate; and
a conductive film formed over the light absorption layer,
wherein a cross-sectional shape of the conductive film has a Gaussian curved shape.

2. A semiconductor device according to claim 1, wherein a conductor is aggregated in the conductive film.

3. A semiconductor device according to claim 1, wherein the light absorption layer has an insulating property.

4. A semiconductor device according to claim 1, wherein the light absorption layer has a light-shielding property.

5. A semiconductor device according to claim 1, wherein the light absorption layer absorbs a light having a wavelength of an ultraviolet light, a visible light or an infrared light.

6. A semiconductor device according to claim 1, wherein the light absorption layer absorbs a light having a wavelength of from 400 nm to 700 nm.

7. A semiconductor device according to claim 1, wherein the light absorption layer has a heat resistance.

8. A semiconductor device according to claim 1, wherein a width of the conductive film is from 0.1 µm to 10 µm.

9. A semiconductor device according to claim 1, wherein the semiconductor device is at least one selected from the group consisting of a video camera, a digital camera, a goggle type display, a navigation system, an audio reproducing device, a personal computer, a game machine, a mobile computer, a cellular phone, and an electronic book.

10. The semiconductor device according to claim 1, wherein the semiconductor device is a television having a display device, the display device comprising:
a semiconductor element comprising the light absorption layer and the conductive film; and
a pixel electrode electrically connected to the semiconductor element.

11. A semiconductor device according to claim 10, wherein the television is one of a liquid crystal television and an EL television.

12. A semiconductor device comprising:
a light absorption layer formed over a substrate, and
a conductive film formed over the light absorption layer,
wherein a cross-sectional shape of the conductive film has a trapezoidal shape.

13. A semiconductor device according to claim 12, wherein a conductor is aggregated in the conductive film.

14. A semiconductor device according to claim 12, wherein the light absorption layer has an insulating property.

15. A semiconductor device according to claim 12, wherein the light absorption layer has a light-shielding property.

16. A semiconductor device according to claim 12, wherein the light absorption layer absorbs a light having a wavelength of an ultraviolet light, a visible light or an infrared light.

17. A semiconductor device according to claim 12, wherein the light absorption layer absorbs a light having a wavelength of from 400 nm to 700 nm.

18. A semiconductor device according to claim 12, wherein the light absorption layer has a heat resistance.

19. A semiconductor device according to claim 12, wherein a width of the conductive film is from 0.1 µm to 10 µm.

20. A semiconductor device according to claim 12, wherein the semiconductor device is at least one selected from the group consisting of a video camera, a digital camera, a goggle type display, a navigation system, an audio reproducing device, a personal computer, a game machine, a mobile computer, a cellular phone, and an electronic book.

21. The semiconductor device according to claim 12, wherein the semiconductor device is a television having a display device, the display device comprising:
a semiconductor element comprising the light absorption layer and the conductive film; and
a pixel electrode electrically connected to the semiconductor element.

22. A semiconductor device according to claim 21, wherein the television is one of a liquid crystal television and an EL television.

23. A semiconductor device comprising:
a conductive film comprising a plurality of layers,
wherein a conductor is aggregated in an upper layer of the conductive film,
wherein a cross-sectional shape of the upper layer of the conductive film has a Gaussian curved shape, and
wherein a lower layer of the conductive film has a light-shielding property.

24. A semiconductor device according to claim 23, wherein the lower layer of the conductive film absorbs a light having a wavelength of an ultraviolet light, a visible light or an infrared light.

25. A semiconductor device according to claim 23, wherein the lower layer of the conductive film absorbs a light having a wavelength of from 400 nm to 700 nm.

26. A semiconductor device according to claim 23, wherein the lower layer of the conductive film has a heat resistance.

27. A semiconductor device according to claim 23, wherein a width of the conductive film is from 0.1 µm to 10 µm.

28. A semiconductor device according to claim 23, wherein the semiconductor device is at least one selected from the group consisting of a video camera, a digital camera, a goggle type display, a navigation system, an audio reproducing device, a personal computer, a game machine, a mobile computer, a cellular phone, and an electronic book.

29. The semiconductor device according to claim 23, wherein the semiconductor device is a television having a display device, the display device comprising:
a semiconductor element comprising the conductive film; and
a pixel electrode electrically connected to the semiconductor element.

30. A semiconductor device according to claim 29, wherein the television is one of a liquid crystal television and an EL television.

31. A semiconductor device comprising:
a conductive film comprising a plurality of layers,
wherein a conductor is aggregated in an upper layer of the conductive film,
wherein a cross-sectional shape of the upper layer of the conductive film has a trapezoidal shape, and
wherein a lower layer of the conductive film has a light-shielding property.

32. A semiconductor device according to claim 31, wherein the lower layer of the conductive film absorbs a light having a wavelength of an ultraviolet light, a visible light or an infrared light.

33. A semiconductor device according to claim 31, wherein the lower layer of the conductive film absorbs a light having a wavelength of from 400 nm to 700 nm.

34. A semiconductor device according to claim 31, wherein the lower layer of the conductive film has a heat resistance.

35. A semiconductor device according to claim 31, wherein a width of the conductive film is from 0.1 μm to 10 μm.

36. A semiconductor device according to claim 31, wherein the semiconductor device is at least one selected from the group consisting of a video camera, a digital camera, a goggle type display, a navigation system, an audio reproducing device, a personal computer, a game machine, a mobile computer, a cellular phone, and an electronic book.

37. The semiconductor device according to claim 31, wherein the semiconductor device is a television having a display device, the display device comprising:
a semiconductor element comprising the conductive film; and
a pixel electrode electrically connected to the semiconductor element.

38. A semiconductor device according to claim 37, wherein the television is one of a liquid crystal television and an EL television.

* * * * *

UNITED STATES PATENT AND TRADEMARK OFFICE
CERTIFICATE OF CORRECTION

| | |
|---|---|
| PATENT NO. | : 7,812,355 B2 |
| APPLICATION NO. | : 12/330055 |
| DATED | : October 12, 2010 |
| INVENTOR(S) | : Hiroko Shiroguchi et al. |

It is certified that error appears in the above-identified patent and that said Letters Patent is hereby corrected as shown below:

column 13, line 13, "FIG. 5C," should read "FIG. 8C,"

column 35, line 51, "4,4'-tris" should read "4,4'-bis"

column 41, line 26, "Tow" should read "row"

column 42, line 15, "TV" should read "TFT"

Signed and Sealed this
Eleventh Day of October, 2011

David J. Kappos
*Director of the United States Patent and Trademark Office*